United States Patent
Sakata et al.

(10) Patent No.: US 7,819,658 B2
(45) Date of Patent: Oct. 26, 2010

(54) HEAT TREATMENT SYSTEM AND METHOD THEREFORE

(75) Inventors: Kazunari Sakata, Shiroyama-Machi (JP); Shinya Mochizuki, Shiroyama-Machi (JP); Motoki Akimoto, Shiroyama-Machi (JP); Hiroshi Motono, Shiroyama-Machi (JP)

(73) Assignee: Tokyo Electron Limited, Tokyo (JP)

( * ) Notice: Subject to any disclaimer, the term of this patent is extended or adjusted under 35 U.S.C. 154(b) by 413 days.

(21) Appl. No.: 11/705,443

(22) Filed: Feb. 13, 2007

(65) Prior Publication Data

US 2007/0166657 A1 Jul. 19, 2007

Related U.S. Application Data

(62) Division of application No. 10/939,432, filed on Sep. 14, 2004, now Pat. No. 7,210,924, which is a division of application No. 09/934,756, filed on Aug. 23, 2001, now Pat. No. 7,059,849.

(30) Foreign Application Priority Data

| Aug. 23, 2000 | (JP) | .............................. 2000-253201 |
| Dec. 6, 2000 | (JP) | .............................. 2000-372098 |
| Dec. 6, 2000 | (JP) | .............................. 2000-372099 |
| Jan. 12, 2001 | (JP) | .............................. 2001-004971 |

(51) Int. Cl.
 *F27D 5/00* (2006.01)
(52) U.S. Cl. ..................... 432/253; 432/258; 118/728
(58) Field of Classification Search ................. 432/250, 432/253, 258, 259, 241; 392/416, 418; 118/725, 118/728, 500; 269/55, 58, 71, 903; 248/346.01, 248/346.04, 346.06, 346.07
 See application file for complete search history.

(56) References Cited

U.S. PATENT DOCUMENTS 5,055,036 A * 10/1991 Asano et al. .................... 432/5

(Continued)

FOREIGN PATENT DOCUMENTS

EP 1 195 807 4/2002

(Continued)

OTHER PUBLICATIONS

Notice of Rejection issued in Japanese No. 2000-372099, dated Mar. 30, 2004, with English translation.

(Continued)

*Primary Examiner*—Gregory A Wilson
(74) *Attorney, Agent, or Firm*—Smith, Gambrell & Russell, LLP

(57) ABSTRACT

Disclosed herein is a vertical heat treatment system capable of simplifying the structure of various mechanisms in the vicinity of an opening which is formed in a partition wall separating a housing-box transfer area from a treating-object transfer area (a wafer transfer area), and of contributing to space saving, when an object to be treated is carried in the vertical heat treatment system through the opening to carry out a predetermined treatment. In a vertical heat treatment system for carrying an object W to be treated, which is housed in a treating-object housing box closed by an opening/closing lid, in a treating-object transfer area via an opening, which is formed in a partition wall 26 separating a housing-box transfer area for transferring the treating-object housing box from the treating-object transfer area 46 in an atmosphere of an inert gas, to carry out a predetermined treatment, a standby box transfer means is provided in the housing-box transfer area for holding a treating-object housing box, which houses therein the next object to be carried in the treating-object transfer area, in the vicinity of the opening to cause the treating-object housing box to stand by.

7 Claims, 27 Drawing Sheets

U.S. PATENT DOCUMENTS

| | | | |
|---|---|---|---|
| 5,236,181 A | 8/1993 | Ishii et al. | |
| 5,261,935 A | 11/1993 | Ishii et al. | |
| 5,269,643 A | 12/1993 | Kodama et al. | |
| 5,407,181 A | 4/1995 | Ohsawa | |
| 5,514,196 A | 5/1996 | Tanahashi et al. | |
| 5,562,383 A | 10/1996 | Iwai et al. | |
| 5,628,604 A * | 5/1997 | Murata et al. | 414/283 |
| 5,697,749 A | 12/1997 | Iwabuchi et al. | |
| 5,829,939 A * | 11/1998 | Iwai et al. | 414/411 |
| 5,846,073 A | 12/1998 | Weaver | |
| 5,915,957 A | 6/1999 | Tanigawa | |
| 6,079,927 A | 6/2000 | Muka | |
| 6,222,161 B1 | 4/2001 | Shirakawa et al. | |
| 6,231,290 B1 | 5/2001 | Kikuchi et al. | |
| 6,247,245 B1 | 6/2001 | Ishii | |
| 6,419,482 B1 | 7/2002 | Sakata et al. | |
| 6,579,052 B1 | 6/2003 | Bonora et al. | |
| 2001/0005476 A1 | 6/2001 | Kikuchi et al. | |

FOREIGN PATENT DOCUMENTS

| | | |
|---|---|---|
| GB | 2 284 706 | 6/1995 |
| GB | 2 284 706 A | 6/1995 |
| JP | 03268493 A | 11/1991 |
| JP | 5-21581 | 1/1993 |
| JP | 06-224144 | 8/1994 |
| JP | 06-318553 | 11/1994 |
| JP | 06-349749 | 12/1994 |
| JP | 11-284044 | 10/1995 |
| JP | 11-163095 | 6/1999 |
| JP | 11-260747 | 9/1999 |
| JP | 11-274267 | 10/1999 |
| JP | 11-297792 | 10/1999 |
| JP | 11-329989 | 11/1999 |
| JP | 2000-150400 | 5/2000 |
| JP | 2000-353665 | 12/2000 |
| JP | 1 195 807 A1 | 4/2002 |
| WO | 99/02436 | 1/1999 |
| WO | WO 99/02436 | 1/1999 |
| WO | 99/54921 | 10/1999 |
| WO | WO 99/54921 | 10/1999 |

OTHER PUBLICATIONS

European Search Report, mailed Dec. 27, 2005 issued in connection with EP 01 20 3171.

European Search Report, mailed Dec. 28, 2006 issued in connection with EP 06 07 6596.

JPO Action (Notification of Reason for Rejection) dated Nov. 1, 2005 with English translation.

European Search Report issued on Sep. 26, 2008 for EP Application No. 08 16 1737.

* cited by examiner

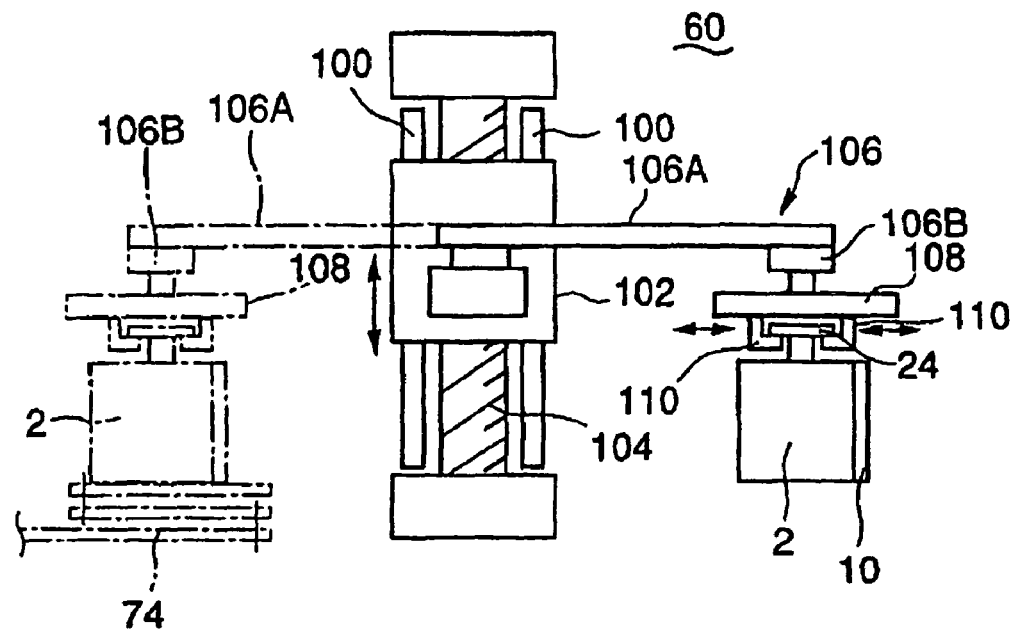
F I G. 2
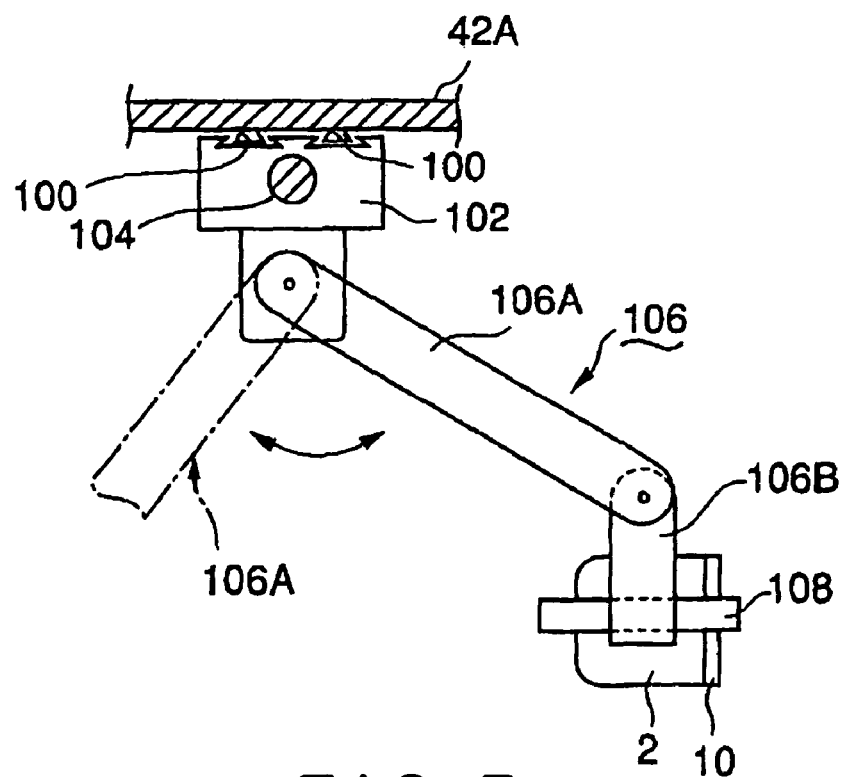
F I G. 3

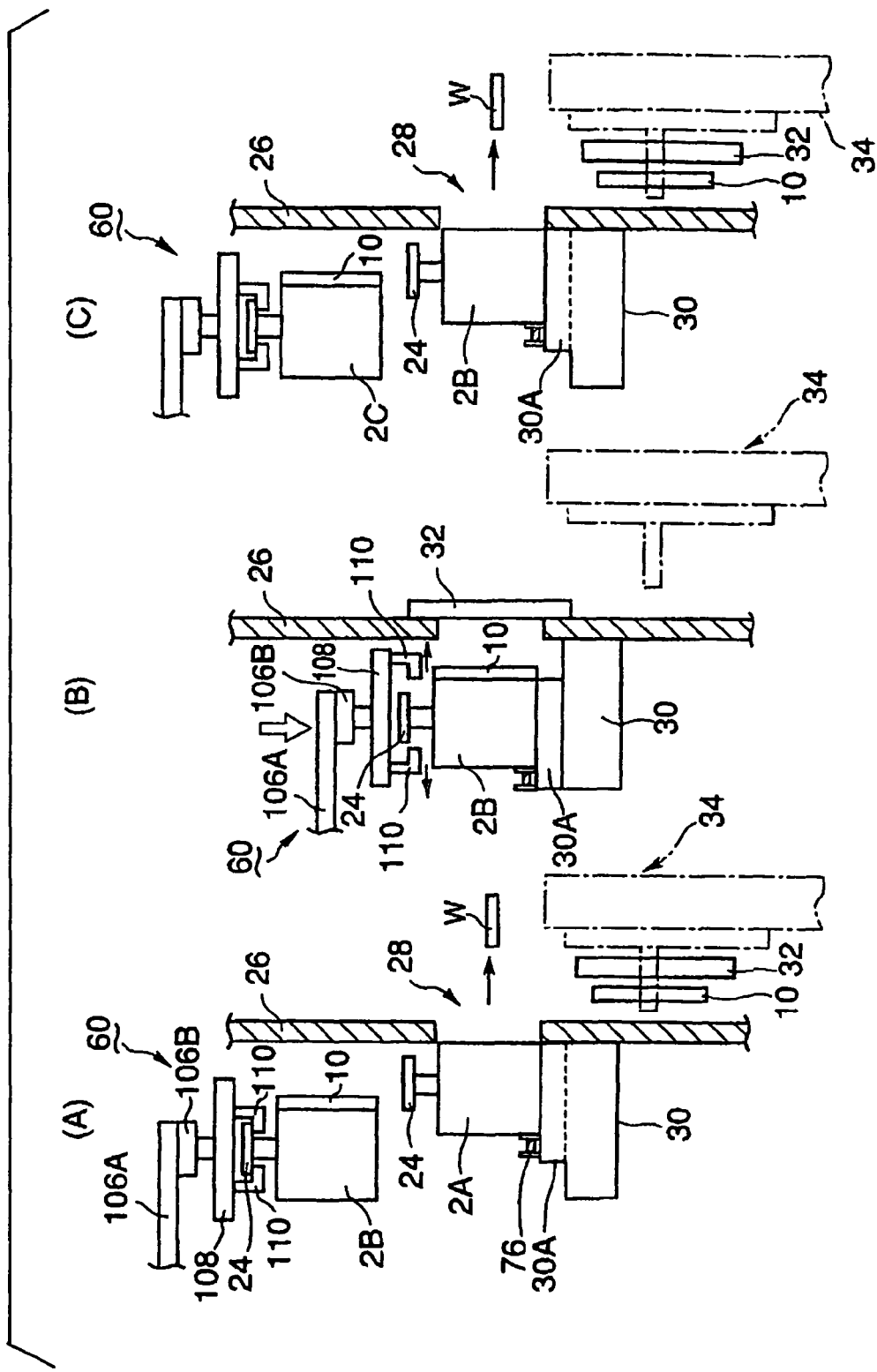
F I G. 4

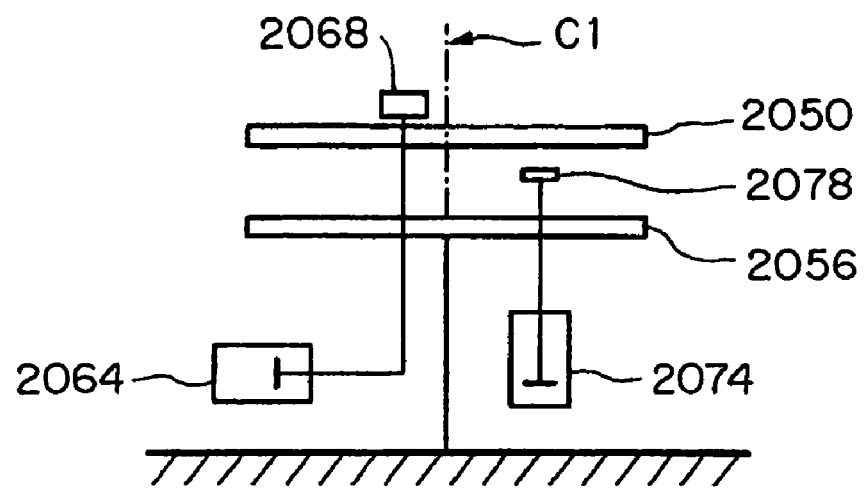
F I G. 22
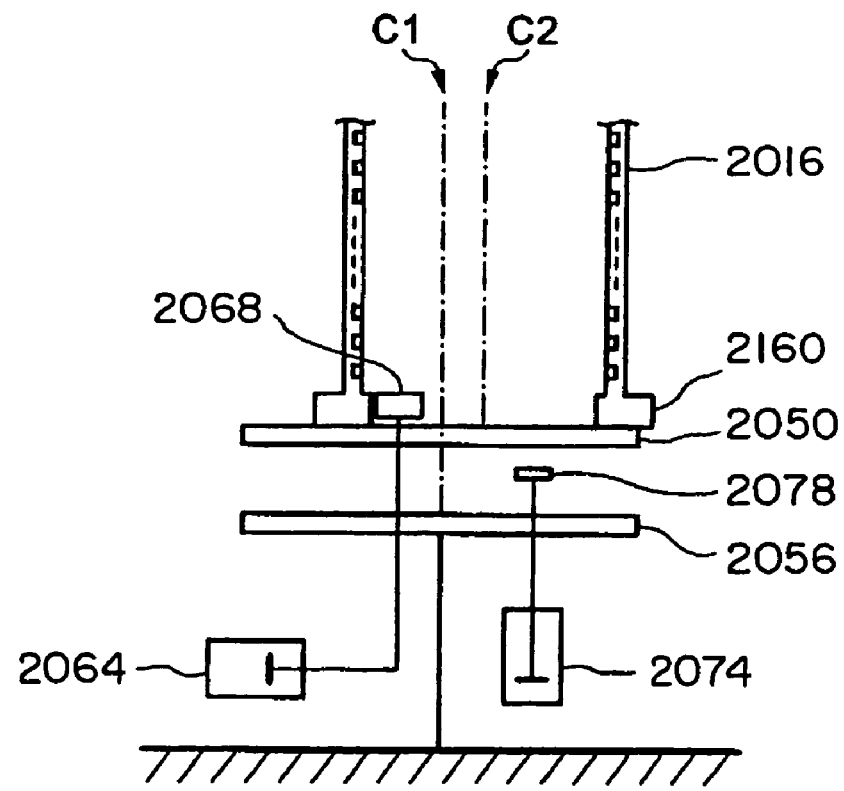
F I G. 23

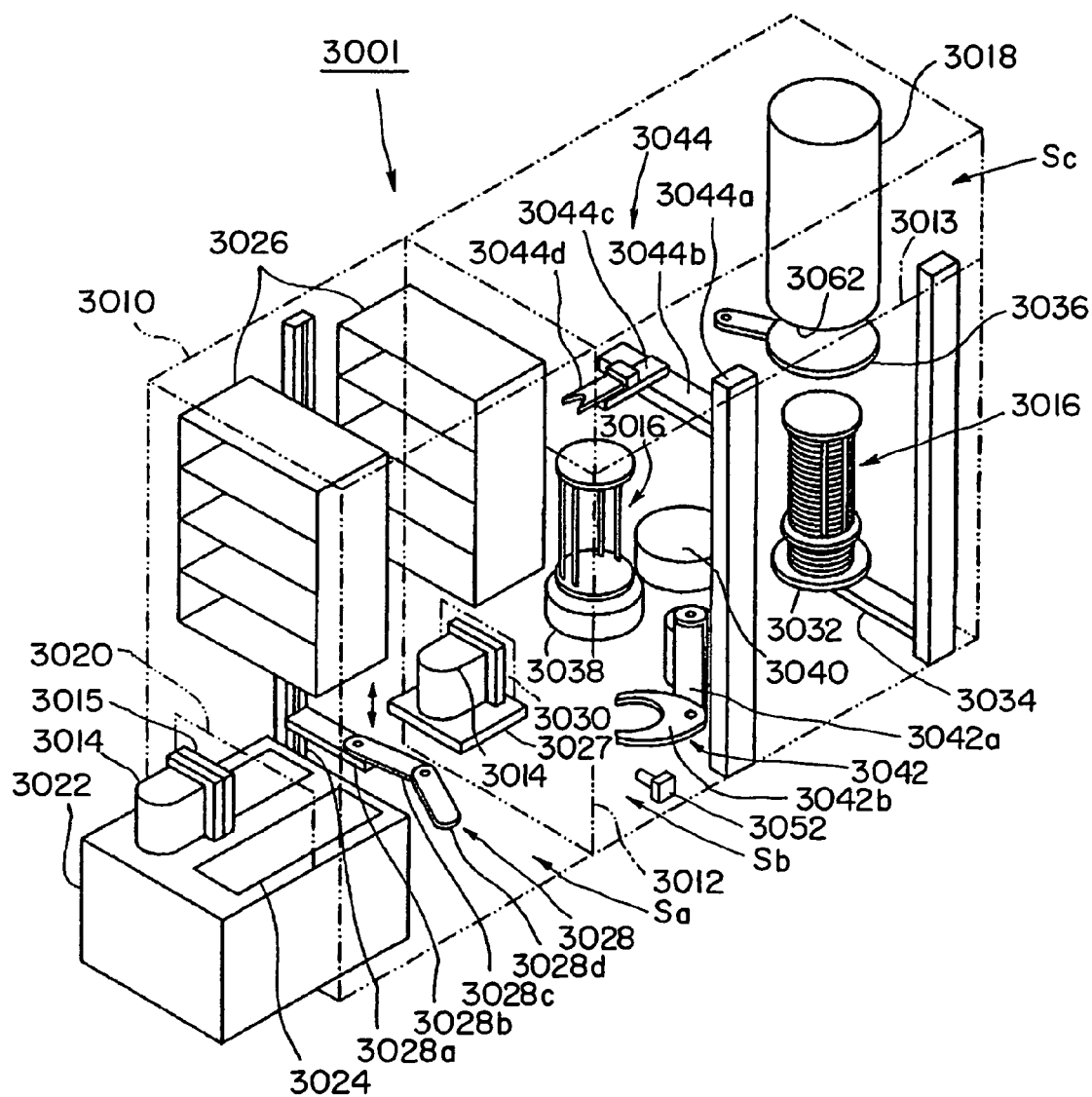
F I G. 29

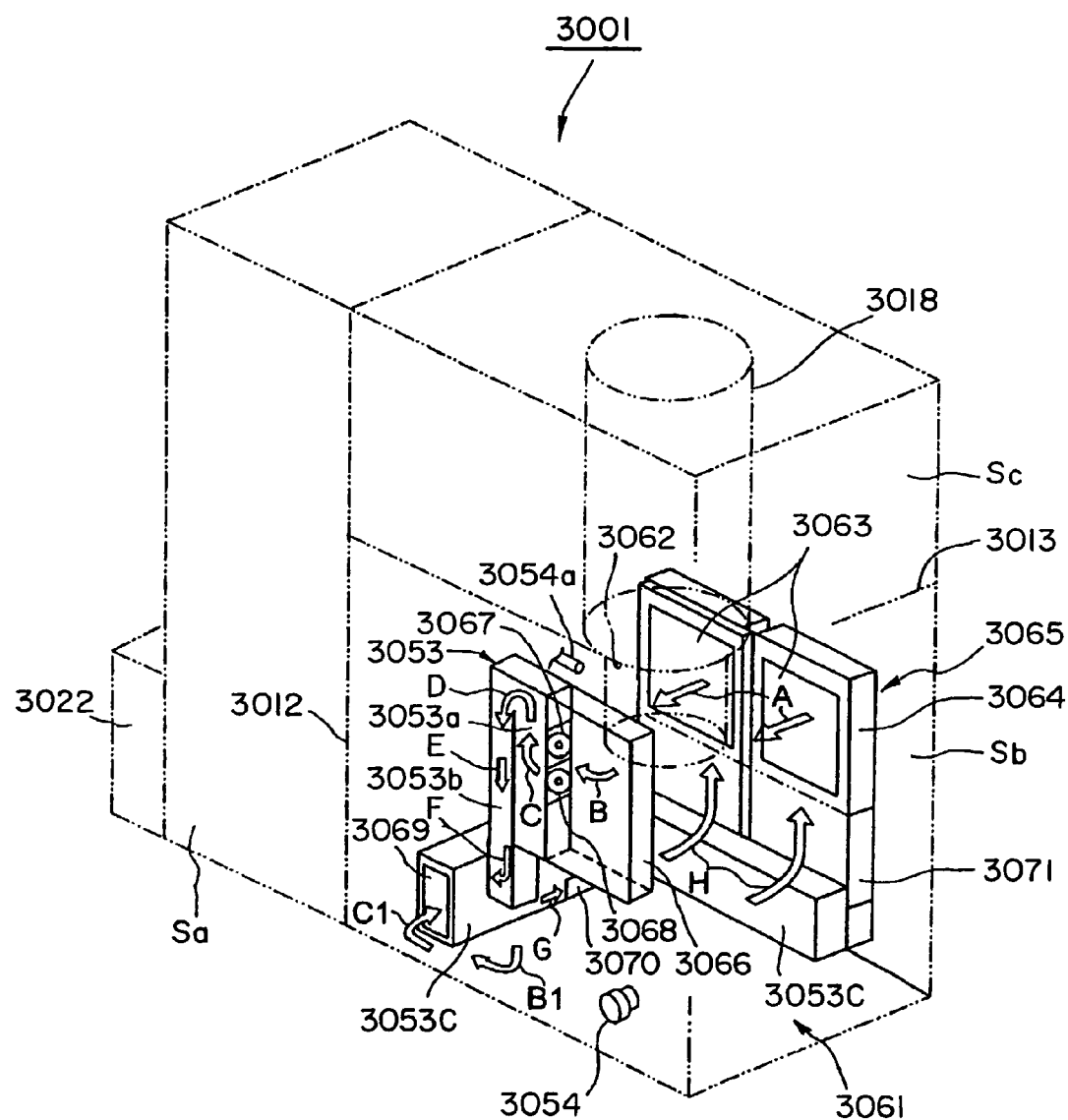
F I G. 31

HEAT TREATMENT SYSTEM AND METHOD THEREFORE

CROSS REFERENCE TO RELATED APPLICATION

This application is a division of application Ser. No. 10/939,432, filed Sep. 14, 2004, now U.S. Pat. No. 7,210,924, which is a division of application Ser. No. 09/934,756, filed Aug. 23, 2001, now U.S. Pat. No. 7,059,849, which are incorporated herein by reference in their entirety.

TECHNICAL FIELD

The first invention relates generally to a vertical heat treatment system utilizing a treating-object housing box for airtightly housing therein objects to be treated, such as semiconductor wafers.

The second invention relates to a vertical heat treatment system used for carrying out a treatment, such as oxidation, diffusion, annealing or CVD, for objects to be treated, such as semiconductor wafers, and a method for controlling the same.

The third invention relates to a vertical heat treatment system for heat-treating objects to be treated, and a method for transferring objects to be treated, and more specifically, relates to a vertical heat treatment system and treating-object transferring method which are capable of aligning a holder for holding objects to be treated.

The fourth invention relates to a heat treatment system for use in steps of fabricating a semiconductor device or the like.

BACKGROUND ART

The background of the first invention will be described below.

In general, in order to fabricate a semiconductor integrated circuit, such as an IC or LSI, various deposition, oxidation and diffusion, and etching processes are repeatedly carried out for a semiconductor wafer. When the respective processes are carried out, it is required to transfer the semiconductor wafer between corresponding systems. In this case, as well known, in order to improve the yields, it is required to prevent particles and natural oxide films from adhering to the surface of the semiconductor wafer. Therefore, with the increase of the request for high scale down and high density integration, a closed treating-object housing box tends to be used for transferring the wafer. As shown in FIGS. 5 and 6, a treating-object housing box 2 has an opening portion 4 on one end thereof, and a substantially semi-circular box vessel 6 on the other end thereof. Multistage supporting protrusions 8 are provided on the inner wall of the box vessel 6, and the peripheral portions of semiconductor wafers W are mounted and supported thereon, so that the semiconductor wafers W can be housed therein on multiple stages at substantially even intervals. On the ceiling portion of the box vessel 6, a gripping handle 24 for holding the whole vessel is provided. Usually, one box can house therein about 25 or 13 wafers.

A rectangular hollow plate-shaped lid 10 is detachably mounted on the opening portion 4 of the box vessel 6. The interior of the box vessel 6 is evacuated in an airtight state to some extent, to be in an atmosphere of an inert gas, such as $N_2$ gas, so that the wafers W housed therein do not contact outside air as much as possible.

The lid 10 is provided with two locking mechanisms 12. By releasing the locking mechanism 12, the lid 10 can be removed from the opening portion 10.

Specifically, as shown in FIG. 7, each of the locking mechanisms 12 has a rotatable disk-shaped locking plate 14 at the substantially center of the lid 10 in height directions. The locking plate 14 is formed with an elongated recessed key groove 16. Above and below the locking plate 14, there are provided a pair of rising and setting pins 20, each of which is connected to an arm 18 as a crank mechanism for converting a circular motion into a linear motion. By rotating the locking plates 14 by 90 degrees in normal and reverse directions, the upper and lower rising and setting pins 20 rise and set in vertical directions.

During locking, as shown in FIG. 6, the tips of the rising and setting pins 20 are inserted into and engaged with pin holes 22, which are formed in top and bottom edge portions for defining the opening portion 4 (only the bottom edge portion is shown in FIG. 6), to prevent the lid 10 from being removed from the opening portion 4. Therefore, if key members (not shown) are engaged with the corresponding key grooves 16 to be rotated by 90 degrees from a locked state shown in FIG. 7(A) to retract the rising and setting pines 20 by a distance $\Delta L$ as shown in FIG. 7(B) to pull them out of the pin holes 22 (see FIG. 6), the lid 10 is in an unlocked state.

In general, the above described housing box 2 is automatically transferred in a treatment system which includes an automatic transfer mechanism for the housing box, a stock region for temporarily stocking therein the housing box, and a treatment unit for treating semiconductor wafers. In addition, key members 26 are operated by automatic apparatuses having them, so that the lid 10 of the housing box 2 is automatically detached and attached by the above described process.

For example, such a treatment system is disclosed in Japanese Patent Laid-Open No. 4-180213, Japanese Patent Laid-Open No. 8-279546, Japanese Patent Laid-Open No. 11-274267, and the applicant's prior application (Japanese Patent Application No. 11-201000). To the interior of the system, an inert gas, such as $N_2$ gas, or clean air having a high cleanliness factor is supplied.

Specifically, the interior of the above described treatment system is airtightly separated into a housing-box transfer area for receiving and temporarily stocking the housing box therein, and a wafer transfer area for transferring semiconductor wafers, which are taken out of the housing box after opening the housing box, to a wafer boat or the like to actually carry out a treatment. The housing-box transfer area is filled with clean air, and the wafer transfer area is filled with an inert gas, such as $N_2$, for preventing natural oxide films from being produced.

The partition wall for separating both areas from each other has a door capable of being open and closed. This door is provided with one or two opening portions. The housing box is set so as to tightly contact the opening portions. Then, the housing box lid and the door are removed from the wafer transfer area to take-shelter. In this state, the semiconductor wafers are fed into the wafer transfer area.

Referring to FIGS. 8 and 9, the state at this time will be described below.

In the case of an example of a conventional system shown in FIG. 8, two stages of upper and lower mounting tables 30A and 30B capable of being integrally moved in vertical directions are provided on the side of the housing-box transfer area of the opening portion 28 of a partition wall 26, and a treating-object housing box 2 is mounted thereon to be fixed. An opening/closing mechanism 34 for removing the lid 10 and a door 32 for opening and closing the opening portion 28 is provided for substantially simultaneously removing the lid 10 and the door 32 and for causing them to take shelter upwards or downwards while holding them. The opening/closing mechanism 34 is provided with a key portion (not shown) which is inserted into the key groove shown in FIG. 6 to be rotated to carry out locking and unlocking.

After the carrying-out of the wafers in one of the housing boxes is completed, the lid 10 and the door 32 are mounted again. Thereafter, the mounting tables 30A and 30B are caused to integrally slide upwards in, e.g., the shown embodiment, and the wafers are carried out of the housing box 2, which newly faces the opening portion 28, in the same manner as that described above.

Furthermore, the reason why the two housing boxes 2 are thus set is that the wafer carrying-in/out efficiency is improved.

On the other hand, in the case of an example of a conventional system shown in FIG. 9, the partition wall 26 is provided with upper and lower openings 28A and 28B which are provided with doors 32A and 32B for opening and closing them, respectively. Inside of the housing-box transfer area of the openings 28A and 28B, mounting tables 30A and 30B are fixedly mounted, respectively. Inside of the wafer transfer area of the openings 28A and 28B, two opening/closing mechanisms 34A and 34B are provided so as to correspond to the openings 28A and 28B, respectively. In the same manner as that described above, the lid 10 and the door 32A or 32B are removed from the housing box, which is set on each of the openings 28A and 28B, by means of the opening/closing mechanisms 34A and 34B. Furthermore, these opening/closing mechanisms are disclosed in Japanese Patent Laid-Open No. 11-274267, which has been described above as the prior art, and so forth.

By the way, in the above described examples of conventional systems, two housing boxes can be set in the vicinity of one or two openings, so that it is possible to fed the wafers into the wafer transfer area to greatly improve the transfer efficiency of the wafers to the wafer boat.

However, in the case of the example of the conventional system shown in FIG. 8, the two mounting tables 30A and 30B are provided so as to be slidable in vertical directions. Therefore, there is a problem in that it is required to ensure a large space for three housing boxes in this portion.

In the case of the example of the conventional system shown in FIG. 9, it is sufficient to provide a space for only two housing boxes. However, in this case, there is a problem in that it is required to provide two opening/closing mechanisms 34A and 34B which have a complicated structure and which are relatively expensive, so that the costs are high.

In particular, in the case of the opening/closing mechanisms 34A and 34B shown in FIG. 9, the structure must be complicatedly devised in order to avoid the interference of the opening/closing mechanisms with each other, so that higher costs are caused.

The background of the second invention will be described below.

In the fabrication of semiconductor devices, various treatments, such as oxidation, diffusion and CVD, are carried out with respect to semiconductor wafers serving as objects to be treated. As systems for carrying out such treatments, so-called vertical heat treatment systems are widely utilized.

As such a vertical heat treatment system, from the standpoint of the improvement of throughput, there is known a vertical heat treatment system which uses two wafer boats serving as holders for holding a plurality of semiconductor wafers and wherein semiconductor wafers are transferred with respect to one wafer boat while heat treatment is carried out with respect to the other wafer boat.

The conventional heat treatment system has a housing which is separated into front and rear portions by a partition wall to define a carrier transfer area and a loading area in which a vertical heat treatment furnace having an opening in its bottom is provided. The loading area includes: a boat elevator which is a lifting mechanism moved in vertical directions for carrying a wafer boat in and out of the heat treatment furnace; a holder mounting portion comprising two boat mounting portions which are arranged in the front and rear portions of one side portion of the housing; a boat transfer mechanism which is a holder transfer mechanism for transferring the wafer boat between the boat mounting portion and the boat elevator; and a wafer transfer mechanism which is a treating-object transfer mechanism for transferring semiconductor wafers with respect to the wafer boat supported on the boat mounting portion.

This vertical heat treatment system has a motion space region in which the wafer transfer mechanism and the boat transfer mechanism overlap with each other. When the semiconductor wafers are transferred, the boat transfer mechanism is moved to a sheltered position below the motion space region, and when the wafer boat is transferred, the wafer transfer mechanism is moved to a sheltered position above the motion space region.

The sheltered position of the wafer transfer mechanism is thus arranged upwards in the vertical heat treatment system with the above described construction. Therefore, when the wafer boat is carried out of the heat treatment furnace, the wafer transfer mechanism is easy to have the influence of heat from the bottom end opening of the heat treatment furnace and the wafer boat after the heat treatment, and the temperature of the wafer transfer mechanism at the sheltered position sometimes reaches to 150° C., so that it is difficult to stably operate the system for a long term due to the failure of the control apparatus in the wafer transfer mechanism and so forth.

In recent years, it has been also requested to increase the diameter of the semiconductor wafer in order to improve the yields of chips per one semiconductor wafer. For example, it has been requested that a semiconductor wafer having a diameter of 12 inches (300 mm) is heat-treated.

However, with the increase of semiconductor wafers, the width, length and height of the vertical heat treatment system increase, so that the floor area and ceiling height for the installation of the heat treatment system also increase. Therefore, the production costs and maintenance costs of the vertical heat treatment system increase, so that it is required to miniaturize the vertical heat treatment system.

The background of the third invention will be described below.

As one of systems for heat-treating objects to be treated, such as semiconductor wafers (which will be hereinafter referred to as wafers), in a semiconductor fabricating processes, there is a vertical heat treatment system for carrying out a batch treatment. In this system, a plurality of wafers serving as objects to be treated are held on a holder (boat) while being stacked, and this holder is carried in a vertical heat treatment furnace for carrying out heat treatment, e.g., CVD (Chemical Vapor Deposition) and oxidation.

The vertical heat treatment system has a holder mounting portion (holder supporting mechanism, boat stage) for supporting thereon the holder. The objects to be treated are transferred to and held in the holder which is supported on the holder mounting portion. Thereafter, the holder mounting portion, in which the objects to be treated are held, is housed in the heat treatment chamber of the vertical heat treatment system, and the objects to be treated are heat-treated.

When the objects to be treated are heat-treated, the positional relationship between the interior of the heat treatment chamber and the objects to be treated is important. Since the temperature distribution and the concentration distribution of atmospheric gas exist in the heat treatment chamber, it is required to arrange the objects in the heat treatment chamber so that the centers of these distributions corresponds to the center of the wafers serving as the objects to be treated. If the heat treatment is carried out in a state that these centers do not correspond, the thickness values of the films formed on the objects are uniform.

In order to make the positional relationship between the heat treatment chamber and the objects constant, it is effective to make the positional relationship between the holder and the objects constant.

There are some cases where the position shift occurs when the holder (boat) is mounted on the holder mounting portion (holder supporting mechanism, boat stage), and there is some possibility that the position error causes errors in the position relationship between the objects and the holder when the objects are transferred.

The background of the fourth invention will be described below.

As one of systems for heat-treating objects to be treated, such as semiconductor wafers (which will be hereinafter referred to as "wafers"), in a semiconductor fabricating processes, there is a vertical heat treatment system for carrying out a batch treatment. In this system, a plurality of wafers are held on the multiple stages of a holder, such as a wafer boat, and this holder is carried in a vertical heat treatment furnace for carrying out various heat treatments, such as diffusion, oxidation or CVD (Chemical Vapor Deposition).

In recent years, in order to surely inhibit contamination due to particles and natural oxide films on the wafers from being produced in a region called a loading area for carrying wafers in and out of the heat treatment furnace in such a vertical heat treatment system, a closed type system or the like has been put to practical use wherein the loading area is separated as an airtight region which is isolated from outside air, to form an atmosphere of an inert gas, such as nitrogen gas, to carry the wafers in and out.

By the way, the heated wafers after the heat treatment are carried in the above described loading area from the heat treatment furnace, and the temperature of the loading area is high, so that it is required to provide a cooling mechanism. This cooling mechanism is provided for mainly protecting a filter or the like for purifying the interior of the area, from heat. Therefore, in view of the suppression of the flying of particles in the area, the cooling mechanism is provided in the vicinity of an intake hole, i.e., relatively below the loading area.

However, the above described conventional cooling mechanism has the following problems. That is, in recent years, in order to further improve the productivity of semiconductor devices, the size of wafers serving as objects to be treated is being changed from a diameter of 8 inches (about 200 mm) to a relatively large diameter of 12 inches (about 300 mm). When wafers of this large size are carried out of a large-diameter heat treatment furnace which heat-treated the wafers, a large amount of heat is emitted from a throat, and the temperature of the loading area suddenly rises due to a large amount of radiation simultaneously emitted from the large-diameter wafers and the wafer boat, so that there is a problem in that various control parts including electrical parts provided in the area are damaged.

Moreover, this phenomenon that the temperature in the loading area suddenly rises to the high temperature causes a more serious problem in the case of the closed type (inert gas purging box type) system for circulating an inert gas in the area.

DISCLOSURE OF THE INVENTION

The first invention has been made to effectively solve the above described problems. It is an object of the first invention to provide a vertical heat treatment system capable of simplifying the structure of various mechanisms in the vicinity of an opening which is formed in a partition wall separating a housing-box transfer area from a treating-object transfer area (a wafer transfer area), and of contributing to space saving, when an object to be treated is carried in the vertical heat treatment system through the opening to carry out a predetermined treatment.

According to the first invention, there is provided a vertical heat treatment system for carrying an object to be treated, which is housed in a treating-object housing box closed by an opening/closing lid, in a treating-object transfer area via an opening, which is formed in a partition wall separating a housing-box transfer area for transferring the treating-object housing box from the treating-object transfer area in an atmosphere of an inert gas, to carry out a predetermined treatment, wherein standby box transfer means is provided in the housing-box transfer area for holding a treating-object housing box, which houses therein the next object to be carried in the treating-object transfer area, in the vicinity of the opening to cause the treating-object housing box to stand by.

Thus, when objects to be treated are carried out of one treating-object housing box into the treating-object transfer area via the opening of the partition wall or the like, the standby box transfer means causes the next treating-object housing box to stand by in the vicinity of the opening (mounting table), and immediately after the objects in the last treating-object housing box are completely carried out, the treating-object housing box during standby can be set in the opening to carry objects out. Therefore, the carrying and transfer of the objects in and to the treating-object transfer area can be quickly and efficiently carried out in a space saving state without causing the structure to be so complicated.

In this case, for example, in the housing-box transfer area, there may be provided a stocker portion for temporarily storing therein the treating-object housing box, and a box transfer arm for transferring the treating-object housing box in the stocker portion to a mounting table which is provided in the opening.

In addition, an opening/closing door may be provided in the opening, and an opening/closing mechanism for removing the opening/closing door and the opening/closing lid to cause the opening/closing door and the opening/closing lid to take shelter may be provided in the treating-object transfer area.

The second invention has been made in view of the above described circumstance. It is an object of the second invention to provide a vertical heat treatment system having a small influence of heat on a treating-object transfer mechanism when a holder is carried out of a heat treatment furnace.

It is another object of the second invention to provide a small vertical heat treatment system having a high throughput.

It is a further object of the second invention to provide a control method capable of stably operating such a vertical heat treatment system.

According to the second invention, a vertical heat treatment system comprises: a lifting mechanism which is vertically moved for carrying a holder, in which an object to be treated is held, in and out of a heat treatment furnace; a holder mounting portion for mounting thereon the holder to transfer the object; a holder transfer mechanism for transferring the holder between the lifting mechanism and the holder mounting portion; and a treating-object transfer mechanism for transferring the object to the holder which is supported on the holder transferring portion, the treating-object transfer mechanism having a motion space region which overlaps with a motion space region of the holder transfer mechanism, wherein the treating-object transfer mechanism comprises a swivel arm supported so as to be rotatable about a vertically extending rotation center shaft, and a transfer head provided on the tip portion of the swivel arm so as to be rotatable on a horizontal plane, and further comprises driving means having the sheltering function of moving the transfer head of the treating-object transfer mechanism on the horizontal plane along the outer peripheral edge of the lifting mechanism, which is positioned at a lower position, to cause the transfer head to take shelter on a side face portion of a housing.

In the vertical heat treatment system according to the second invention, the sheltering function of the driving means of the treating-object transfer mechanism preferably causes the transfer head of the treating-object transfer mechanism to revolve around the rotation center shaft of the swivel arm while causing the transfer head itself to rotate on its axis in the opposite direction to the direction of rotation of the transfer head, to cause the transfer head to take shelter on the side face portion in the housing.

In addition, in the vertical heat treatment system according to the second invention, the sheltering function of the driving means of the treating-object transfer mechanism preferably operates the transfer head of the treating-object transfer mechanism from a state that the transfer head is positioned at a reference position in its motion space region.

Moreover, in the vertical heat treatment system according to the second invention, the driving means of the treating-object transfer mechanism preferably comprises a stretching mechanism for rotating the swivel arm, and a belt transmission mechanism for transmitting the rotational motion of the swivel arm to the transfer head. In this case, the reference position in the motion space region may be set by a pulley ratio in the belt transmission mechanism.

According to the second invention, there is provided a method for controlling a vertical heat treatment system comprising: a lifting mechanism which is vertically moved for carrying a holder, in which an object to be treated is held, in and out of a heat treatment furnace; a holder mounting portion for mounting thereon the holder to transfer the object; a holder transfer mechanism for transferring the holder between the lifting mechanism and the holder mounting portion; and a treating-object transfer mechanism for transferring the object to the holder which is supported on the holder transferring portion, the treating-object transfer mechanism having a motion space region which overlaps with a motion space region of the holder transfer mechanism, the treating-object transfer mechanism comprising a swivel arm supported so as to be rotatable about a vertically extending rotation center shaft, and a transfer head provided on the tip portion of the swivel arm so as to be rotatable on a horizontal plane, wherein the transfer head of the treating-object transfer mechanism is moved on the horizontal plane along the outer peripheral edge of the lifting mechanism, which is positioned at a lower position, to take shelter on a side face portion of a housing, when the holder transfer mechanism is operated.

In the control method according to the second invention, the transfer head of the treating-object transfer mechanism may be caused to revolve around the rotation center shaft of the swivel arm while the transfer head itself is caused to rotate on its axis in the opposite direction to the direction of rotation of the transfer head, to take shelter on the side face portion in the housing.

According to the vertical heat treatment system of the second invention, when the holder is transferred, the treating-object transfer mechanism takes shelter on one side face portion of the housing, so that the holder during transfer does not interfere with the treating-object transfer mechanism. In addition, the treating-object transfer mechanism takes shelter on the same plane as that of the lifting mechanism which is positioned at the lower position, so that the influence of heat from the heat treatment furnace and so forth can be very small.

In addition, since the space required for the sheltered operation can be reduced by allowing the transfer head of the treating-object transfer mechanism to move along the outer peripheral edge of the lifting mechanism, the holder mounting portion and so forth can be arranged at a high spatial utilization factor, so that the whole system can be miniaturized while maintaining a high throughput.

According to the control method of the invention, it is possible to surely prevent the holder during transfer from interfering with the treating-object transfer mechanism, and the influence of heat from the heat treatment furnace and so forth can be very small, so that it is possible to stably operate the vertical heat treatment system.

In addition, since the transfer head of the treating-object transfer mechanism can take shelter in a relatively small space, the holder mounting portion and so forth can be arranged at a high spatial utilization factor, and the whole system can be miniaturized while maintaining a high throughput.

In view of the foregoing, it is an object of the third invention to provide a heat treatment system having a holder supporting mechanism capable of mounting an object to be treated at a predetermined position.

In order to accomplish the above described object, a vertical heat treatment system according to the third invention has a holder supporting mechanism comprising: a holder mounting table for mounting thereon a holder for holding a plurality of objects to be heat-treated, in a stacked state; and a holder position adjusting mechanism including a plurality of protruding portions corresponding to the shape of a bottom plate of the holder, and a distance varying mechanism for varying the distance between the plurality of protruding portions.

Since the holder supporting mechanism has the holder position adjusting mechanism for adjusting the position of the holder, the positioning of the holder can be easily carried out after the holder is mounted on the holder mounting table. As a result, it is possible to precisely transfer the objects to the holder. Furthermore, this positioning can be carried out by changing the distance between the plurality of protruding portions corresponding to the shape of the bottom plate of the holder.

The holder supporting mechanism may further comprise a sliding mechanism for allowing the holder mounting table to move on a plane along a holder mounting surface of the holder mounting table. By the sliding mechanism, the holder mounting table can easily move with the holder mounting table, and the positioning of the holder can be easily carried out.

The holder supporting mechanism may further comprise a returning mechanism for returning the holder mounting table to a predetermined position, the returning mechanism including biasing means for biasing the holder mounting table in a different direction on a plane along a holder mounting surface of the holder mounting table.

Thus, it is possible to return the position of the holder mounting table before the transfer of the holder, and it is possible to ensure the movable range of the holder mounting table during the positioning of the holder.

According to the third invention, there is provided a method for transferring an object to be treated, the method comprising: a mounting step of causing a holder, which serves to hold a plurality of objects to be heat-treated in a stacked state, to be mounted on a holder mounting table; a positioning step of moving the holder, which is mounted on the holder mounting table at the mounting step, together with the holder mounting table, on a plane along a holder mounting surface of the holder mounting table to position the holder at a predetermined position; a transfer step of transferring the objects to the holder which is positioned at the positioning step; and a returning step of removing the holder, to which the objects are transferred at the transfer step, from the holder mounting table to return the holder mounting table to a predetermined position.

Since the position of the holder is adjusted before the objects are transferred, the precision of the position is improved when the objects are transferred to the holder. In addition, since the position of the holder mounting table is returned after removing the holder to which the objects are transferred, it is easy to ensure the precision of adjustment of the position of the holder.

The fourth invention has been made to solve the above described problems. It is an object of the fourth invention to provide a heat treatment system having excellent cooling effects in a carrying-in/out region of a heat treatment furnace in and out of which an object to be treated is carried.

It is another object of the fourth invention to provide a heat treatment system having excellent cooling effects while inhibiting the carrying-in/out region from being contaminated by particles.

In order to accomplish the above described objects, according to the fourth invention, a heat treatment system comprises: a heat treatment furnace for heat-treating an object to be treated; a throat which is provided in the heat treatment furnace for carrying the object in and out; and a cooling mechanism for cooling the vicinity of the throat.

Since the heat treatment system according to the fourth invention cools the vicinity of the throat of the heat treatment furnace, heat emitted from the throat of the heat treatment furnace and be removed and the heated objects can be cooled, when the objects heated to a high temperature in the heat treatment furnace are, for example, carried out. Thus, it is not feared that the temperature in the carrying-in/out region carrying the objects in and out of the heat treatment furnace may suddenly rise, so that it is possible to inhibit control parts and so forth provided in the carrying-in/out region from being damaged by heat.

In the heat treatment system according to the fourth invention, the cooling mechanism may comprise a ventilating unit having a ventilating port for sending a cooling fluid toward the vicinity of the throat, and a heat exchanger arranged so as to face the ventilating port in the vicinity of the throat.

This heat treatment system according to the fourth invention can effectively heat, which is emitted from the throat of the heat treatment furnace, by the ventilating unit for sending the cooling fluid to the objects, which are carried out while being heated, and by the heat exchanger, such as a radiator, for removing heat of the temperature-raised cooling fluid in the vicinity of the throat.

Moreover, in the heat treatment system according to the fourth invention, the cooling mechanism may further comprise an intake fan for sucking the cooling fluid in the vicinity of the throat over the heat exchanger.

The heat treatment system according to this invention can positively draw the temperature-raised cooling fluid in the vicinity of the throat into the heat exchanger by the intake fan to effectively remove the heat. Moreover, in the heat treatment system according to this invention, the intake fan is arranged downstream of the heat exchanger in the flow of the cooling fluid, so that the cooling fluid passing through the heat exchanger to be cooled is sucked by the intake fun. Thus, it is possible to inhibit the intake fun from being damaged by heat.

Moreover, in the heat treatment system according to the fourth invention, the cooling mechanism may further comprise: a duct for forming a circulating path for the cooling fluid between the intake fun and the ventilating unit so that the cooling fluid sucked by the intake fan returns to the ventilating unit; a filter, provided in the duct or the ventilating unit, for purifying the cooling fluid which is sent by the ventilating unit; and an intake port which is formed on the duct at least upstream of the filter so that the cooling fluid sent by the ventilating unit is sucked at a different position from a position at which the cooling fluid is sucked by the intake fun.

This heat treatment system according to the fourth invention can be used for purifying and circulating the cooling fluid for cooling the vicinity of the throat, so that this heat treatment system can be used as a closed type system for blocking the carrying-in/out region carrying the objects in and out of the heat treatment furnace from outside air and for circulating the cooling fluid in this region. In addition, the heat treatment system according to this invention suitably selects the intake port, in which the cooling fluid is sucked at a different position from a position at which the cooling fluid is sucked by the intake fun, at a position upstream of the filter on the duct, so that the heat treatment system can have excellent cooling effects while inhibiting particles from flying in the carrying-in/out region.

In the heat treatment system according to the fourth invention, the cooling mechanism may further comprise a second heat exchanger which is arranged in the duct between the intake port and the filter so as to cool the cooling fluid which is drawn into the duct from the intake fan and the intake port to join.

According to the heat treatment system of the fourth invention, the filter is arranged downstream of the second heat exchanger in the flow of the cooling fluid, so that the cooling fluid passing through the second heat exchanger to be cooled further passes through the filter. Thus, it is possible to inhibit the filter from being damaged by heat.

According to the fourth invention, there is provided a heat treatment system having a loading chamber in which a mechanism for carrying an object to be treated in and out of a throat of a bottom portion of a heat treatment furnace and which has a loading chamber separated as an airtight region, wherein the throat of the bottom portion of the heat treatment furnace is arranged above the loading chamber, the loading chamber including: a ventilating unit which has a ventilating port in the vicinity of the throat and a filter for purifying and sending a cooling fluid from the ventilating port to the vicinity of the throat from the side; a first heat exchanger which is arranged so as to face the ventilating port in the vicinity of the throat; an intake fan for sucking the cooling fluid in the vicinity of the throat over the first heat exchanger; a circulating duct which forms a circulating path for the cooling fluid between the intake fan and the ventilating unit so that the cooling fluid sucked by the intake fan returns to the ventilating unit, at least a part of sand circulating duct being arranged below the loading chamber; an intake port which is formed in the part of the circulating duct below the loading chamber so that a part of the cooling fluid sent by the ventilating unit is sucked below the loading chamber; and a second heat exchanger which is arranged in the circulating duct between the intake port and the filter so that the cooling fluid drawn into the circulating duct from the intake fan and the intake port to join is cooled.

This heat treatment system according to the fourth invention can be used for purifying and circulating the cooling fluid for cooling the vicinity of the throat, so that this heat treatment system can be used as a closed type system for blocking the carrying-in/out region for carrying the objects in and out of the heat treatment furnace from outside air and for circulating the cooling fluid in this region. In addition, in the heat treatment system according to this invention, above the loading chamber, the flow of the cooling fluid is regulated by the intake fun and the duct, and the other intake port for the cooling fluid is provided below the loading chamber to similarly regulate the flow of the cooling fluid, so that the heat treatment system can have excellent cooling effects while inhibiting particles from flying in the carrying-in/out region.

BRIEF DESCRIPTION OF THE DRAWINGS

FIG. 2 is an enlarged plan view of a standby box transfer means shown in FIG. 1;

FIG. 3 is a top view of the standby box transfer means;

FIG. 4 is an illustration for explaining the operation of the standby box transfer means;

FIG. 22 is a schematic diagram showing the first holder mounting portion before a holder is mounted thereon;

FIG. 23 is schematic diagram showing the first holder mounting portion when the holder is mounted thereon;

FIG. 29 is a perspective view showing a preferred embodiment of a vertical heat treatment system according to the fourth invention;

FIG. 31 is a perspective view showing the construction of a gas circulating cooling mechanism of the vertical heat treatment system of FIG. 29, viewed from the back side of the system body;

BEST MODE FOR CARRYING OUT THE INVENTION

Referring to the accompanying drawings, a preferred embodiment of a vertical heat treatment system according to the first invention will be described below in detail.

Figure 1:
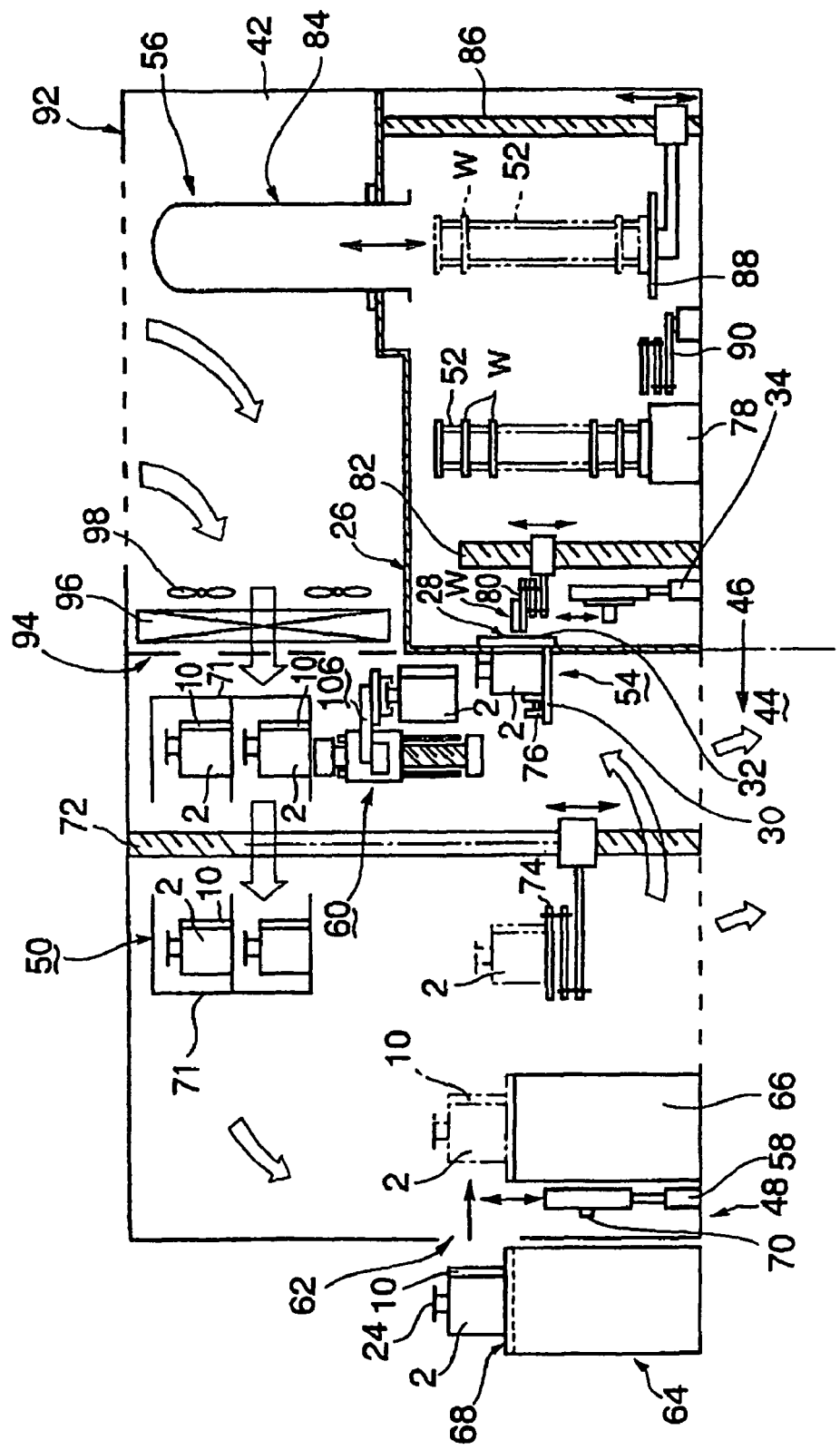
FIG. 1 is a schematic diagram of a vertical heat treatment system according to the first invention.

FIG. 1 is a schematic diagram of a vertical heat treatment system according to the first invention, FIG. 2 is an enlarged view of a standby box transfer means shown in FIG. 1, FIG. 3 is a top view of the standby box transfer means, and FIG. 4 is an illustration for explaining the operation of the standby box transfer means. Furthermore, the same reference numbers are given to the same components as those of the above described conventional system.

First, as shown in FIG. 1, the whole vertical heat treatment system 40 is surrounded by a housing 42 of stainless or the like, and the interior thereof is divided by a partition wall 26 into two parts of a housing-box transfer area 44 for transferring a treating-object housing box 2 (which will be also hereinafter referred to as a housing box) and a wafer transfer area 46 serving as a treating-object transfer area for transferring a semiconductor wafer W which is an object to be treated. Clean air flows in the box transfer area 44, and the interior of the wafer transfer area 46 is in an atmosphere of an inert gas of $N_2$ gas or the like. The treating system 40 mainly comprises: a carrying-in/out port 48 for mainly carrying the housing box 2 in and out of the system 40; a stocker portion 50 for temporarily storing the housing box 2; a transfer stage 54 for transferring a semiconductor wafer W between the housing box 2 and a treating-object boat 52; a treatment unit 56 for carrying out a predetermined treatment with respect to the semiconductor wafer W which is transferred to the treating-object boat 52 to be held thereon; a lid opening/closing mechanism 58 which is provided in the vicinity of the carrying-in/out port 48; an opening/closing mechanism 34 which is provided inside of the wafer transfer area 46 for the transfer stage 54; and a standby box transfer means 60 which is a feature of the present invention and which is provided inside of the housing-box transfer area 44 for the transfer stage 54.

In the above described carrying-in/out port 48, the housing 42 is formed with a box carrying-in/out opening 62 which is always open. Outside of the box carrying-in/out opening 62, there is provided an outside mounting table 64 for supporting thereon the housing box 2 which is transferred from the outside. Inside of the box carrying-in/out opening 62, there is provided an inside mounting table 66 for supporting thereon the housing box 2 which slides and moves from the outside mounting table 64. On the top of the outside or inside mounting table 64 or 66, there is provided a sliding plate 68 capable of sliding and moving between both of the mounting tables 64 and 66. The sliding plate 68 is capable of moving while the housing box 2 is supported thereon. Between the inside mounting table 66 and a portion right below the box carrying-in/out opening 62 inside of the box carrying-in/out opening 62, the lid opening/closing mechanism 58 capable of vertically moving (rising and setting) is provided for temporarily opening and closing an opening/closing lid 10 of the housing box 2. The reason why the opening/closing lid 10 of the housing box 2 is temporarily taken is that wafer information, such as the number, positions and states of wafers in the housing box 2, is intended to be detected by a sensor (not shown).

Figure 5:
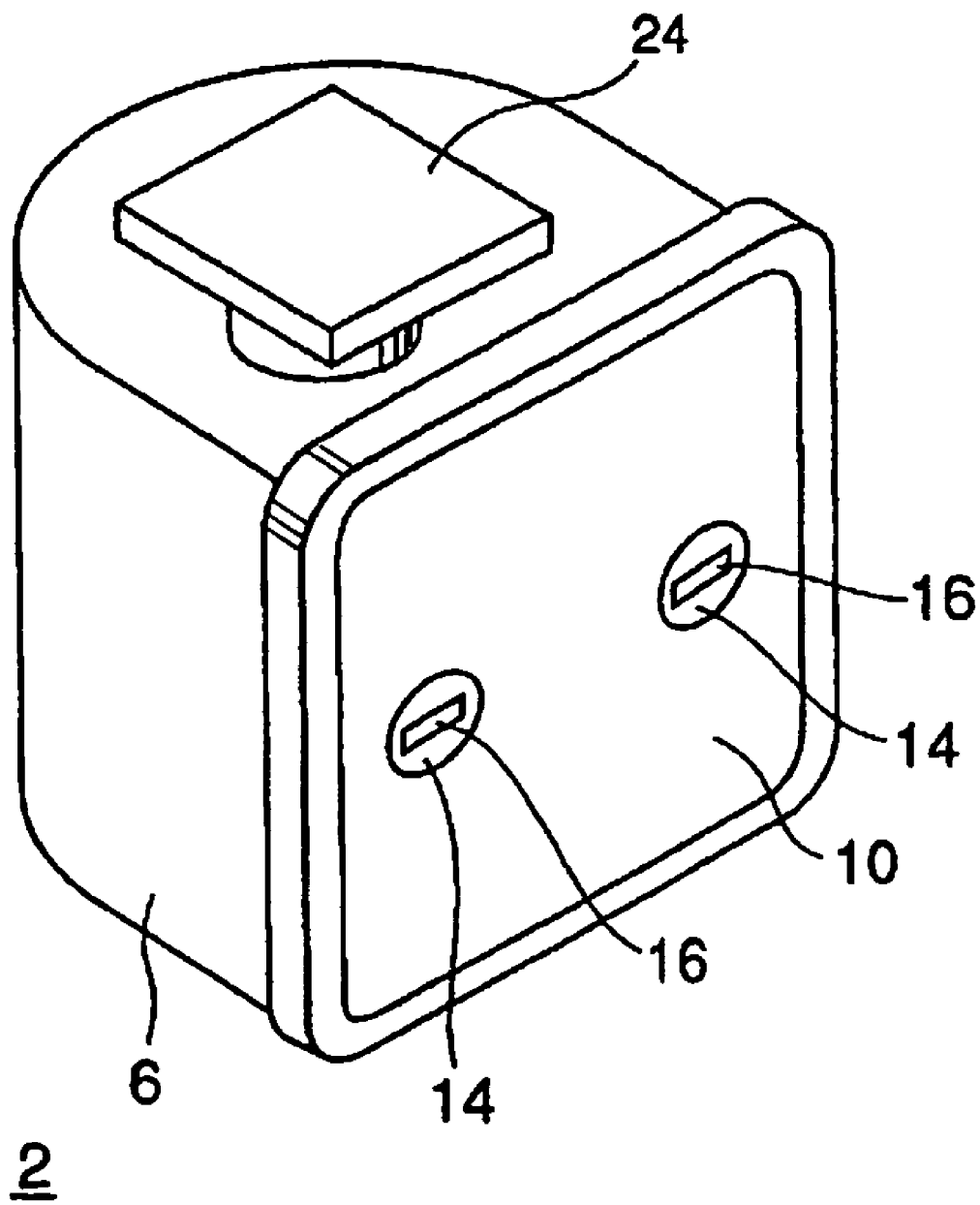
FIG. 5 is a perspective view of a treating-object housing box.
Figure 6:
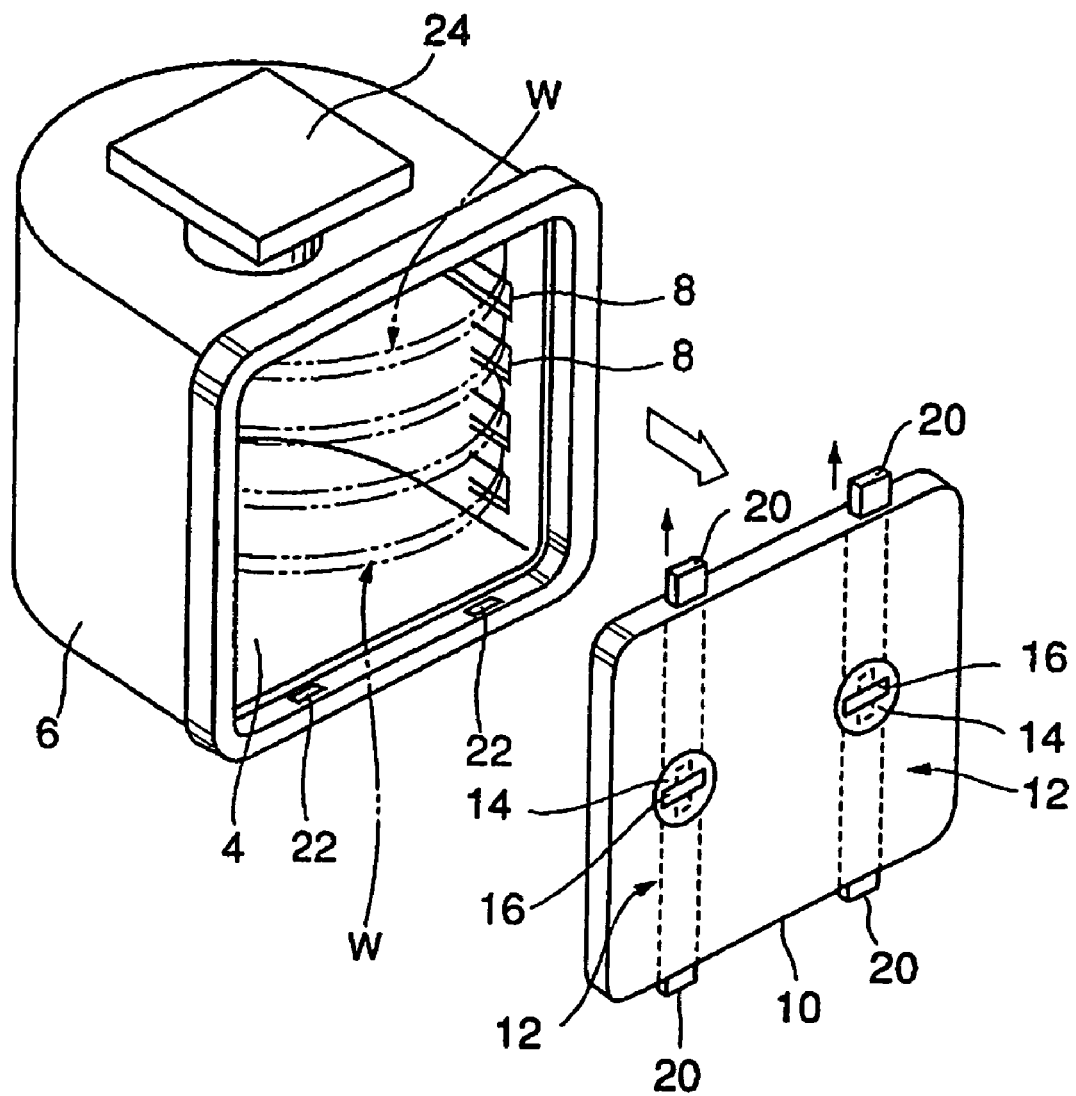
FIG. 6 is a perspective view showing the state that the lid of the treating-object housing box is open.
Figure 7:
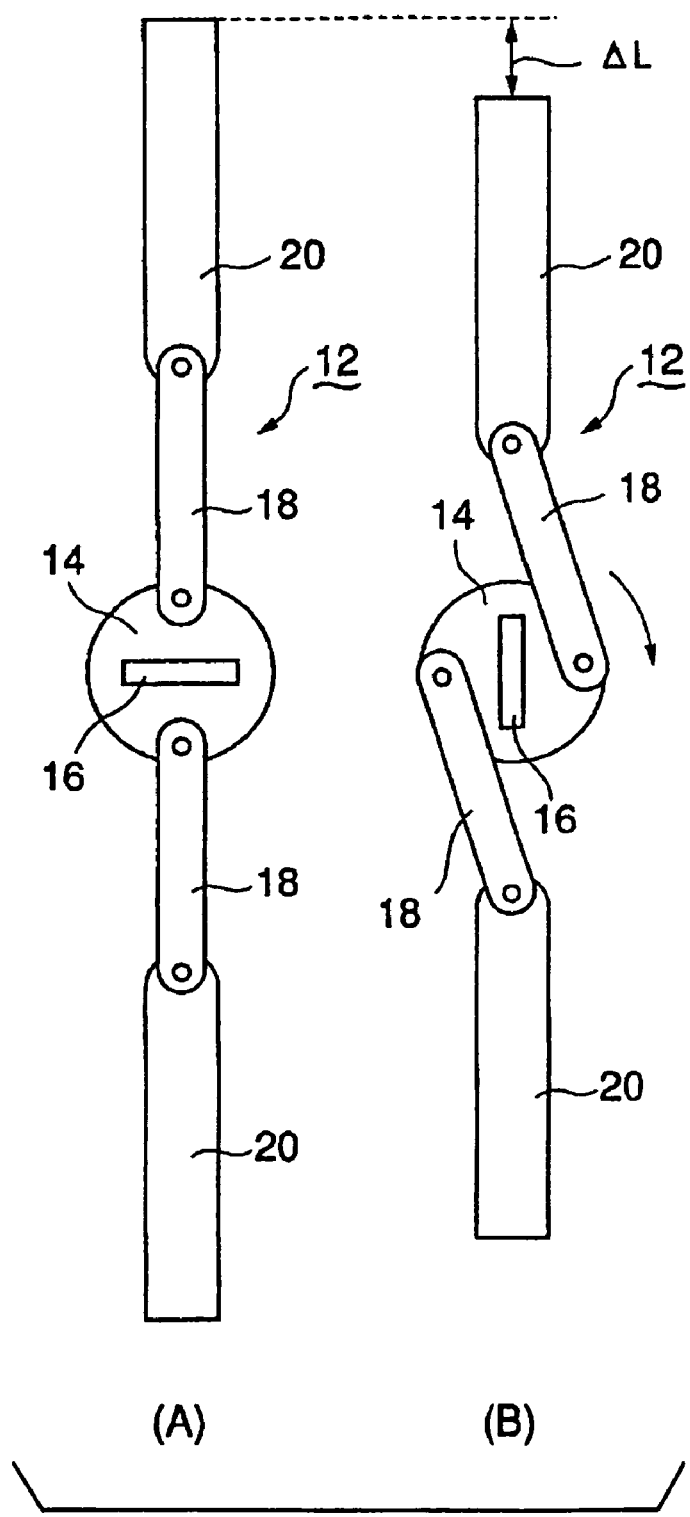
FIG. 7 is a view showing a locking mechanism for the lid.
Figure 8:
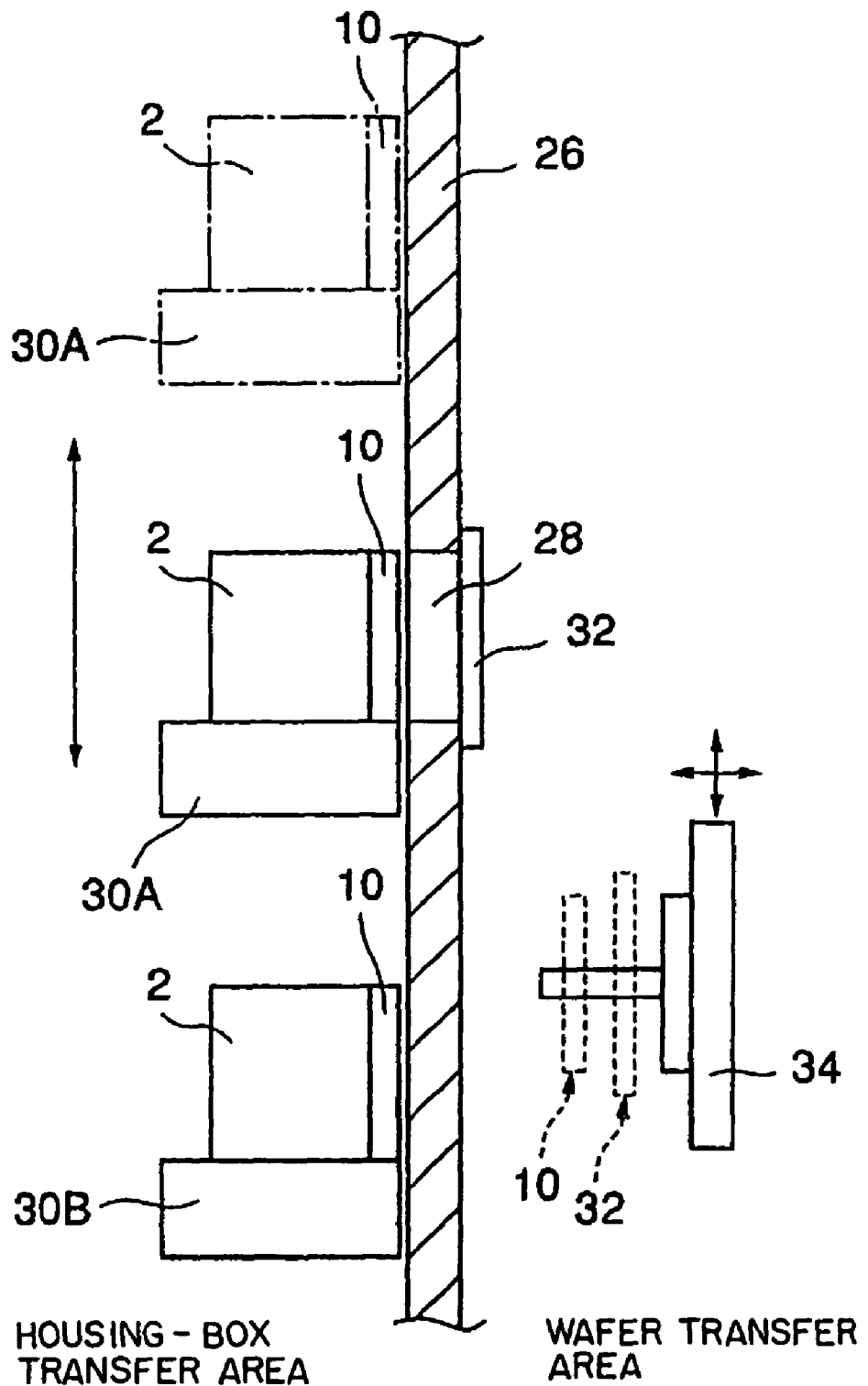
FIG. 8 is an enlarged view showing a principal part of an example of a conventional system.
Figure 9:
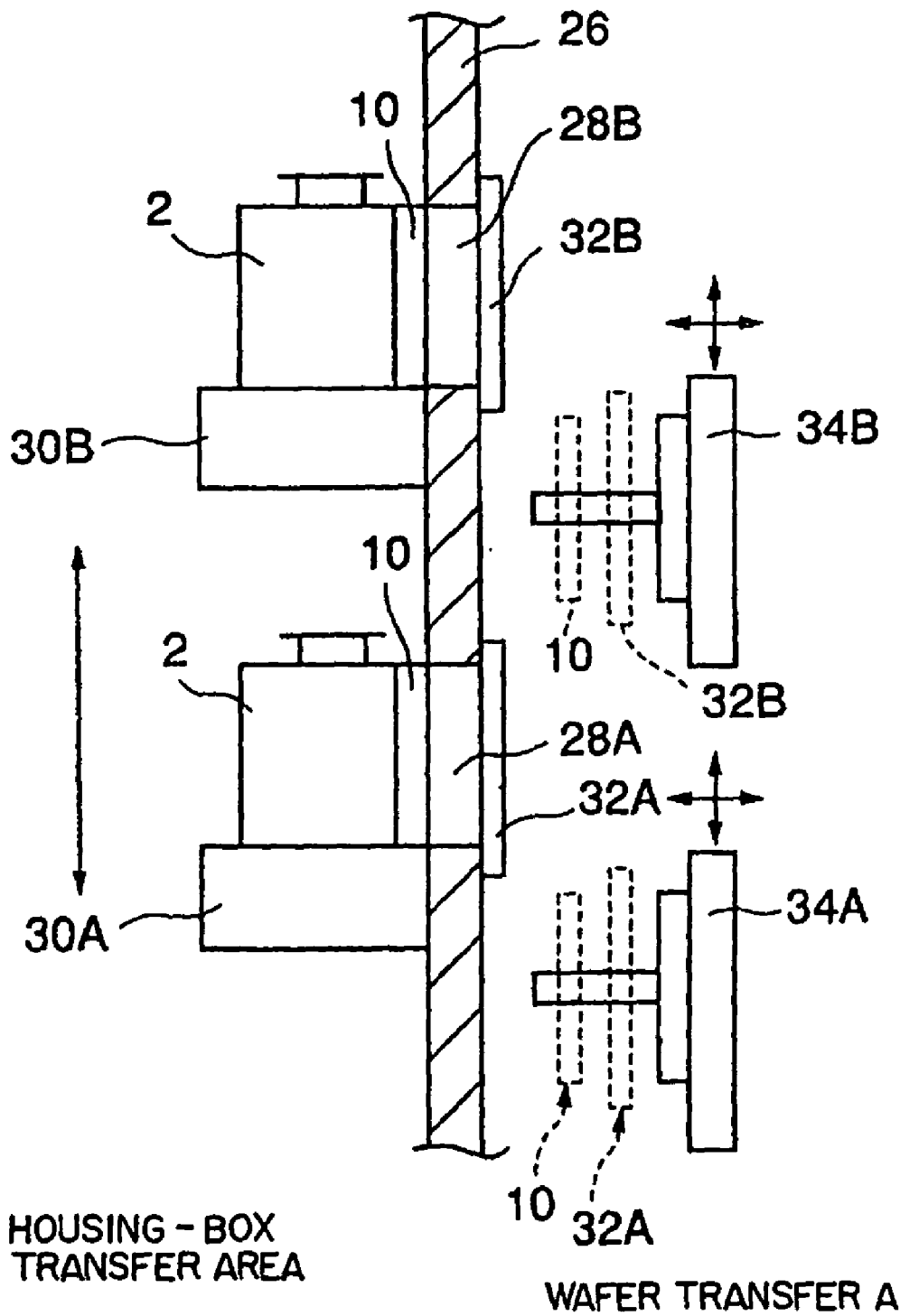
FIG. 9 is an enlarged view showing a principal part of an example of another conventional system.

On the lid opening/closing mechanism 58, there is mounted a pair of key portions 70 (only one is shown in FIG. 1) which are capable of protruding and retracting in horizontal directions and of rotating in normal and reverse directions. By rotating the key portions 70 in normal and reverse directions while the key portions 70 are inserted into key grooves 16 which are shown in FIGS. 5 through 7, a locking mechanism 12 can be locked and unlocked to hold it.

On the other hand, in the upper portion in the housing-box transfer area 44, the above described stocker portion 50 is arranged. The stocker portion 50 is provided with two columns×two stages of shelves 71 in parallel for temporarily supporting and storing the housing box 2 thereon in the shown embodiment. Furthermore, the number of the shelves 71 should not be particularly limited. In fact, a large number of shelves are provided.

Between the two shelves 71, an elevator 72 is provided so as to be raised. The elevator 72 is provided with a box transfer arm 74 which extends in horizontal directions and which is capable of swiveling and bending and stretching. Therefore, by causing the box transfer arm 74 to bend and stretch and to move in vertical directions, the housing box 2 can be held by the box transfer arm 74 to be transferred between the inside mounting table 66 and the stocker portion 50.

In the above described transfer stage 54, a single opening 28 substantially having the same size as that of the opening 4 (see FIG. 6) of the housing box 2 is formed in the partition wall 26 for separating both of the areas 44 and 46 from each other, and a single mounting table 30 is horizontally provided on the side of the housing-box transfer area 44 of the opening 28, so that the housing box 2 can be mounted thereon. On one side of the mounting table 30, a horizontal actuator 76 for pressingly biasing the housing box 2, which is mounted thereon, toward the partition wall 26 is provided so that the opening edge of the opening portion 4 of the box vessel 6 substantially airtightly contacts the opening edge of the opening 28 of the partition wall 26 while the opening/closing lid 10 of the housing box 2 faces the opening 28. The opening 28 is provided with an opening/closing door 32 for opening and closing the opening 28. In the housing-box transfer area 44, the standby box transfer means 60 is provided for causing the housing box 2 to stand by in the vicinity of the opening 28. The construction of the transfer means 60 will be described later.

Right below the opening 28 inside of the wafer transfer area 46, the opening/closing mechanism 34 is provided for opening and closing the opening/closing lid 10 of the housing box 2 and the opening/closing door 32. As this opening/closing mechanism 34, the above described opening/closing mechanism disclosed in Japanese Patent Laid-Open No. 8-279546, or the opening/closing mechanism disclosed in Japanese Patent Laid-Open No. 11-274267 may be used.

In the wafer transfer area 46, two boat mounting tables 78 (only one is shown in FIG. 1) are provided for supporting thereon the treating-object boat 52 such as a wafer boat. Between the boat mounting tables 78 and the above described transfer stage 54, a wafer transfer arm 80 capable of swiveling and bending and stretching is provided. This wafer transfer arm 80 is capable of being vertically moved by the elevator 82. Therefore, by causing the wafer transfer arm 80 to stretch, swivel and vertically move, the wafer W can be transferred between the housing box 2 on the mounting table 30 and the treating-object boat 52 on the boat mounting table 78.

The treating-object boat 52 is made of, e.g., quartz, and capable of supporting, e.g., about 50 to 150 wafers W, on multiple stages at a predetermined pitch.

Above one side of the wafer transfer area 46, there is arranged a treatment unit 56 comprising a vertical heat treatment furnace having a cylindrical treatment vessel 84 of quartz for carrying out a predetermined heat treatment, such as deposition, oxidation or diffusion, with respect to the large number of wafers W at a time. Below the treatment vessel 84, there is arranged a cap 88 capable of being vertically moved by the elevator 86. By mounting the treating-object boat 52 on the cap 88 to move the cap 88 upwards, the boat 52 can be loaded in the treatment vessel 84 via the bottom end opening of the treatment vessel 84. At this time, the bottom end opening of the treatment vessel 84 is airtightly closed by the cap 88. Between the lowered cap 88 and the above described boat mounting table 87, there is provided a boat transfer arm 90 capable of bending and stretching and swiveling, so that the treating-object boat 52 can be transferred between the boat mounting table 78 and the cap 88.

On the housing ceiling portion above the above described treatment unit 56, there is provided a ceiling ventilating plate having a ventilating hole, such as a punching metal, for introducing outside clean area into the treatment unit 56. Above the transfer stage 54 and on the side of the back face of the stocker 50, a ventilating partition wall 94 having a ventilating hole is provided. On the ventilating partition wall 94 on the side of the treatment unit 56, a filter member 96 of, e.g., a HEPA filter, and a fan 98 are provided. For example, by passing clean air (gas) introduced from the outside through the filter member 96, clean air having a high cleanliness factor is introduced into the housing-box transfer area 44.

Also as shown in FIGS. 2 and 3, the standby box transfer means 60 which is a feature of the present invention has a lifting table 102 engaged with two guide rails 100 which are provided in parallel in the height direction of the side wall 42A of the housing 42. The lifting table 102 is capable of being vertically moved by a required predetermined stroke by a lifting means, e.g., a driving ball screw, which passes through the lifting table 102 and which is screwed thereto. Furthermore, the ball screw 104 is capable of being normally and reversely rotated by a driving motor (not shown).

The lifting table 102 is provided with an arm portion 106 which extends in horizontal directions and which is capable of bending and swiveling. The arm portion 106 comprises a first arm 106A, the base end portion of which is pivotably mounted on the side of the lifting table 102, and a second arm 106B which is pivotably mounted on the tip portion of the first arm 106A. The second arm 106B is set so as to be always directed in the same direction regardless of the turning angle of the first arm 106A. On the tip of the second arm 106B, a box gripping portion 108 is provided. On the bottom portion of the box gripping portion 108, there are provided a pair of claw portions 110 which are slidable in horizontal directions so as to approach or leave each other. The top gripping handle 24 of the housing box 2 can be gripped by the claw portions 110 to be transferred. Furthermore, the construction of the standby box transfer means 60 should not be limited to the above described construction if it can grip and transfer the housing box 2 as described above.

The operation of the treatment system 40 with the above described construction will be described below.

First, the interior of the wafer transfer area 46 is in an atmosphere of an inert gas, e.g., $N_2$ gas, in order to prevent natural oxide films from adhering to the surface of the wafers. The interior of the housing-box transfer area 44 is maintained in an atmosphere of clean air. Specifically, clean air is introduced from the ceiling ventilating plate 92 of the housing 42 into the box transfer area 44 via the filter member 96 and the ventilating partition wall 94, and circulates in the area 44 to be exhausted from its bottom.

First the whole flow of the semiconductor wafers W will be described. The housing box 2 transferred from the outside is mounted on the outside mounting table 64 so that the opening/closing lid 10 faces the box carrying-in/out opening 62. Then, by driving the lid opening/closing mechanism 58, the opening/closing lid 10 of the housing box 2 is temporarily removed, and the number and positions of the wafers housed in the housing box 2 are detected by a sensor (not shown). If this detection is completed, the lid opening/closing mechanism 58 is driven again, so that the removed opening/closing lid 10 is mounted on the housing box again.

Then, if the sliding plate 68 on the outside mounting table 64, on which the housing box 2 is supported, is moved forwards, the sliding plate 68 is transferred to the inside mounting table 66. Then, by driving the box transfer arm 74, the housing box 2 supported on the inside mounting table 66 is taken to be held. Moreover, by driving the elevator 72, the housing box 2 is transfer to a predetermined position on the shelf 71 of the stocker portion 50 and temporarily stored thereon. Simultaneously, the housing box 2 which is temporarily stored on the shelf 71 and which houses therein the wafer serving as an object to be treated is taken by the box transfer arm 74, and the elevator 72 is driven to move it downwards as described above. If the mounting table 30 of the transfer stage 54 is empty, the housing box 2 is transferred to the mounting table 30 of the transfer stage 54.

On the other hand, if another housing box 2 has been set on the mounting table 30, the housing box 2 on the box transfer arm 74 is gripped by the standby box transfer means, which is a feature of the present invention, to be transferred to the vicinity of the opening 28 to stand by. The opening/closing lid 10 of the housing box 2 on the mounting table 30 is directed to the opening/closing door 32 which is provided in the partition wall 26, and the housing box 2 is pressingly biased to be fixed on the mounting table 30 by means of a horizontal actuator which is provided on one side of the mounting table 30.

By driving the opening/closing mechanism 34 in this state, the opening/closing door 32 of the opening 28 and the opening/closing lid 10 of the housing box 2 are removed to take shelter upwards or downwards. Since the peripheral edge portion of the opening portion of the housing box 2 is pressed against the partition wall 26 to be in a tight contact state, gases do not flow between both of the areas 44 and 46 via the opening 28. Then, by driving the wafer transfer arm 80 and the elevator 82, the wafers W housed in the housing box 2 are taken out, one or a plurality of wafers at a time, to be mounted on the treating-object boat 52 which is provided on the boat mounting table 78. If the transfer of the wafers W to the treating-object boat 52 is completed, the boat transfer arm 90 is driven, so that the treating-object boat 52 on the boat mounting table 78 is mounted on the cap 88 which has been moved to the lowermost end. Then, if the transfer of the treating-object boat 52 is completed, the elevator 86 is driven to upwardly move the cap 88 which has been mounted on the treating-object boat 52, so that the boat 52 is introduced into the treatment vessel 84 via the bottom end opening of the treatment vessel 84 of the treatment unit 56 to be loaded therein. Then, the bottom end opening of the treatment vessel 84 is closed by the cap 88. In this state, a predetermined heat treatment, e.g., deposition, oxidation or diffusion, is carried out with respect to the wafers W in the treatment unit 56.

If the predetermined heat treatment is thus completed, the reverse operation of the above described operation is carried out to take out the treated wafer W. That is, the treating-object boat 52 is moved downwards from the interior of the treatment vessel 84 to be unloaded to be mounted on the boat mounting table 78. Then, the treated wafer W is transferred by the wafer transfer arm 80 from the boat 52 into the housing box 2. The transfer of the treated wafer W into the housing box 2 is completed, the opening/closing mechanism 34 is driven to mount the opening/closing lid 10, which has been held by the opening/closing mechanism 34, and the opening/closing door 32 in the housing box 2 and the opening 28, respectively.

Then, the box transfer arm 74 is driven to temporarily store the housing box 2 in the stocker portion 50 or to transfer the housing box 2 to the outside of the treatment system 40 via the box carrying-in/out opening 62 without storing the housing box 2. While the box transfer arm 74 is transferring the housing box 2 in which the treated wafer is housed, the standby box transfer means 60 which has gripped an empty housing box to stand by is set the empty housing box on the mounting table 30, and the housing of the treated wafer into the housing box is started. Subsequently, the same operation is repeated. Furthermore, the above described flow of the housing box 2 is only shown as an example. Of course, the invention should not be limited thereto.

Referring to FIG. 4, the operation of the above described standby box transfer means 60 will be described below in detail.

First, in FIG. 4(A), one housing box 2A has been mounted on the mounting table 30, and the opening/closing door 32 for closing the opening/closing lid 10 and the opening 28 has been removed by the opening/closing mechanism 34 to be moved downwards. In addition, the semiconductor wafer W in the housing box 2A has been carried out. Thus, while the wafer in the housing box 2A is being carried out, the box transfer arm 74 in the empty state takes the housing box 2B, in which a wafer to be treated next is housed, out of the stocker portion 50. Then, as shown in FIG. 2, the standby box transfer means 60 rotates the arm portion 106 and drives the box gripping portion 108 to receive the housing box 2B from the box transfer arm 74 to cause the housing box 2B to stand by in the vicinity of (in FIG. 4(A), slightly above) the housing box 2A on the mounting table 30.

Thus, if the carrying-out of the wafer W in one housing box 2A is completed, the opening/closing mechanism 34 is driven to mount the opening/closing lid 10 and the opening/closing door 32. Then, the sliding plate 30A on the mounting table 30 is slightly moved backwards to interrupt the interference of the housing box 2A with the opening 28, and the emptied housing box 2A is picked up from the top of the mounting table 30 to be transferred by means of the box transfer arm 74.

Thus, the top of the mounting table 30 is emptied, the standby box transfer means 60 is driven to move the arm portion 106 downwards, so that the other housing box 2B which has stood by slightly above the mounting table 30 is set on the mounting table 30 as shown in FIG. 4(B). At this time, the pair of claw portions 110 of the box gripping portion 108 are caused to slide so as to leave each other, so that the gripping handle 24 of the housing box 2B can be removed. Then, the housing box 2B which has been newly set on the mounting table 30 is fixed, and the sliding plate 30A is advanced toward the opening 28, so that the tip of the housing box 2B contacts the opening 28.

Then, as shown in FIG. 4(C), both of the opening/closing lid 10 of the housing box 2B and the opening/closing door 32 of the opening 28 are removed by the opening/closing mechanism 34 as described in FIG. 4(A), and the wafer in the housing box 2B is carried out.

Then, while the wafer is carried out, the housing box 2C in which a wafer to treated next is housed is transferred above in the same manner as the above described manner to be caused to stand by therein. Subsequently, the above described operations are similarly repeated.

On the other hand, when the treated semiconductor wafer is introduced into an empty housing box, the reverse operation of the above described operation is carried out. Also in that case, the standby box transfer means 60 may be used for causing an empty housing box to stand by slightly above the mounting table 30.

Thus, according to this preferred embodiment, the standby box transfer means 60 is used for causing a housing box, in which a wafer to be treated next is housed, to stand by in the vicinity of the mounting table 30, or for causing an empty housing box, in which a wafer is to be housed next, to stand by. Therefore, immediately after the operation for carrying a wafer in and out of the last housing box is completed, the operation for carrying a wafer in and out of a housing box during standby, so that it is possible to rapidly and efficiently carry out the carrying-in/out operation.

In addition, the structure of the standby box transfer means 60 is relatively simple, and it is sufficient if only one opening/closing mechanism 34 is provided, so that the costs can be smaller than those in conventional systems. In addition, since it is sufficient if only one mounting table 30 is provided, it is possible to greatly reduce the occupied space.

While the housing box 2 has been caused to stand by slightly above the mounting table 30, this standby position should not particularly be limited if it is in the vicinity of the mounting table 30. For example, the housing box may be caused to stand by in a substantially lateral direction of the mounting table 30.

While the semiconductor wafer has been described as an example of an object to be treated, the present invention should not be limited thereto, but the invention may be applied to a glass substrate or an LCD substrate.

As described above, according to the vertical heat treatment system of the first invention, excellent effects can be provided as follows.

According to the first invention, when an object to be treated is carried out of one treating-object housing box to be carried in the treating-object transfer area via the opening of the partition wall, the standby box transfer means is used for causing the nest treating-object housing box to stand by in the vicinity of the opening (mounting table). Then, when the carrying-out of the object in the last treating-object housing box is completed, the treating-object housing box during standby can be immediately set in the above described opening to carry the object out. Therefore, the carrying and transfer of the object in and to the treating-object transfer area can be quickly and efficiently carried out in a space saving state without causing the structure to be so complicated.

Also when the treated object is transferred, the carrying-in/out of the object can be quickly and efficiently carried out in the same manner as the above described manner by causing an empty treating-object housing box to stand by in the vicinity of the mounting table.

Referring to the accompanying drawings, the second invention will be described below in detail.

Figure 10:
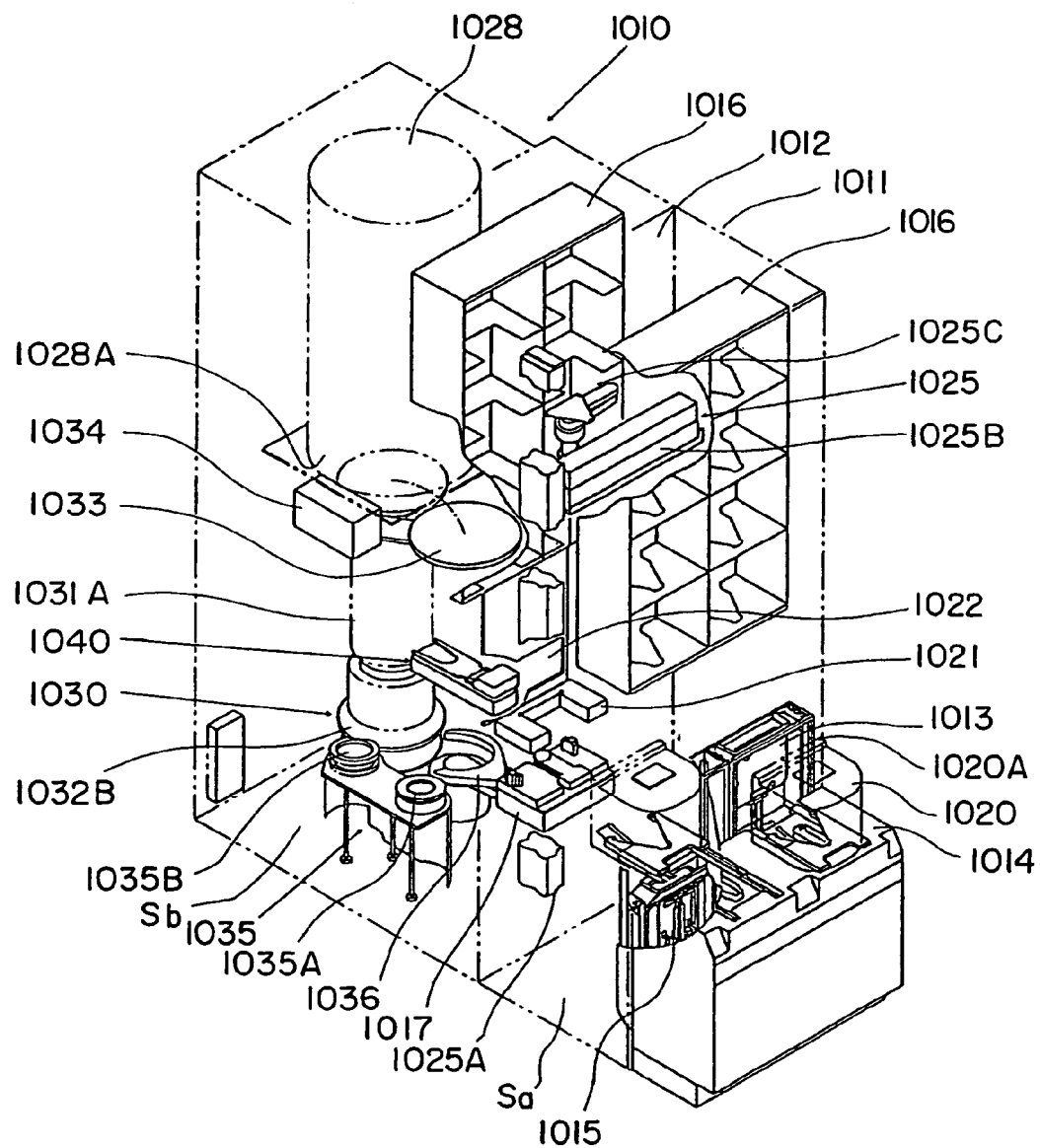
FIG. 10 is a perspective view showing an example of a schematic construction of a heat treatment system according to the second invention.
Figure 11:
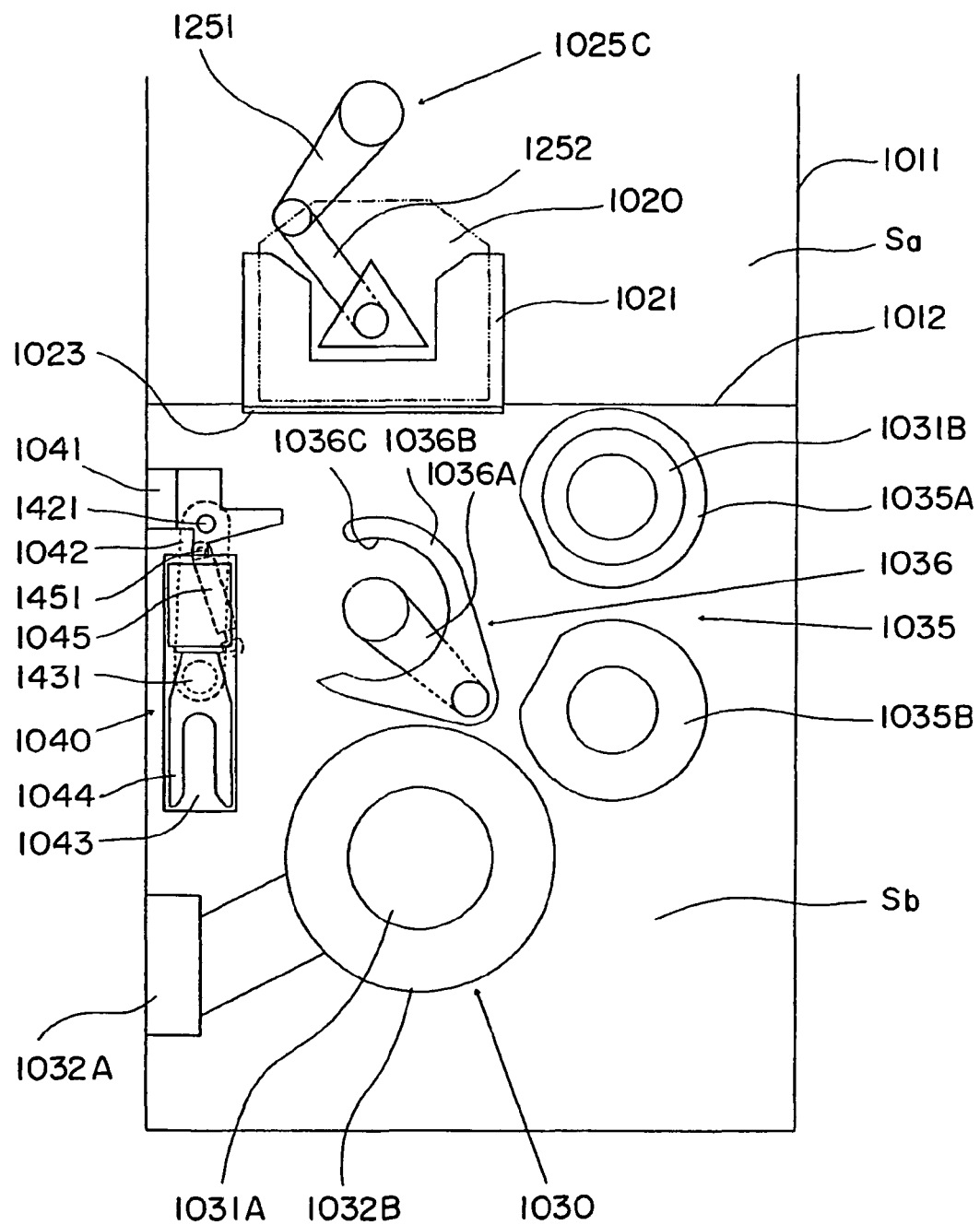
FIG. 11 is a plan view of a loading area of the heat treatment system shown in FIG. 10.

FIG. 10 is a perspective view showing an example of a schematic construction of a vertical heat treatment system according to the second preferred embodiment, and FIG. 11 is a plan view of a loading area of the vertical heat treatment system shown in FIG. 10.

This heat treatment system 1010 is separated into front and rear portions by a partition wall 1012, and has a housing 1011 which forms a carrier transfer area 5a in which a carrier (cassette) housing therein a semiconductor wafer serving as an object to be treated is carried in and out and stored, and a loading area Sb in which the semiconductor wafer is transferred and heat-treated. In the front face of the housing 1011, a carrying-in/out opening 1013 for carrying a carrier 1020 in and out is formed, and a carrying-in/out stage 1014 serving as an inlet/outlet port to the carrying-in/out opening 1013 is provided. The carrier transfer area Sa is maintained in an atmosphere of atmospheric air, and the loading area Sb is maintained in an atmosphere of atmospheric air or an atmosphere of an inert gas, such as nitrogen gas. In FIG. 10, reference number 1015 denotes a sensor mechanism for opening a lid 1020A of the carrier 1020 to detect the position and number of semiconductor wafers, reference number 1016 denotes a shelf-like carrier storage portion for storing a plurality of carriers 1020, and reference number 1017 denotes a notch aligning mechanism for aligning notches (cut-out portions), which are formed in the peripheral edge portions of the semiconductor wafers, in one direction in order to arrange crystal orientation.

The carrier 1020 comprises a plastic vessel capable of housing therein a plurality of, e.g., about 13 to 25, semiconductor wafers having a predetermined diameter, e.g., a diameter of 300 mm, on multiple stages in a horizontal state at regular intervals in vertical directions. The carrier 1020 is detachably provided with a lid 1020A for airtightly closing a wafer outlet (not shown) which is formed in the back face thereof.

In the carrier transfer area Sa, carrier mounting portions 1021 are provided in the vicinity of the partition wall 1012 for supporting thereon the carrier 1020. In order to improve throughput, the plurality of, e.g., two, carrier mounting portions 1021 are provided so as to be arranged in vertical directions although only one carrier mounting portion is shown for convenience. Thus, while the semiconductor wafers are being transferred in one carrier mounting portion, the carrier 1020 can be exchanged in the other carrier mounting portion.

In the carrier transfer area Sa, there is provided a carrier transfer mechanism 1025 for transferring the carrier 1020 between the carrier storage portions 1016, 1016 and the carrier mounting portion 1021.

The carrier transfer mechanism 1025 comprises: a lifting guide 1025A which is provided on one side of the housing 1011; a lifting arm 1025B which is vertically moved by the lifting guide 1025A; and a transfer arm 1025C which is provided on the lifting arm 1025B so as to be rotatable on the horizontal plane. As shown in FIG. 11, the transfer arm 1026C comprises a first arm 1251, and a second arm 1252 which is provided on the tip portion of the first arm 1251 so as to be rotatable on the horizontal plane.

The partition wall 1012 has an opening portion 1022, which is arranged so as to correspond to the height of each of the carrier mounting portions 1021, for establishing a communication between the carrier transfer area Sa and the loading area Sb. The opening portion 1022 substantially has the same diameter as that of the wafer outlet of the carrier 1020.

The partition wall 1012 is provided with a door (1023 in FIG. 11) for closing the opening portion 1022 from the side of the loading area Sb. This door 1023 is open and closed by a door opening/closing mechanism (not shown) which is provided in the loading area Sb.

There is provided a lid opening/closing mechanism (not shown) for opening and closing the lid 1020A of the carrier 1020. By this mechanism, the door 1020A and the lid 1020A of the carrier 1020 are moved to the loading area Sb and caused to take shelter upwards or downwards so as not to prevent the semiconductor wafers from being transferred.

In the rear portion (lower portion in FIG. 11) of the loading area Sb, a heat treatment furnace 1028 is provided in the upper portion, and a boat elevator mechanism 1030 serving as a lifting mechanism which is moved in vertical directions for carrying wafer boats 1031A and 1031B of, e.g., quartz, each of which is a holder for holding a plurality of, e.g., about 50 to 150, semiconductor wafers on multiple stages at regular intervals in vertical directions, in and out of the heat treatment furnace 1028 is provided so as to face the carrier mounting portion 1021.

The boat elevator mechanism 1030 comprises a lifting guide 1032A, and a mounting table 1032B on which the wafer boats 1031A and 1031B are supported and which is vertically moved by the lifting guide 1032A. The mounting table 1032B, together with the wafer boats 1031A and 1031B, is introduced into the heat treatment furnace 1028 to serve as a lid for closing a bottom end opening 1028A of the heat treatment furnace 1028.

In the vicinity of the bottom end opening 1028A of the heat treatment furnace 1028, there is provided a shutter 1033 for closing the bottom end opening 1028A when the wafer boat after heat treatment is carried out of the heat treatment furnace 1028. The shutter 1033 is designed to be rotated by a shutter driving mechanism about a vertically extending shaft to be open and closed.

On one side portion of the housing 1011 in the loading area Sb, there is provided a boat mounting portion 1035 serving as a holder mounting portion on which the wafer boats 1031A and 1031B are supported for transferring the semiconductor wafers. The boat mounting portion 1035 has first and second mounting portions 1035A and 1035B which are arranged in longitudinal directions.

In the loading area Sb, there is provided a boat transfer mechanism 1036 which is a holder transfer mechanism for transferring the wafer boats 1031A and 1031B between the first mounting portion 1035A or second mounting portion 1035 of the boat mounting portion 1035 and the mounting table 1032B of the boat elevator mechanism 1030 and between the first mounting portion 1035A and the second mounting portion 1035B.

The boat transfer mechanism 1036 comprises a first arm 1036A which is rotatable on the horizontal plane and which is movable in vertical directions, and a supporting arm 1036B which is provided on the tip portion of the first arm 1036A so as to be rotatable on the horizontal plane and which has a substantially C-shaped opening 1036C capable of vertically supporting the wafer boats 1031A and 1031B.

The supporting arm 1036B is arranged so that the locus of the center of the opening 1036C when being driven includes the rotation center of the first arm 1036A. By rotating the first arm 1036A and the supporting arm 1036B in synchronism with each other, the wafer boats 1031A and 1031B are transferred on the horizontal plane.

At a level above the lowest position of the boat transfer mechanism 1036, there is provided a wafer transfer mechanism 1040 which has a motion space region overlapping with the motion space region of the boat transfer mechanism 1036 and which is a treating-object transfer mechanism for transferring the semiconductor wafers between the carrier 1020 on the carrier mounting portion 1021 and the wafer boat 1031B on the boat mounting portion 1035.

As shown in FIG. 11, the wafer transfer mechanism 1040 comprises: a lifting guide 1041 which is provided on the opposite side face to the boat mounting portion 1035 via a part of the motion space region of the boat transfer mechanism 1036; a swivel arm 1042 which is movable in vertical directions by means of the lifting guide 1041 and which is rotatable about a vertically extending shaft 1421; an elongated rectangular transfer head 1043 which is provided on the tip portion of the swivel arm 1042 so as to be rotatable on the horizontal plane; and a supporting arm 1044 which comprises one or a plurality of, e.g., one to five, fork-shaped thin plates and which is provided on the transfer head 1043 so as to be retractable in their longitudinal directions.

Means for driving the wafer transfer mechanism 1040 comprises a stretching mechanism 1045 for rotating the swivel arm 1042, and a belt transmission mechanism for transmitting the rotational motion of the swivel arm 1042 to the transfer head 1043.

For example, the stretching mechanism 1045 comprises an air cylinder. One end of the stretching mechanism 1045 is rotatably connected to a rotation center shaft 1451 which is different from the rotation center shaft 1421 of the swivel arm 1042, and the other end is rotatably connected to a connecting portion (1056 in FIG. 12) in the tip side portion of the swivel arm 1042. The stretching direction of the stretching mechanism 1045 obliquely traverses the longitudinal direction of the swivel arm 1042.

The stretching mechanism 1045 is adjusted so that the whole length thereof expands and contracts in the range of, e.g., from 195 to 250 mm. Thus, the motion space region of the wafer transfer mechanism 1040 is set to be in a predetermined range, and the direction or angular state of the swivel arm 1042 can be surely controlled.

Figure 12:
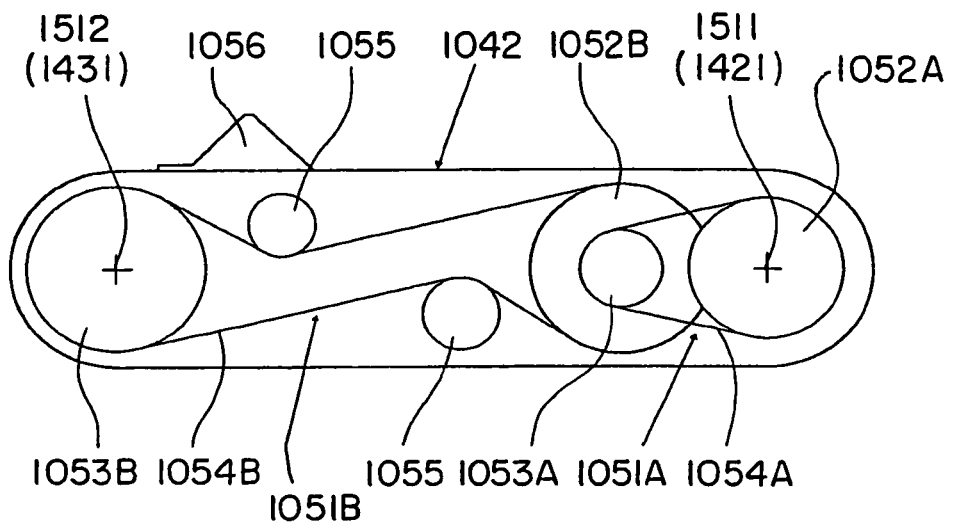
FIG. 12 is an illustration schematically showing an example of a construction of a driving means of a wafer transfer mechanism.

For example, as shown in FIG. 12, the belt transmission mechanism serving as the means for driving the transfer head 1043 comprises belt transmission mechanisms 1051A and 1051B wherein belts 1054A and 1054B are tensionally extended between and wound onto pulleys and which are combined with each other in two stages. Specifically, the center shaft 1511 of a fixed pulley 1052A of one belt transmission mechanism 1051A is arranged while being fixed to the rotation center shaft 1421 of the swivel arm 1042, and the rotation center shaft 1512 of a driven pulley 1053B of the other belt transmission mechanism 1051B is fixed to the rotation center shaft 1431 of the transfer head 1043. In addition, the driven pulley 1053A of the one belt transmission mechanism 1051A and the driving pulley 1052B of the other belt transmission mechanism 1051B are fixed to each other so that the their rotation center shafts are coincident with each other. In the figure, reference number 1055 denotes a tension pulley for increasing the winding angle of the driven pulley 1053B and driving pulley 1052B of the other belt transmission mechanism 1051B.

The driven pulley 1053A of the one belt transmission system 1051A has a smaller diameter than that of the fixed pulley 1052A, and the pulley ratio of the fixed pulley 1052A to the driven pulley 1053A is set to be, e.g., 42:24.

The pulley ratio of the driving pulley 1052B to the driven pulley 1053B in the other belt transmission system is set to be, e.g., 1:1.

According to this driving means, the swivel arm 1042 is rotated about the rotation center shaft 1421 on its one end by the expansion and contraction of the stretching mechanism 1045, so that the driven pulley 1053A of the one belt transmission system 1051A is rotated in the opposite direction to the rotational direction of the swivel arm 1042. In accordance therewith, the driving pulley 1052B of the other belt transmission system 1051B is rotated, and the driven pulley 1053B of the other belt transmission system 1051B is rotated via the belt 1054B. As a result, the transfer head 1043 is rotated by a rotational angle according to the rotational angle of the swivel arm.

The operation of the above described vertical heat treatment system 1010 will be described below.

First, if the carrier 1020 is mounted on the carrying-in/out stage 1014 from the outside by an automatic transfer robot (not shown) or an operator, the carrier 1020 is carried in via the carrying-in/out opening 1013, and the sensor mechanism 1015 opens the lid of the carrier 1020 to detect the positions and number of semiconductor wafers in the carrier 1020. Thereafter, while the lid 1020A of the carrier 1020 is closed, the carrier 1020 is transferred to the notch aligning mechanism by means of the carrier transfer mechanism 1025, and transferred to the carrier mounting portion 1021 after notches (cut-out portions), which are formed in the peripheral edge portions of the semiconductor wafers, are aligned in one direction. In addition, in accordance with the progression of the heat treatment, the carrier 1020 is stored in the carrier storage portion 1016 once, and thereafter, transferred to the carrier mounting portion 1021.

If the lid 1020A of the carrier 1020 on the carrier mounting portion 1021 and the door 1023 of the opening 1022 of the partition wall 1012 are open, the semiconductor wafers are taken out of the carrier 1020 to be sequentially transferred to the wafer boat 1031B, which stands by on the first mounting portion 1035A of the boat mounting portion 1035, by means of the wafer transfer mechanism 1040, specifically by carrying out the rotation of the swivel arm 1042, the rotation of the transfer head 1043 and the expansion and contraction of the supporting arm 1044 in a controlled state. Meanwhile, the boat transfer mechanism 1036 is moved downwards to the lower position to take shelter, so that the wafer transfer mechanism 1040 does not interfere with the boat transfer mechanism 1036.

If the transfer of the semiconductor wafers from the carrier 1020 on the carrier mounting portion 1021 to the wafer boat 1031B on the first mounting portion 1035A is completed, the wafer transfer mechanism 1040 is transferred from its motion space region to a sheltered position on the other side face of the housing 1011.

Figure 13A:
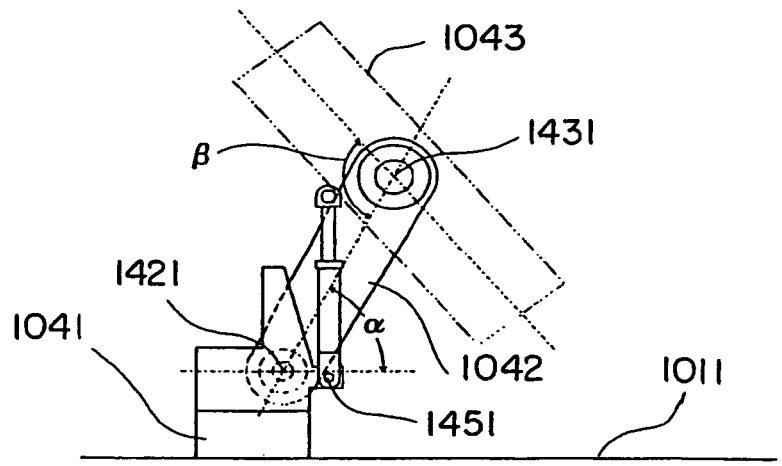
FIG. 13 is an illustration showing the state that the wafer transfer mechanism is positioned at (a) a sheltered motion starting position and (b) a sheltered position.
Figure 13B:
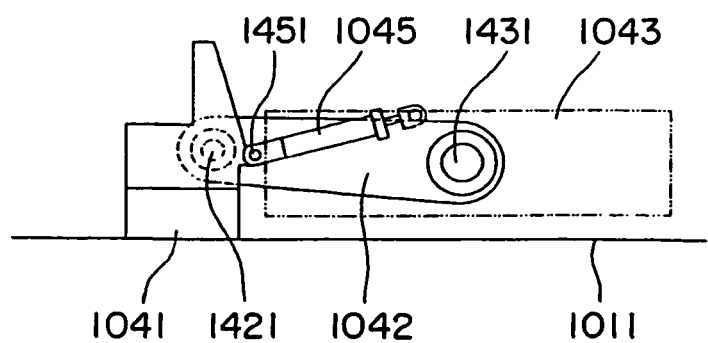
Figure 14:
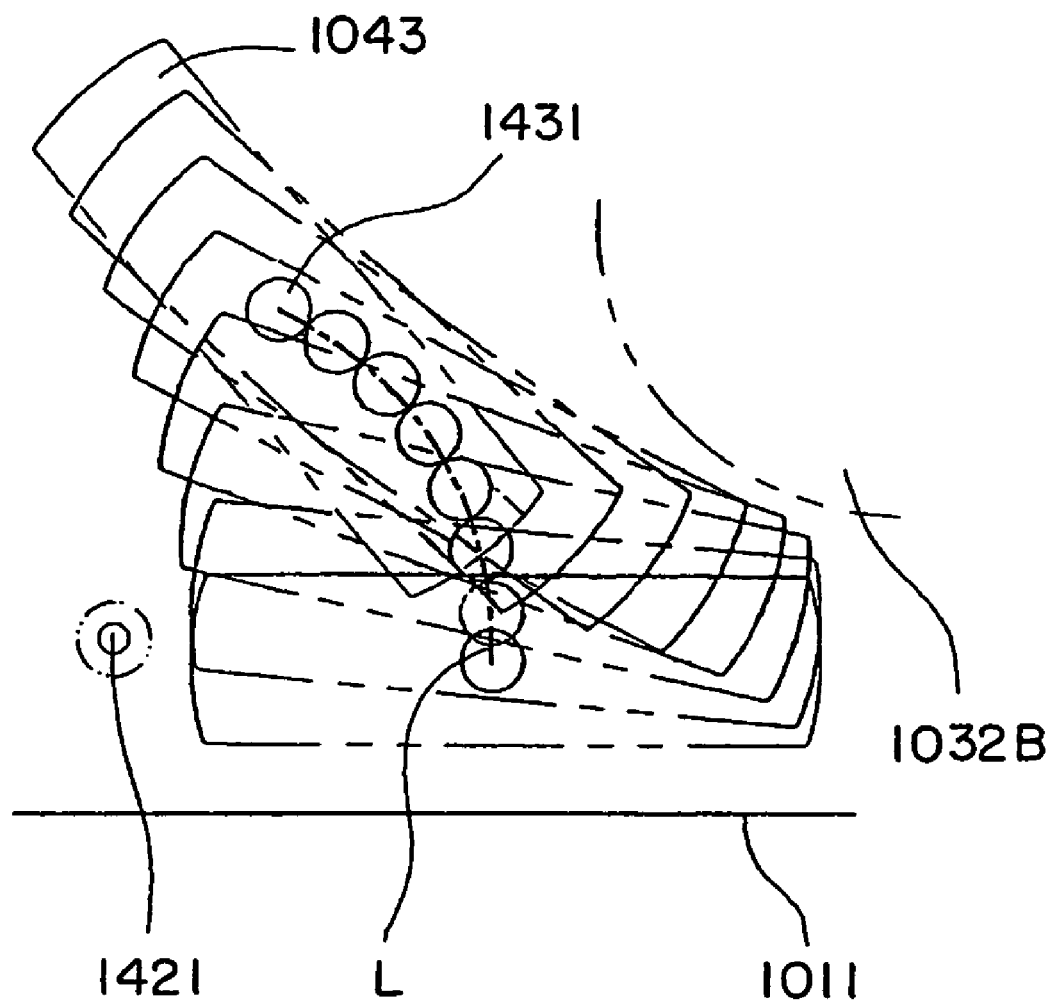
FIG. 14 is an illustration showing the locus of a base when the wafer transfer mechanism takes shelter.

Specifically, if the stretching mechanism 1045 is contracted as shown in FIG. 13(*b*) after the wafer transfer mechanism 1040 is moved to a specific reference position in its motion space region as shown in FIG. 13(*a*), the swivel arm 1042 is rotated about its rotation center shaft 1421, and simultaneously, the transfer head 1043 is rotated by the belt transmission mechanism, which is means for driving the transfer head 1043, by a rotational angle corresponding to the rotational angle of the swivel arm 1042 to be transferred to a predetermined sheltered position. That is, as shown in FIG. 14, while the transfer head 1043 in the wafer transfer mechanism 1040 is rotated (revolved) clockwise around the rotation center shaft 1421 of the swivel arm 1042, the transfer head 1043 itself is rotated (rotated on its axis) in the reverse direction of the direction of rotation of the swivel arm 1042 (counterclockwise) to be moved on the horizontal plane along the outer peripheral edge of the mounting table 1032B in the boat elevator mechanism 1030.

The reference position of the wafer transfer mechanism 1040 in the motion space region is previously set in accordance with, e.g., the pulley ratio of one belt transmission system 1051A in the means for driving the transfer head 1043. Thus, the above described sheltered motion is surely carried out, and the wafer transfer mechanism 1040 is transferred to a predetermined sheltered position.

In this state, the wafer boat holding the semiconductor wafers on the first transfer portion 1035A of the boat transfer portion 1035 is transferred to the mounting table 1032B in the boat elevator mechanism 1030 by means of the boat transfer mechanism 1036, and then, the wafer boat, together with the mounting table 1032B, is introduced into the heat treatment furnace 1028 by means of the boat elevator mechanism 1030. Then, the boat transfer mechanism 1036 is moved to a sheltered position below its motion space region, and one wafer boat is heat-treated. Simultaneously, the transfer of the semiconductor wafers for the wafer boat on the first transfer portion 1035A is carried out in parallel.

After the heat treatment is completed, the mounting table 1032B is moved downwards to cause the wafer boat after the heat treatment to be carried out of the heat treatment furnace 1028 into the loading area Sb, and the bottom end opening 1028A of the heat treatment furnace 1028 is immediately closed by the shutter 1033.

If the wafer boat after the heat treatment is carried out, the wafer boat 1031B before the heat treatment, which stands by on the first mounting portion 1035A, is first transferred to the second mounting portion 1035B by means of the boat transfer mechanism 1036. Then, the wafer boat 1031A after the heat treatment is transferred from the mounting table 1032B to the first mounting portion 1035A, and finally, the wafer boat 1031B on the second mounting portion 1035B is transferred to the mounting table 1032B.

Then, the semiconductor wafers are taken out of the wafer boat 1031A by means of the wafer transfer mechanism 1040 after the heat treatment, to be loaded in the carrier 1020 on the carrier mounting portion 1021 to be transferred by means of the carrier transfer mechanism 1025 to be carried out via the carrying-in/out opening 1013.

According to the above described heat treatment system 1010, the wafer transfer mechanism 1040 is moved on the horizontal plane, not above the boat transfer mechanism 1036, to take shelter on the side face of the housing 1011, so that the wafer boat during the transfer does not interfere with the wafer transfer mechanism 1040. In addition, since the wafer transfer mechanism 1040 at the lower position takes shelter on the same plane as that of the elevator mechanism, the influence of heat from the heat treatment furnace can be very small, so that the heat treatment system can be stably operated for a long term.

When the wafer transfer mechanism 1040 is moved from the motion space region to the sheltered position, the transfer head 1043 of the wafer transfer mechanism 1040 is moved on the horizontal plane along the outer peripheral edge of the mounting table 1032B of the boat elevator mechanism 1030 at the lowest position, i.e., through an arc-shaped passage which is curved in the opposite direction to the locus L of the rotation center shaft 1431 of the transfer head 1043. Therefore, the space required for the sheltered motion of the wafer transfer mechanism 1040 can be reduced. In addition, in the loading area Sb, the boat mounting portion 1035 and the boat elevator mechanism 1030 can be arranged at a high spatial utilization factor. For example, the distance between the carrier mounting portion 1021 and the boat elevator mechanism 1030 can be smaller than the conventional distance by about 20 to 30%. Therefore, it is possible to miniaturize the whole system while maintaining a high throughput.

An example of dimensions in the above described vertical heat treatment system 1010 will be described below. At the reference position (sheltered motion starting position) in the motion space region for the wafer transfer mechanism 1040, the rotational angle $\alpha$ of the swivel arm 1042 with respect to the side wall face of the housing 1011 is 64.5°, the rotational angle $\beta$ of the transfer head 1043 with respect to the center shaft of the swivel arm 1042 in longitudinal directions is 39.5°, the overall length of the stretching mechanism 1045 is 247.6 mm (see FIG. 13(a)), and the overall length of the stretching mechanism 1045 is 198.5 mm when the wafer transfer mechanism 1040 is positioned at its sheltered position.

While the preferred embodiment of the present invention has been described above, the operation of the present invention should not be limited to the above described operation. For example, the object to be treated may be transferred from the carrier on the carrier mounting portion directly to the wafer boat on the mounting table in the boat elevator mechanism. This is particularly useful when a small number of various objects to be treated are treated.

While the heat treatment in one wafer boat is carried out, when the transfer of the semiconductor wafers with respect to the other wafer boat on the first transfer portion is completed, the transfer of the wafer boat from the first mounting portion to the second mounting portion may be previously carried out by means of the boat transfer mechanism.

In the transfer head driving means, the driven pulley of one transmission mechanism rotated by the rotation of the swivel arm may be integrally formed with the driven pulley of the other belt transmission mechanism to which the transfer head is connected.

The objects treated in the vertical heat treatment system according to the present invention should not be limited to semiconductor wafers. For example, the vertical heat treatment system according to the present invention is suitably used for heat-treating glass wafers or ceramic wafers.

According to the vertical heat treatment system of the second invention, the treating-object transfer mechanism is caused to take shelter on one side face of the housing when the holder is transferred. Therefore, the holder does not interfere with the treating-object transfer mechanism during the transfer of the holder. In addition, since the lifting mechanism takes shelter on the same plane when the lifting mechanism is positioned at its lower position, the influence of heat from the heat treatment furnace or the like can be very small, and the system can be stably operated for a long term.

In addition, since the transfer head of the treating-object transfer mechanism is moved along the outer peripheral edge of the holder supporting face of the lifting mechanism, the holder mounting portions and so forth can be arranged in the loading area while the space required for the sheltered motion is very small. Therefore, it is possible to miniaturize the whole system while maintaining the high throughput.

According to the method for controlling the vertical heat treatment system according to the second invention, it is possible to surely prevent the holder from interfering with the treating-object transfer mechanism during the transfer of the holder, and the influence of heat from the heat treatment furnace and so forth can be very small, so that it is possible to stably operate the vertical heat treatment system.

Moreover, since the transfer head of the treating-object transfer mechanism can be caused to take shelter in a relatively small space, the holder mounting portion and so forth can be arranged at a high spatial utilization factor, so that it is possible to miniaturize the whole system while maintaining the high throughput.

Referring to the accompanying drawings, the third invention will be described below in detail.

First Preferred Embodiment (Schematic Construction of Whole Heat Treatment System)

Referring to the accompanying drawings, the preferred embodiment of the third invention will be described below in detail.

Figure 15:
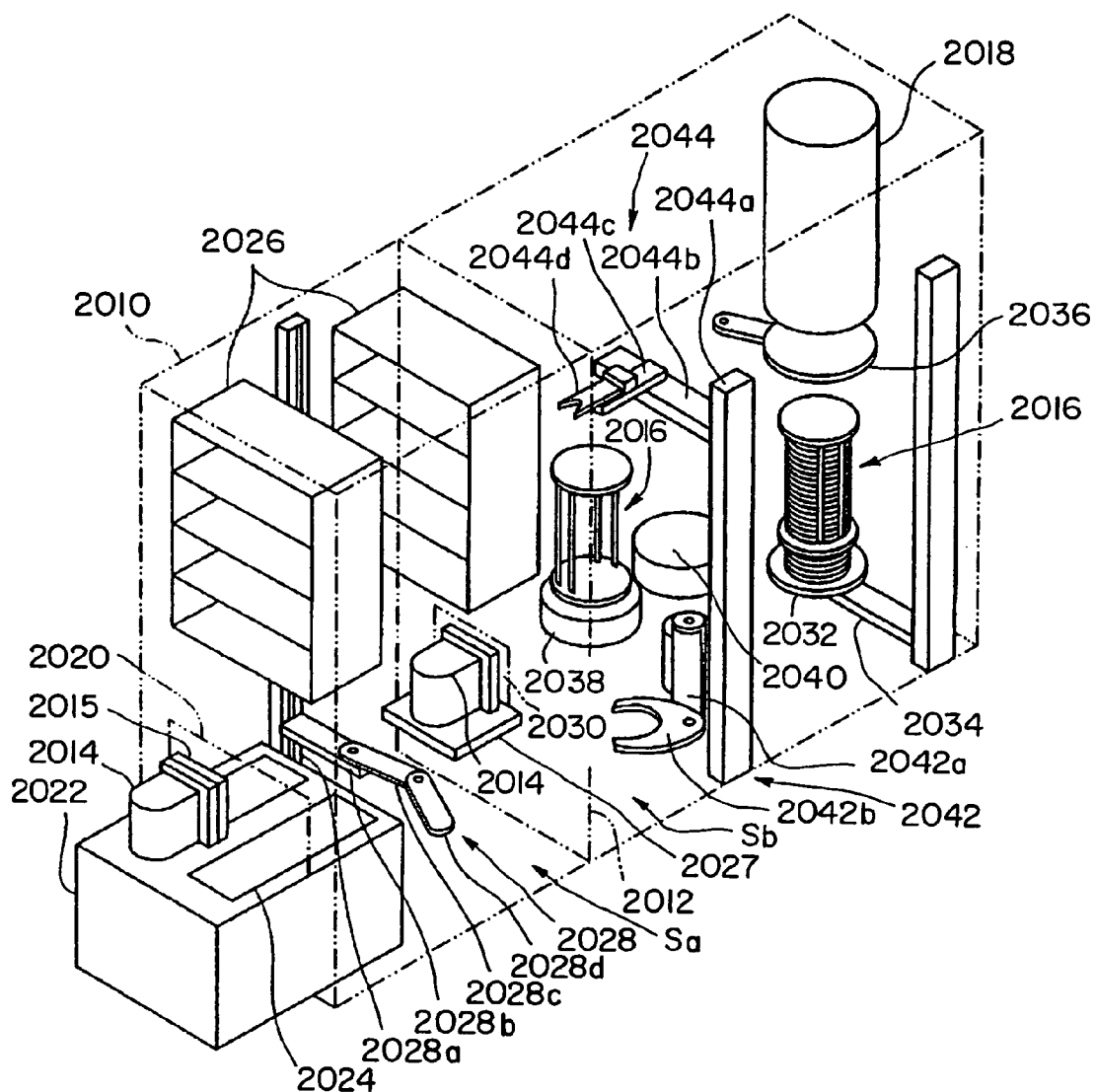
FIG. 15 is a perspective view showing the whole construction of a heat treatment system according to the third invention.

FIG. 15 is a schematic perspective view of a vertical heat treatment system according to the third invention.

As shown in FIG. 15, a housing 2010 defining the contour of a vertical heat treatment system is separated by a partition wall 2012 into a carrier transfer area Sa and a loading area Sb.

In the carrier transfer area Sa, the carrying-in/out, storage and so forth of a carrier, in which semiconductor wafers W (which will be hereinafter referred to as wafers W) serving as objects to be treated (which will be also hereinafter referred as substrates to be treated) have been housed, are carried out. In the loading area Sb, the transfer of the wafers W from the interior of the carrier 2014 to a holder (which will be also hereinafter referred to as a boat) 2016, and the carrying of the holder 2016 in and out of a heat treatment furnace 2018, and so forth are carried out.

Clean air is supplied to the carrier transfer area Sa via a filter (not shown), so that the carrier transfer area Sa is maintained in an atmosphere of atmospheric air. Clean air or an inert gas, e.g., nitrogen gas, is supplied to the loading area Sb, so that the loading area Sb is maintained in an atmosphere of atmospheric air or an atmosphere of the inert gas.

The carrier 2014 is a so-called closed type carrier, which houses therein a plurality of wafers W and which is closed by an FIMS (Front-opening Interface Mechanical Standard) door 2015. Specifically, the carrier 2014 is a portable plastic vessel capable of housing therein a plurality of, e.g., about 13 to 25, semiconductor wafers having a predetermined diameter, e.g., a diameter of 300 mm, in a horizontal state on multiple stages at regular intervals in vertical directions, and the FIMS door 2015 is detachably provided for airtightly closing a wafer outlet which is formed in the front face of the vessel.

The front face portion of the housing 2010 is provided with a carrier carrying-in/out opening 2020 for carrying the carrier 2014 in and out by means of an operator or a transfer robot. The carrier carrying-in/out opening 2020 is provided with a load port 2022 for carrying the carrier 2014 in or out of the carrier transfer area Sa. By means of a transfer mechanism 2024 provided on the load port 2022, the carrier 2014 is moved on the load port 2022 to be transferred to the interior of the carrier transfer area Sa.

In the carrier transfer area Sa, shelf-like storage portions 2026 for storing a plurality of carriers 2014 are provided above the load port 2022 and above the side of the partition wall 2012.

On the side of the partition wall 2012 in the carrier transfer area Sa, a carrier mounting portion (which will be also hereinafter referred to as an FIMS port) 2027 is provided for supporting thereon the carrier 2014 to transfer the wafers. In the carrier transfer area Sa, a carrier transfer mechanism 2028 is provided for transferring the carrier 2014 between the load port 2022, the storage portion 2026 and the carrier mounting portion 2027.

The carrier transfer mechanism 2028 comprises: a lifting arm 2028b which is vertically moved by a lifting mechanism 2028a provided on one side portion of the carrier transfer area Sa; an arm 2028c which is provided on the lifting arm 2028b; and a transfer arm 2028d which is provided on the arm 2028c for supporting thereon the bottom of the carrier 2014 to transfer the carrier 2014.

The partition wall 2012 is provided with a door 2030 which is formed so as to have a shape corresponding to the wafer outlet of the carrier 2014 and which is capable of being open and closed. By opening the door 2030, while the carrier 2014 contacts the door 2030, the wafers W in the carrier 2014 can be taken in and out of the loading area Sb.

On the other hand, above the inside of the loading area Sb, a lid 2032 is provided so as to be capable of being vertically moved by a lifting mechanism (which will be also hereinafter referred to as a boat elevator) 2034. The lid 2032 can support thereon the holder 2016 of, e.g., quartz, which holds a plurality of, e.g., about 100 to 150, wafers W on multiple stages at regular intervals in vertical directions. By vertically moving the lid 2032 by means of the lifting mechanism 2024, the holder 2016 holding the wafers W can be carried in and out of the heat treatment chamber of the heat treatment furnace 2018. In the vicinity of the throat of the heat treatment furnace 2018, there is provided a shutter 2026 which is capable of being open and closed in horizontal directions for closing the throat when the lid 2032 is moved downwards and when the holder 2016 is carried out after the heat treatment.

In one side portion of the loading area Sb, a first holder mounting portion (which will be also hereinafter referred to as a holding supporting mechanism or a boat stage) 2028 is provided for supporting thereon the holder 2016 in order to transfer the wafers W. Behind the first holder mounting portion 2038, a second holder mounting portion (which will be also hereinafter referred to as a standby stage) 2040 is provided for supporting thereon the holder 2016 which holds the wafers W serving as the objects to be treated.

Between the carrier transfer portion 2027 and the heat treatment furnace 2018 in the lower portion in the loading area Sb, a holder transfer mechanism 2042 is provided for transferring the holder 2016 between the first holder mounting portion 2023, the second holder mounting portion 2040 and the lid 2017.

The holder transfer mechanism 2042 comprises a first arm 2042a capable of being rotated in horizontal directions and moved in vertical directions, and a supporting arm 2042b which is supported on the tip portion of the first arm 2014a so as to be rotatable in horizontal directions and which is capable of supporting the holder 2016 in vertical directions, the supporting arm 2042b having a substantially C-shaped opening.

Above the holder transfer mechanism 2042, a transfer mechanism 2044 is provided for transferring the wafers W between the carrier 2014 on the carrier transfer portion 2027 and the holder 2016 on the first holder mounting portion 2038. The transfer mechanism 2044 comprises a lifting mechanism 2044a, a first arm 2044b which is connected to the lifting mechanism 2044a and which is rotatable in horizontal directions, a second arm 2044c which is connected to the first arm 2044b and which is rotatable in horizontal directions, and a supporting arm 2044d which is provided on the second arm 2044c and which is retractable. The supporting arm 2044d comprises a plurality of, e.g., two to five, fork-shaped thin plates, and is movable while supporting thereon the wafers W.

The procedure for heat-treating wafers W in the vertical heat treatment system with this construction will be described below.

After the carrier 2014 is supported on the load port 2022, the transfer mechanism 2024 transfers the carrier 2014 to the carrier transfer area Sa via the carrier carrying-in/out opening 2020. Then, the carrier 2014 on the load port 2022 in the carrier transfer area Sa is transferred to the storage portion 2026 by means of the carrier transfer mechanism 2028. Moreover, the carrier 2014 in the storage portion 2026 is transferred to the carrier mounting portion 2027 by means of the carrier transfer mechanism 2028.

If the FIMS door 2015 of the carrier 2014 on the carrier mounting portion 2027 and the door 2030 of the partition wall 2012 are open, the transfer mechanism 2044 takes the semiconductor wafers W out of the carrier 2014 to sequentially transfer the wafers W to an empty holder 2016 which stands by on the first holder mounting portion 2038.

By the holder transfer mechanism 2024, the holder 2016 holding the wafers W is transferred to the top face of the lid 2032 from the first holder mounting portion 2038, via the second holder mounting portion 2040 if necessary. The holder 2016 on the lid 2032 holding the wafers W are housed in the heat treatment chamber of the heat treatment furnace 2018 by means of the lifting mechanism 2034, and a heat treatment is carried out therein. Furthermore, when the lid 2032 moves in vertical directions, the shutter 2036 is caused to take shelter.

After the heat treatment is completed, the lid 2032 is moved downwards by means of the lifting mechanism 2034, and the holder 2016 is carried out of the heat treatment chamber of the heat treatment furnace 2018 to be transferred to the loading area Sb. The holder 2016 which is carried out of the heat treatment chamber of the heat treatment furnace 2018 and which holds the heat-treated wafers W is transferred from the top face of the lid 2032 to the top face of the first holder mounting portion 2038. The wafers W are moved from the holder 2016, which is arranged on the first holder mounting portion 2038, to the carrier 2014, which is arranged on the carrier mounting portion 2017, by means of the transfer mechanism 2044.

The carrier 2014 housing therein the heat-treated wafers W is mounted on the load port 2022 by means of the carrier transfer mechanism 2028, and is carried out of the carrier carrying-in/out opening 2020 by means of the transfer mechanism 2024.

(Details of First Holder Mounting Portion)

Figure 16:
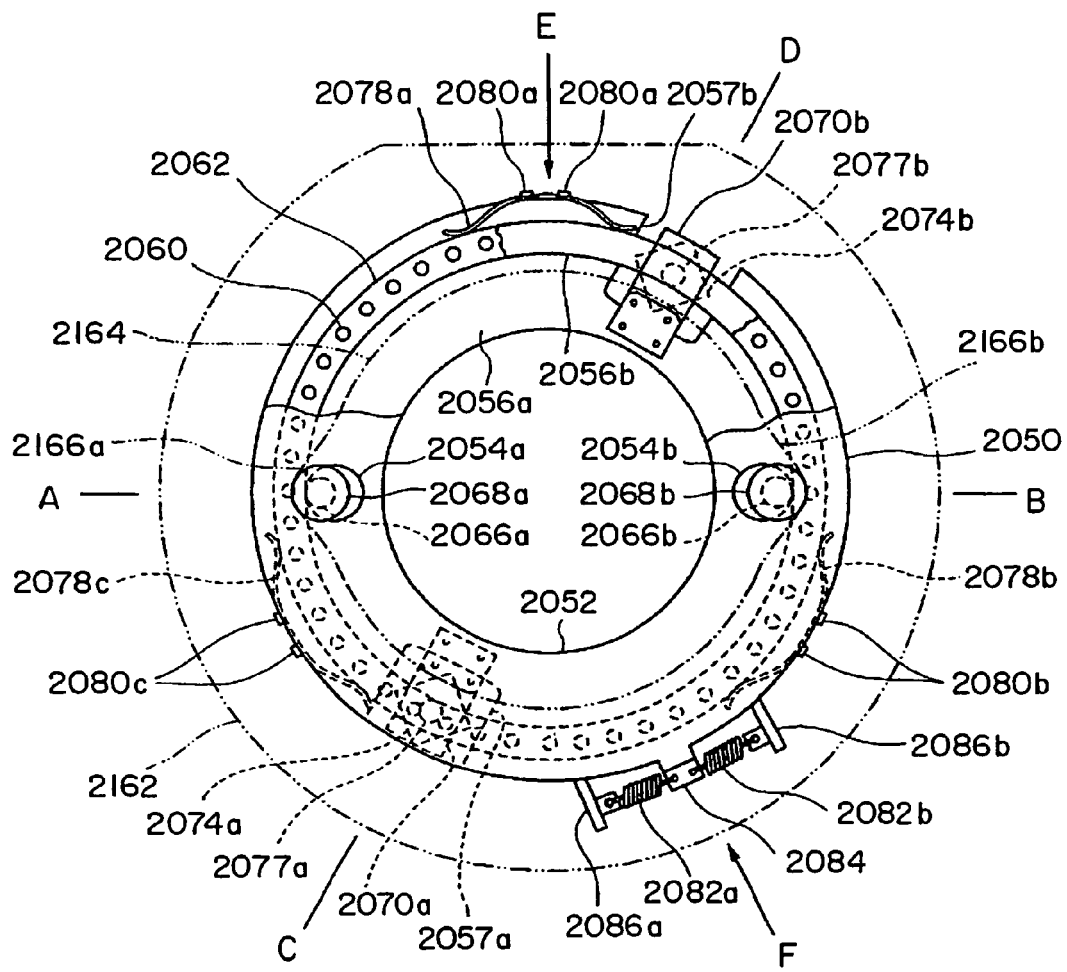
FIG. 16 is a partially sectional view of a first holder mounting portion (boat stage) shown in FIG. 15, which is viewed from the top.
Figure 17:
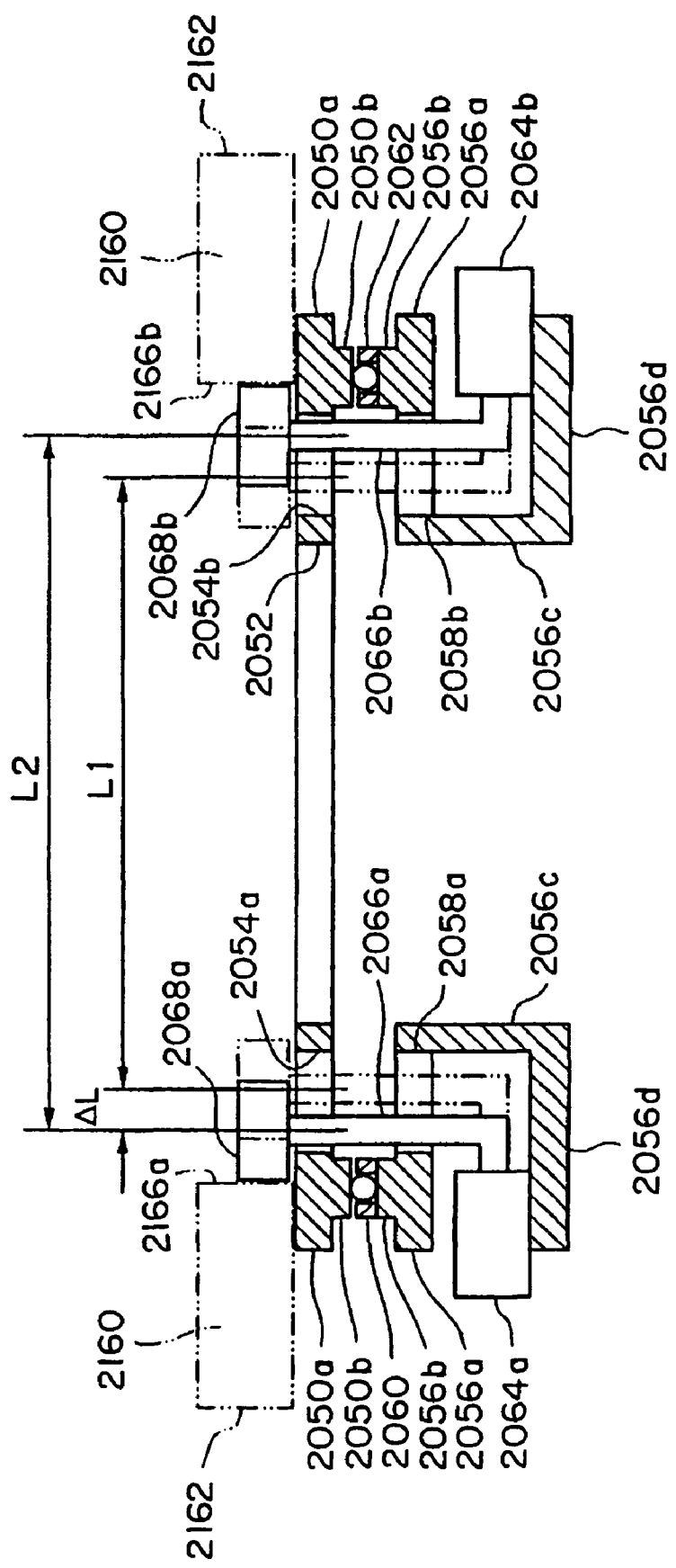
FIG. 17 is a partially sectional view of the first holder mounting portion taken along line A-B of FIG. 15.
Figure 18:
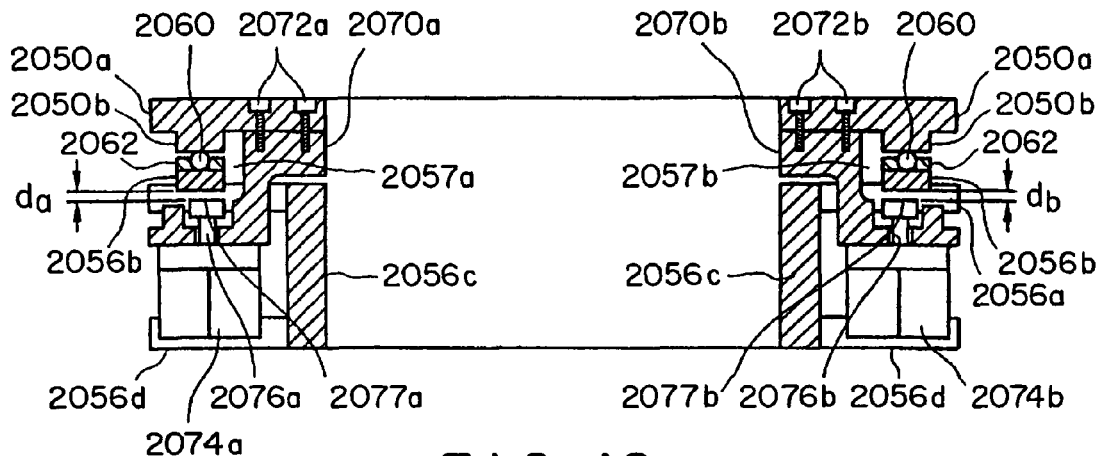
FIG. 18 is a partially sectional view of the first holder mounting portion taken along line C-D of FIG. 15.
Figure 19:
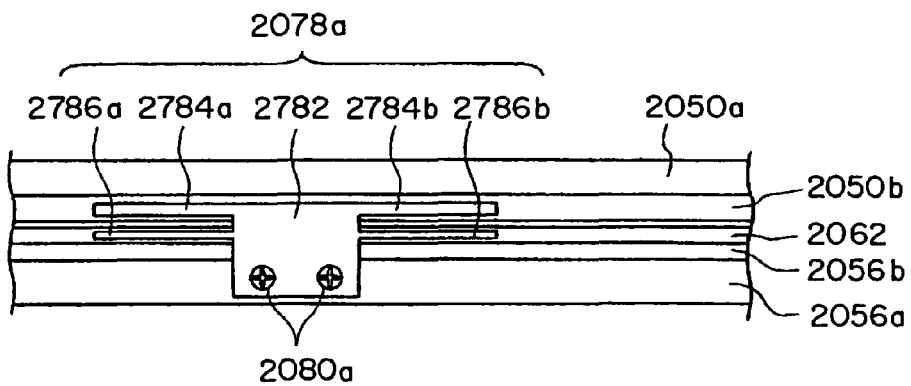
FIG. 19 is a side view of the first holder mounting portion viewed in the direction of arrow E of FIG. 15.
Figure 20:
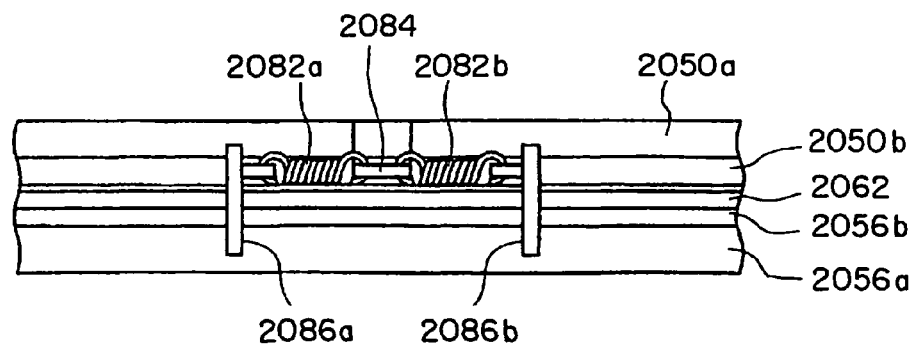
FIG. 20 is a side view of the first holder mounting portion viewed in the direction of arrow F of FIG. 15.

The first holder mounting portion (boat stage) 2038 will be described below in detail. FIG. 16 is a partially sectional view of the first holder mounting portion 2038 viewed from the top. FIGS. 17 and 18 are partially sectional views of the first holder mounting portion 2038 taken along lines A-B and C-D of FIG. 15, respectively. FIGS. 19 and 20 are side views of the first holder mounting portion 2038 viewed in the directions of arrows E and F of FIG. 15, respectively.

In FIGS. 17 and 18, a holder bottom plate 2160 of the holder 2016 is shown by a two-dot chain line. The holder bottom plate 2160 has a flat ring shape having a circular outer periphery 2162, a part of which is cut by a straight line, and a substantially circular opening portion (inner periphery) 2164 which is concentric with the outer periphery 2162. The opening portion 2164 has a pair of cut-outs 166a and 166b in the vicinity of both ends in radial directions. Each of the cut-outs 166a and 166b has a substantially isosceles triangular shape which is symmetrical with respect to the center of the opening portion 2164, and the vertex thereof is rounded.

The first holder mounting portion 2038 comprises a holder mounting table 2050 for mainly supporting thereon the holder 2016, a base 2056 fixed to the heat treatment system, and a ball retainer 2062 for retaining a spherical ball 2060 which is arranged between the holder mounting table 2050 and the base 2056. On the holder mounting table 2050, a pair of substantially cylindrical protruding portions 2068a and 2068b are arranged for positioning the holder 2016. The holder mounting table 2050 comprises a disk-shaped holder mounting table body 2050a, and a narrow flat ring-shaped top rail portion 2050b which is substantially concentric with the holder mounting table body 2050a and which has an outer periphery having a slightly smaller diameter than that of the holder mounting table body 2050a.

The holder mounting table body 2050a is formed with a circuit opening portion 2052 which is substantially concentric with the holder mounting table body 2050a, and a pair of circular opening portions 2054a and 2054b which correspond to the protruding portions 2068a and 2068b and which are symmetrical with each other with respect to the center of the holder mounting table body 2050a.

The base 2056 comprises a flat ring-shaped base top plate 2056a which substantially corresponds to the holder mounting table body 2050a, a flat ring-shaped bottom rail portion 2056b which is arranged on the top face of the base top plate 2056a and which substantially corresponds to the top rail portion 2050b, a substantially cylindrical connecting portion 2056c which is connected to the lower portion of the base top plate 2056a, and a flat ring-shaped base bottom plate 2056d which is connected to the connecting portion 2056c. The base top plate 2056a is formed with a pair of substantially circular opening portions 2058a and 2058b, the positions and shapes of which correspond to those of the opening portions 2054a and 2054b of the holder mounting table 2050, respectively.

The base top plate 2056a is formed with a pair of substantially rectangular opening portions 2057a and 2057b on its outer periphery on both ends in radial directions. Furthermore, the ball retainer 2062 and the bottom rail portion 2056b are formed continuously even in the opening portions 2057a and 2057b.

The ball retainer 2062 has a flat ring shape which substantially corresponds to the top rail portion 2050b and the bottom rail portion 2056b. The thickness of the ball retainer 2062 is smaller than the diameter of the ball 2060. The ball retainer 20623 is formed with a circular opening portion which has a slightly greater diameter than the diameter of the ball 2060, and the ball 2060 is retained in this opening portion.

The ball 2060 retained in the ball retainer 2062 rotates between the top rail portion 2050b and the bottom rail portion 2056b. Therefore, friction during sliding motion between the top rail portion 2050b and the bottom rail portion 2056b is reduced by the ball 2060.

That is, according to the third invention, the combination of the ball 2060 with the ball retainer 2062 for retaining the same functions as a sliding mechanism for facilitating motion along the principal plane of the holder mounting table 2050 (the top or bottom face of the holder mounting table body 2050a) between the holder mounting table 2050 and the base 2056. Furthermore, this motion may include rotational motion about an axis perpendicular to the principal part of the holder mounting table 2050.

The protruding portions 2068a and 2068b are connected to shafts 2066a and 2066b, respectively, which are connected to air cylinders 2068a and 2068b, respectively, which are provided on the base bottom plate 2056d. The shafts 2066a and 2066b have an L shape, and pass through the opening portions 2058a and 2054b of the base 2056 and the opening portions 2054a and 2054b of the holder mounting table 2050, respectively.

Air or nitogen gas is supplied to each of the air cylinders 2064a and 2064b (gas piping is not shown), so that the shafts 2066a and 2066b can be pushed out or pulled back toward the center of the base 2056 by their gas pressures, respectively. If the shafts 2066a and 2066b are pushed out or pulled back, the protruding portions 2068a and 2068b move so as to approach or leave the center of the base 2056, respectively.

In FIGS. 16 and 17, the solid line shows the state that the gas pressures in the air cylinders 2064a and 2064b are reduced to pull both of the shafts 2066a and 2066b back.

By the operation of the air cylinders 2064a and 2064b, the distance between the centers of the protruding portions 2068a and 2068b varies between the maximum value L2 and the minimum value L1. Furthermore, at this time, the relationship between the stroke ΔL of the air cylinders 2064a, 2064b and the maximum value L2 and the minimum value L1 of the distance between the protruding portions 2068a and 2068b is L2=L1+2ΔL.

If the distance between the protruding portions 2068a and 2068b is increased, the protruding portions 2068a and 2068b enter (engage) the cut-outs 166a and 166b, which are provided in the holder bottom plate 2160, respectively, to stop in the vicinity of the vertexes of the cut-outs 166a and 166b respectively.

At this time, if the holder 2016 is positioned at a predetermined position and in a predetermined direction on the base 2056 (at the center of the base 2056 and in a direction in which the cut-outs 166a and 166b correspond to the protruding portions 2068a and 2068b), the relationships between the positions and directions of the holder 2016 and the base 2056 is maintained.

On the other hand, if the arrangement of the holder 2016 is shifted from this predetermined arrangement, the holder 2016 moves in accordance with the movement of the protruding portions 2068a and 2068b, so that the position and direction of the holder 2016 with respect to the base 2056 vary. That is, the holder 2016 moves on the base 2056, so that its position is adjusted to a predetermined position. That is, the protruding portions 2068a and 2068b function as a holder position adjusting mechanism for adjusting the position of the holder 2016 on the basis of the correspondence to the cut-outs formed in the holder bottom plate 2160.

Since the ball retained in the ball retainer 2062 functions as a sliding mechanism when the position of the holder is adjusted, the holder mounting table 2050 can move with the holder 2016. As a result, the force of the air cylinders 2064a and 2064b is not so great, the position of the holder 2016 can be easily adjusted.

A pair of air cylinder holders 2070a and 2070b are mounted on the bottom face of the holder mounting table 2050 by means of screws 2072a and 2072b so as to correspond to the opening portions 2057a and 2057b of the base 2056, respectively. The air cylinder holders 2070a and 2070b hold the air cylinders 2074a and 2074b, respectively.

As a result, the air cylinders 2074a and 2074b are arranged in the opening portions 2057a and 2057b of the base 2056 so as to correspond to the bottom rail portion 2056b, respectively. Shafts 2076a and 2076b protrude from the air cylinders 2074a and 2074b, respectively, and substantially cylindrical moving pieces 2077a and 2077b are formed on the tips of the shafts 2076a and 2076b, respectively.

The moving pieces 2077a and 2077b are formed of an elastic material of rubber or the like. The shafts 2076a and 2076b extend in a direction perpendicular to the principal plane of the base 2056, and the moving pieces 2077a and 2077b face the bottom rail portion 2056b at small distances da and db, respectively. Air or nitrogen gas is supplied to the air cylinders 2074a and 2074b (gas piping is not shown), so that the moving pieces 2077a and 2077b connected to the shafts 2076a and 2076b can be pushed against or pulled back from the bottom rail portion 2056b by the gas pressure (the distances da and db vary).

By pushing the moving pieces 2077a and 2077b against the bottom rail portion 2056b, the holder mounting table 2050 can be stopped on the base 2056. This is based on the fact that the air cylinders 2074a and 2074b, to which the moving pieces 2077a and 2077b are connected, are fixed to the holder mounting table 2050, and on the other hand, the bottom rail portion 2056b constitutes a part of the base 2056. As described above, the air cylinders 2074a and 2074b having the moving pieces 2077a and 2077b function as a mounting table fixing mechanism for fixing the holder mounting table 2050 to the base 2056.

Three plate springs 2078a, 2078b and 2078c are mounted on the side face of the base 2056 by screws 2080a, 2080b and 2080c at substantially even intervals, respectively. The plate spring 2078 comprises a substantially rectangular fixing portion 2782, two pairs of elastic portions 2874a and 2784b formed on the fixing portion 2782, and elastic portions 2786a and 2786b. The elastic portions 2784a and 2784b contact the side face of the top rail portion 2050b in the vicinity of their end portions, and the elastic portions 2786a and 2786b contact the side face of the ball retainer 2062 in the vicinity of their end portions, so that a biasing force is applied toward the center of the base 2056.

That is, the elastic portions 2784a and 2784b function as biasing means for applying a biasing force to the holder mounting table 2050 toward the center of the base 2056, and the elastic portions 2786a and 2786b function as biasing means for applying a biasing force to the sliding mechanism (the ball 2060 and the ball retainer 2062) toward the center of the base 2056.

Finally, the three plate springs 2078a, 2078b and 2078c function as biasing means for applying a biasing force to both of the sliding mechanism and the holder mounting table 2050 toward the center of the base 2056 from three directions.

That is, the three plate plates 2078a, 2078b and 2078c function as a mounting table position returning mechanism for returning the position of the holder mounting table 2050 to a predetermined position (the center of the base 2056) and a sliding mechanism returning mechanism for returning the sliding mechanism to a predetermined position (the center of the base 2056).

Between the holder mounting table 2050 and the base 2056, a pair of helical springs 2082a and 2082b are provided. The both ends of the helical springs 2082a and 2082b are connected to a substantially L-shaped first spring fixture 2084, which is mounted on the outer periphery of the holder mounting table body 2050a, and a pair of second spring fixtures 2086a and 2086b which are connected to the base top plate 2056a so as to surround the tip of the first spring fixture 2084.

The helical springs 2082a and 2082b extend along the outer periphery of the base 2056 to connect the holder mounting table 2050 to the base 2056. Therefore, when the holder mounting table 2050 is rotated with respect to the base 2056, a biasing force is applied so as to inversely rotate the holder mounting table 2050 with respect to the base 2056.

That is, the helical springs 2082a and 2082b function as a mounting table angle returning mechanism for intending to return the relative angle of the holder mounting table 2050 with respect to the base 2056 to the angle before rotation. As a result, in corporation with the mounting table position returning mechanism, for example, the positional relationship between the opening portions 2054a, 2054b of the holder mounting table 2050 and the shafts 2066a, 2066b, and the positional relationship between the air cylinders 2074a, 2074b and the opening portions 2057a, 2057b of the base 2056 are always maintained in appropriate states.

(Conceptual Explanation of First Holder Mounting Portion)

Figure 21A:
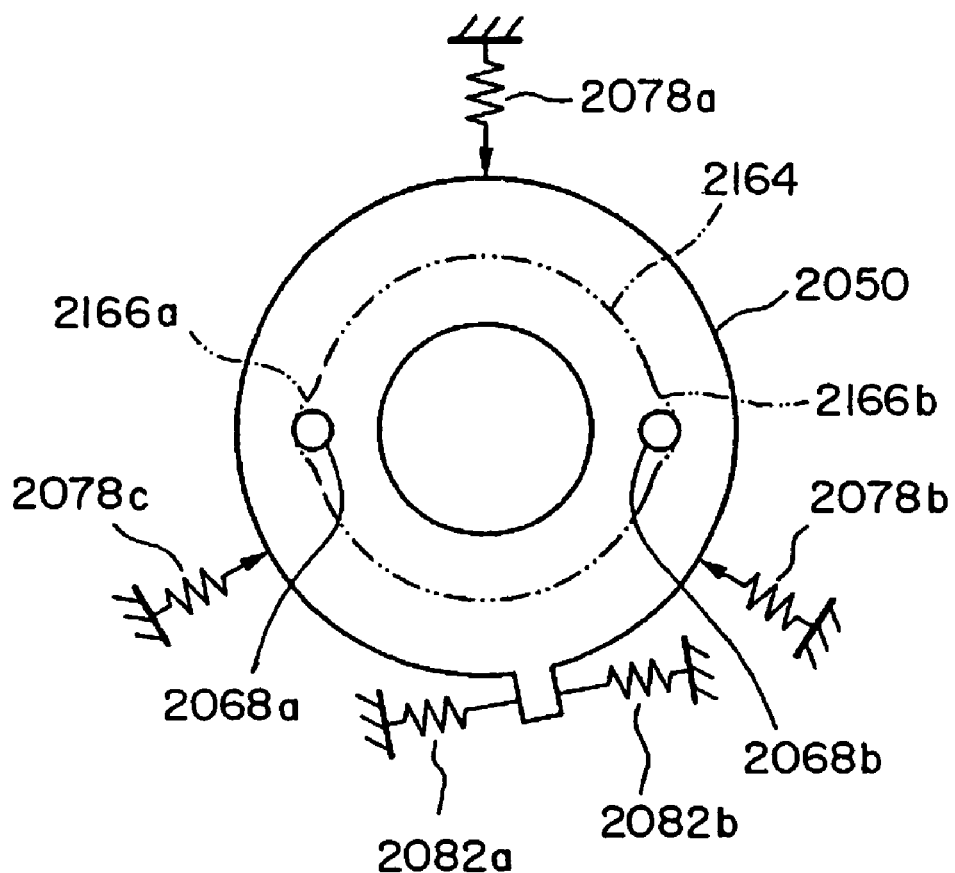
FIG. 21 is a conceptual view showing the construction of the first holder mounting portion.
Figure 21B:
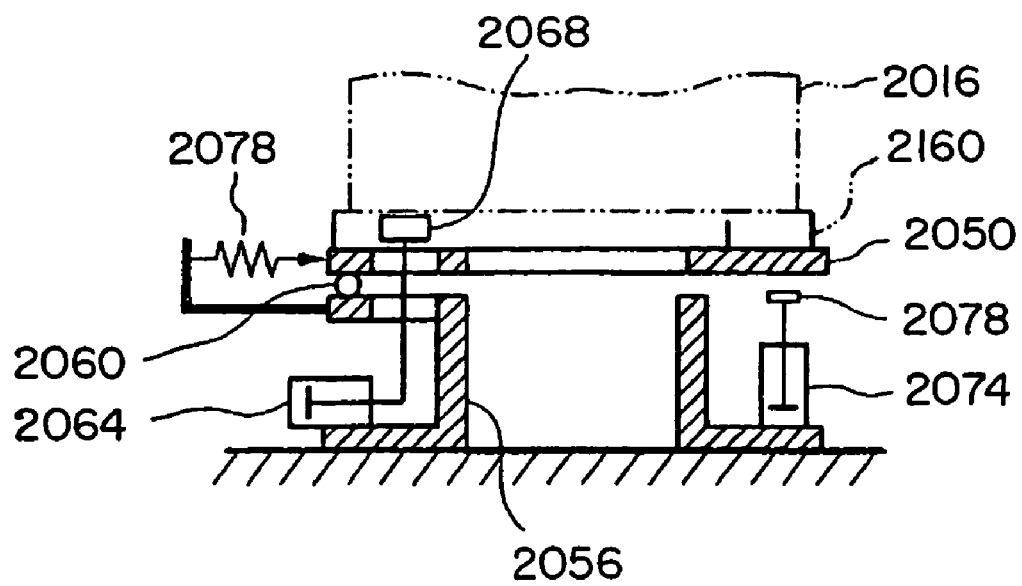

FIG. 21 is a conceptual view simply showing the construction of the first holder mounting portion (boat stage) 2038 shown in FIGS. 16 through 20. FIGS. 21A and 21B are top (corresponding to FIG. 16) and partially sectional (corresponding to FIGS. 17 through 19) views of the first holder mounting portion 2038, respectively. The left half of FIG. 21B mainly corresponds to FIG. 17, and the right half of FIG. 21B substantially corresponds to FIG. 18.

Between the holder mounting table 2050 and the base 2056, the ball 2060 serving as the sliding mechanism allows movement along the principal plane of the holder mounting table 2050 and rotation with respect to an axis perpendicular to the principal plane.

The pair of protruding portions 2068a and 2068b serving as the holder position adjusting mechanism are arranged so as to be symmetrical with respect to the center of the base 2056 on the opening portion on the holder mounting table. The distance between the protruding portions 2068a and 2068b can be changed by the air cylinders 2064a and 2064b. The protruding portions 2086a and 2086b enter the pair of cut-outs 166a and 166b, which are formed in the opening portion 2164 of the holder bottom plate 2160, to adjust the position of the holder 2016.

The moving piece 2077 of the air cylinder 2074 functions as a mounting table fixing mechanism for fixing the holder mounting table 2050 to the base 2056. In FIG. 18, the air cylinder 2074 is connected to the holder mounting table 2050, whereas in FIG. 21, the air cylinder 2074 is fixed to the base 2056. The difference between FIGS. 18 and 21 is based on the fact that the former regards space saving as important and the latter regards facilitation of understanding as important. Even if the air cylinder 2074 is fixed to any one of the holder mounting table 2050 and the base 2056, the moving piece 2077 blocks the relative movement between the holder mounting table 2050 and the base 2056.

Each of the three springs 2078a, 2078b and 2078c functions as a biasing means for applying a biasing force to the holder mounting table 2050 in three directions toward the center of the base 2056. These three plate springs 2078a, 2078b and 20768c function as a mounting table position returning mechanism for returning the position of the holder mounting table, as a whole.

The pair of springs 2082a and 2082b function as a mounting table angle returning mechanism for returning the angular relationship between the holder mounting table and the base 2056.

(Procedure for Transferring Objects to Holder)

The procedure for transferring wafers W to the holder 2016 on the first holder mounting portion (boat stage) will be described below in detail. FIGS. 22 through 27 are schematic diagrams showing the state of the first holder mounting portion in this procedure, and FIG. 28 is a flow chart showing the transfer procedure.

(1) The holder mounting table 2050 (FIG. 22), on which the holder 2016 has not been mounted, is mounted on the holder 2016 (step S10 and FIG. 23).

The mounting of the holder 2016 on the holder mounting table 2050 is carried out by the above described holder transfer mechanism 2042 (see FIG. 15). At this time, there is some possibility that the center C2 of the mounted holder 2016 may be shifted from the center (reference position of holder to be transferred) C1 of the base 2056, so that the center C1 of the base 2056 may not be coincident with the center C2 of the holder 2016.

Furthermore, before the transfer of the holder 2016, it is assumed that the holder position adjusting mechanism (the protruding portion 2068 and the air cylinder 2064) and the mounting table fixing mechanism (the moving piece 2077 and the air cylinder 2074) remain being released.

Figure 24:
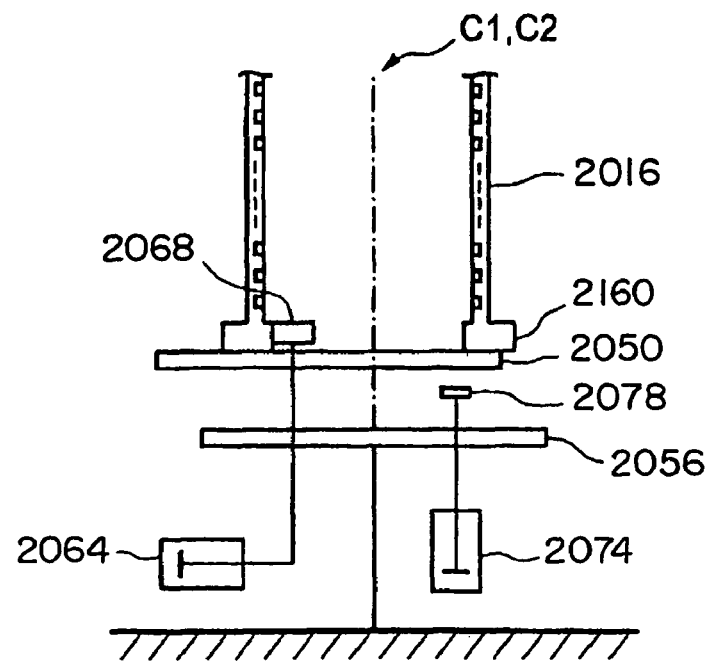
FIG. 24 is a schematic diagram showing the first holder mounting portion when the position of the holder is adjusted.

(2) The position of the holder is adjusted by the holder position adjusting mechanism (the protruding portion 2068 and the air cylinder 2064) (step S11 and FIG. 24).

The pair of protruding portions 2068 are moved so as to increase the distance therebetween. Although the pair of protruding portions 2068 may be moved at different times, the pair of protruding portions 2068 are preferably simultaneously moved in view of the operation time.

The pair of protruding portions 2068 enter the tips of the pair of cut-outs 166a and 166b, which are formed in the opening portion 2164 of the holder bottom plate 2160, respectively, so that the position of the holder 2016 is adjusted (engagement of the cut-outs 166 with the protruding portions 2068). For example, the tips of the cut-outs 166a and 166b are set to be symmetrical with respect to the center of the holder bottom plate 2160, and the pair of protruding portions 2068 are moved to positions, which are symmetrical with respect to the center of the base 2056, respectively, so that the center C1 of the holder 2016 can be coincident with the center C2 of the base 2056.

Since the holder mounting table 2050 can slide the base 2056 to move with the holder 2016, it is possible to quickly move the holder 2016 without any strong forces.

(3) The holder mounting table 2050 is fixed to the base 2056 by the mounting table fixing mechanism (the moving piece 2077 and the air cylinder 2074) (step S12).

This fixing is carried out by pushing the moving piece 2077 against the holder mounting table 2050 or the base 2056 by means of the air cylinder which is fixed to the holder mounting table 2050 or the base 2056.

This fixing step is carried out prior to step S13 in order to surely prevent the movement of the holder mounting table 2050 during the transfer of the wafers W at the next step S13.

If it is possible to prevent the movement of the holder 2016 by means of the protruding portions 2068 and the cut-outs 166, this fixing may be carried out immediately before the release of the adjustment of the position of the holder at a subsequent step S14. The reason why the fixing of the holder mounting table 2050 is carried out prior to step S14 is that it is required to prevent the movement of the holder mounting table 2050 during the release of the adjustment of the position of the holder.

Figure 25:
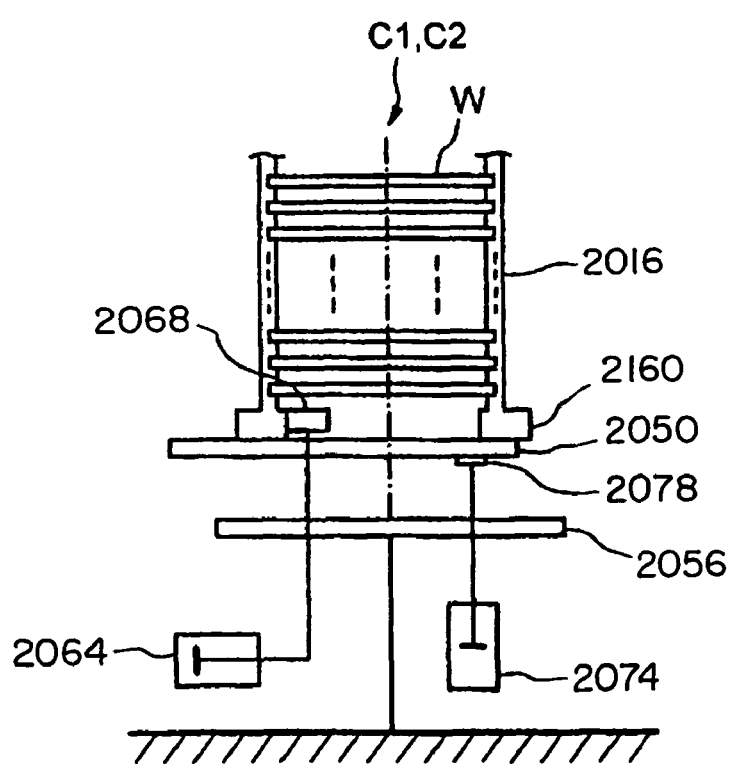
FIG. 25 is a schematic diagram showing the first holder mounting portion when it is fixed and when the holder to which wafers are transferred is mounted thereon.

(4) The wafers W are transferred to the holder 2016 which is mounted on the holder mounting table 2050 (step S13 and FIG. 25).

The wafers W serving as the objects to be treated are transferred and held so that their edge portions are inserted into the grooves which are formed in the support of the holder 2016. This transfer is carried out by means of the above described transfer mechanism 2044 (see FIG. 15).

Since the position of the holder 2016 has been adjusted at step S11 prior to this transfer, the wafers W serving as the objects to be treated can be precisely transferred to the holder 2016 (the control of the positional relationship between the wafers W and the holder 2016).

By precisely controlling the positions of the wafers W with respect to the holder 2016, it is possible to easily ensure the uniformity of the heat treatment on the wafers W. On the other hand, if the precision of the position of the installed holder 2016 is bad, it is considered that it is not only difficult to ensure the uniformity of the heat treatment on the wafers W, but it is also possible to insert the wafers W into the grooves of the support of the holder 2016.

(5) The holder position adjusting mechanism is released (step S14).

That is, the pair of protruding portions 2068 are moved toward the center of the base 2056 by the action of the air cylinder 2064, and the engagement with the holder bottom plate 2160 of the cut-outs 166 is released. At this time, the movement of the holder mounting table 2050 is blocked by the action of the mounting table fixing mechanism (the moving piece 2077 and the air cylinder 2074).

Figure 26:
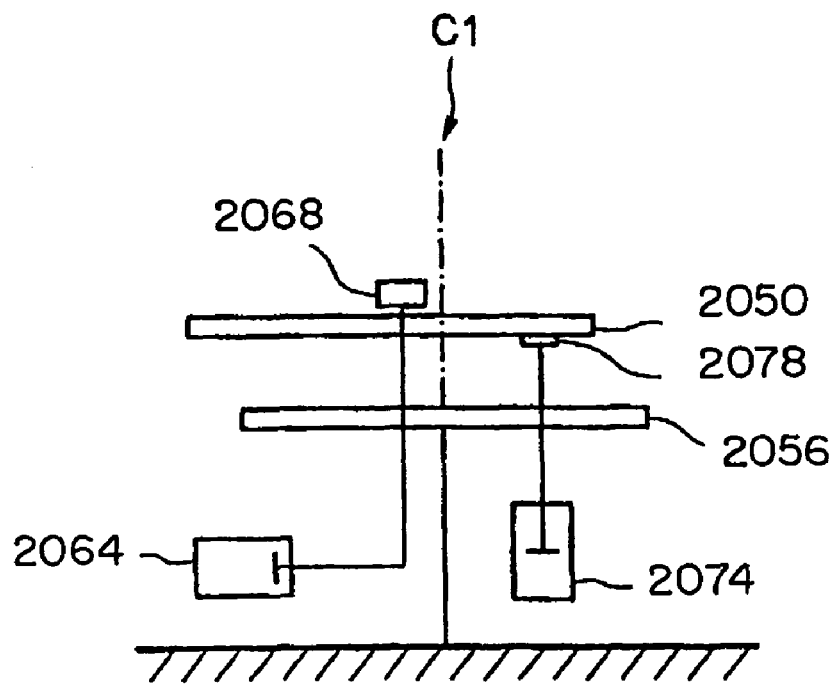
FIG. 26 is a schematic diagram showing the first holder mounting portion when the holder is removed.

(6) The holder 2016 is removed from the holder mounting table 2050 (step S15 and FIG. 26).

Also at this time similar to step S14, the movement of the holder mounting table 2050 is blocked by the action of the mounting table fixing mechanism (the moving piece 2077 and the air cylinder 2074).

(7) The mounting table fixing mechanism (the moving piece 2077 and the air cylinder 2074) is released to allow the holder mounting table 2050 to relatively move with respect to the base 2056 (step S16). That is, the moving piece 2077 does not contact the holder mounting table 2050 or the base 2056 by the action of the air cylinder 2074, so that the holder mounting table 2050 can be easily moved by the action of the sliding mechanism (the ball 2060).

Figure 27:
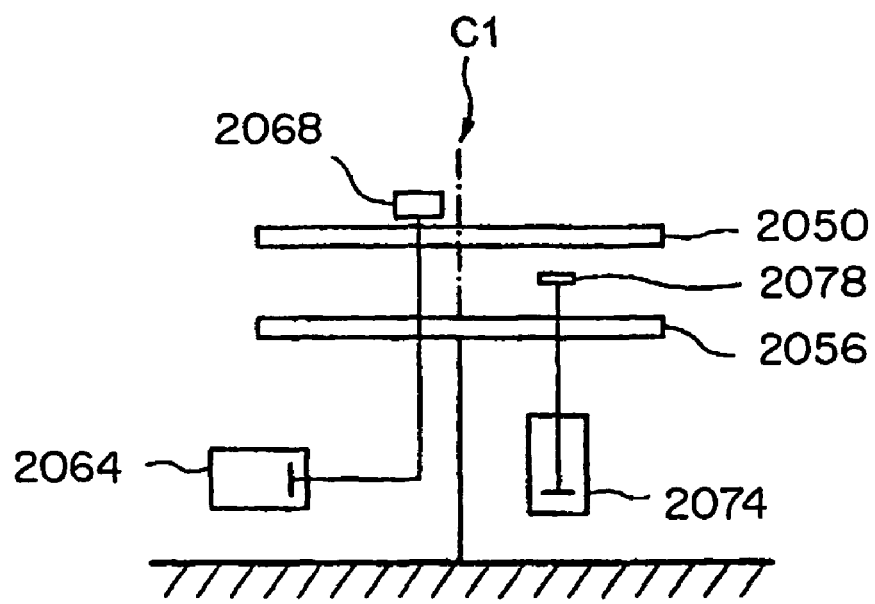
FIG. 27 is a schematic diagram showing the first holder mounting portion when the position of a holder mounting table returns.
Figure 28:
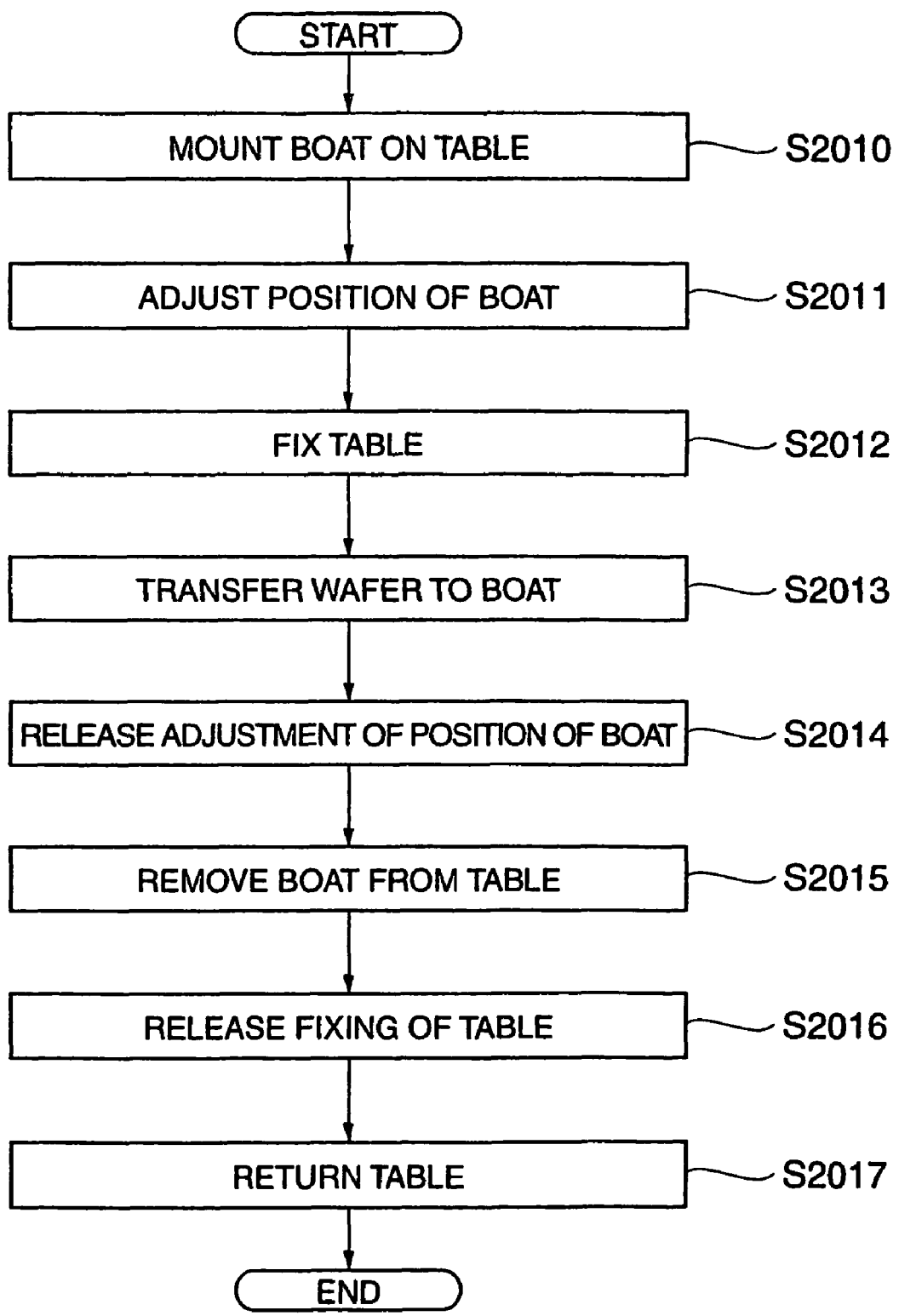
FIG. 28 is a flow chart showing the procedure for transferring an object to be treated, to the holder on the first holder transferring portion.

Thereafter, the center of the holder mounting table 2050 is coincident with the center C1 of the base 2056 by the action of the mounting table position returning mechanism (the springs 2078a, 2078b and 2078c) and the mounting table angle returning mechanism (the springs 2082a and 2082b), so that the state of the holder mounting table 2050 returns to the stage before the holder is mounted thereon (FIG. 15) (step S17 and FIG. 27).

Since the position of the holder mounting table 2050 before the mounting of the holder always returns to the same place, the amount of the movement of the holder mounting table 2050 with the adjustment of the position of the holder 2016 can be ensured at step S11.

On the other hand, if the position of the holder mounting table 2050 does not return, when the position of the holder 2016 mounted on the holder mounting table 2050 is shifted in the same direction as the last mounting of the holder, there is some possibility that the holder mounting table 2050 can not sufficiently be moved.

As described above, the holder mounting portion (boat stage) according to the present invention has the holder position adjusting mechanism for adjusting the position of the holder to a predetermined position, so that it is possible to precisely transfer and hold the objects to and in the holder.

Other Preferred Embodiments

The above described preferred embodiments can be extended and changed, and the extended and changed preferred embodiments should be included in the technical scope of the present invention.
(1) While the first holder mounting portion (boat stage) has been a part of the heat treatment system in the above described preferred embodiments, the first holder mounting portion may be separated from the heat treatment system. For example, the objects to be treated may be transferred to the holder in the holder mounting portion outside of the heat treatment system, and thereafter, the holder to which the objects to be treated have been completely transferred may be transferred to the heat treatment system to carry out a heat treatment therein.
(2) The sliding mechanism should not limited to the combination of the ball and the retainer for retaining the ball. For example, any means for reducing friction between the holder mounting table and the base, such as lubricant, may be used. In addition, the sliding mechanism may be fixed to any one of the holder mounting table and the base.
(3) The holder position adjusting mechanism should not be limited to the combination of the protruding portion and the air cylinder connected to the protruding portion. The means for moving the protruding portion should not be limited to the air cylinder. For example, an electric means, such as an electric motor, may be used.

The place of the cut-outs corresponding to the protruding portions should not be limited to the opening portion formed in the holder bottom plate. For example, the cut-outs may be formed in the outer peripheral portion of the holder bottom plate. In this case, the distance between the protruding portions decreases, so that the cut-outs engage the protruding portions.

The shapes of the protruding portions and the cut-outs of the holder mounting table should not be limited to the cylindrical shape and the substantially triangular shape, respectively, if the protruding portions can engage the cut-outs. For example, if recessed portions are provided in place of the protruding portions and if the holder is provided with protruding portion in place of the cut-outs, the position of the holder can be adjusted by the engagement of the recessed portions with the protruding portions.

In addition, the number of the protruding portions should not be limited to two. The numbers of the cut-outs and the corresponding protruding portions may be three or more, respectively. For example, if three protruding portions are arranged on a circumstance and if these protruding portions move so as to approach or leave the center of the circumstance, the protruding portions can engage the cut-outs.

Moreover, while both of the pair of protruding portions have been moved in the above described preferred embodiments, one of the protruding portions may be fixed and only the other protruding portion may be moved to adjust the position of the holder.
(4) The components of the mounting table position returning mechanism or mounting table angle returning mechanism should not be limited to the plate springs or the helical springs. For example, electric means or air may be used as the biasing means.

The number of the biasing means constituting the mounting table position returning mechanism should not be limited to three. For example, the biasing force toward the same center may be applied to the holder mounting table by four or more biasing means.

Similarly, the mounting table angle returning mechanism should not be limited to the two biasing means. For example, the mounting table angle returning mechanism may comprises three or more biasing means.

In short, the mounting table position returning mechanism or the mounting table angle returning mechanism may be any means for applying force to return the position or angle of the holder mounting table to a predetermined position or angle if the position or angle of the holder mounting table is shifted from the predetermined position or angle. For example, the mounting table position returning mechanism or the mounting table angle returning mechanism may be based on a magnetic force.
(5) The mounting table fixing mechanism should not be limited to the combination of the air cylinder and the moving piece in the above described preferred embodiments. The means for moving the moving piece should not be limited to the air cylinder. For example, the means for moving the moving piece may be electric means, such as an electric motor.

As described above, the air cylinder may be fixed to any one of the holder mounting table and the base, or may be connected to a quite different another component of the heat treatment system.

The shape and material of the moving piece may be suitably changed.

The objects to be treated, which have been transferred to the holder on the holder mounting portion according to the third invention, are to be heat-treated by the heat treatment system while being held in the holder. At this time, since the objects to be treated are precisely held in the holder, the objects to be treated are precisely transferred to the holder, so that the objects to be treated can be more uniformly heat-treated.

Referring to the accompanying drawings, the fourth invention will be described below in detail.

Referring to the accompanying drawings, a preferred embodiment of the fourth invention will be described below.

Figure 30:
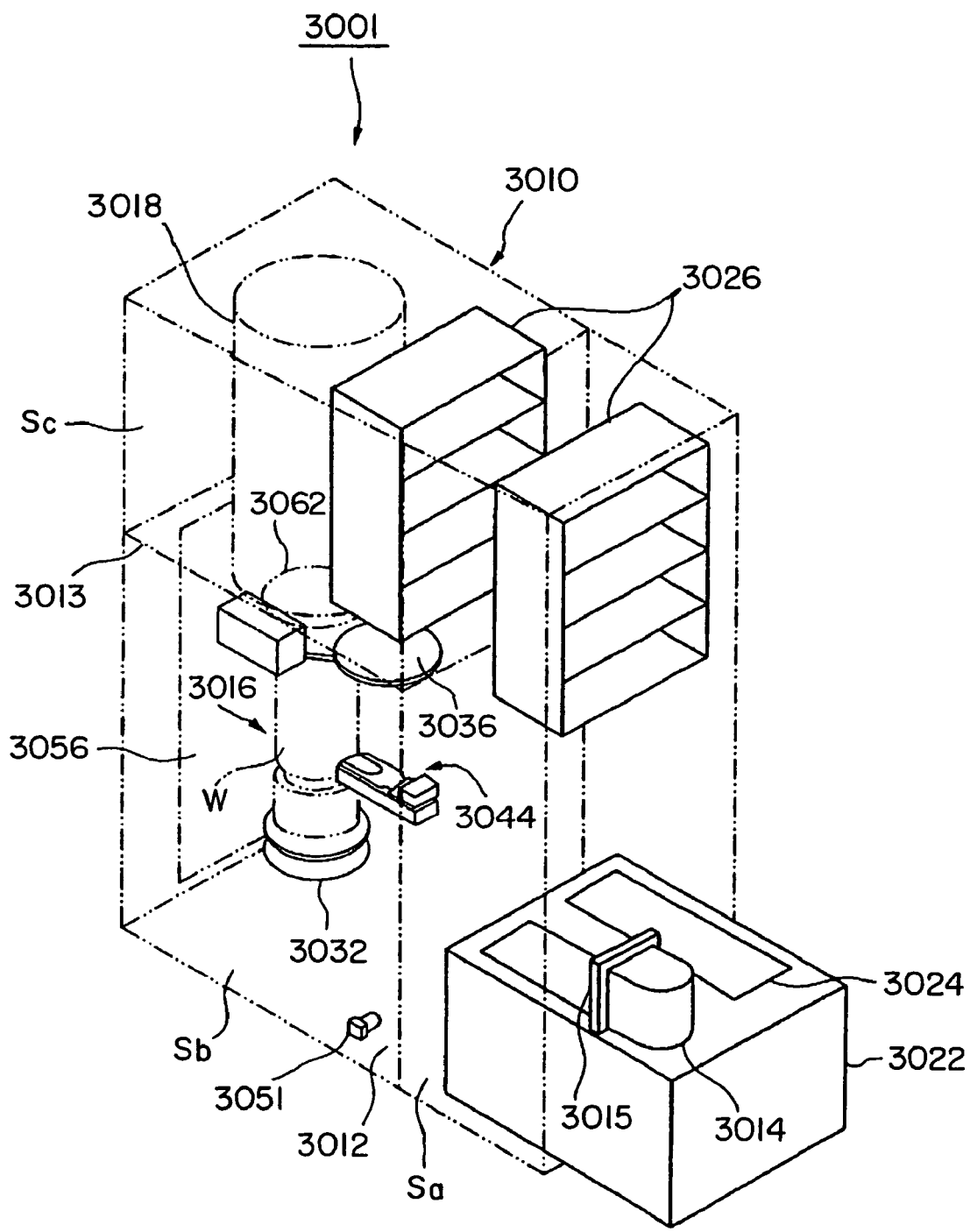
FIG. 30 is a perspective view showing the vertical heat treatment system of FIG. 29 viewed from a different angle.

FIG. 29 is a perspective view of a preferred embodiment of a vertical heat treatment system according to the fourth invention, and FIG. 30 is a perspective view of this vertical heat treatment system viewed from a different angle from that in FIG. 29.

As shown in these figures, the vertical heat treatment system 3001 is a system capable of carrying out various heat treatments, such as diffusion, oxidation or CVD, with respect to wafers W. The interior of a casing 2010 defining the contour of the vertical heat treatment system 3001 is separated by partition walls 3012 and 3013 into a carrier transfer area Sa, a loading area (loading chamber) Sb and a heat treatment area Sc.

In the loading area Sb, the transfer of wafers W from the interior of a carrier 3014 to a wafer boat 3016, and the carrying of the wafer boat 3016 in and out of a heat treatment furnace 3018 are carried out. Clean air is supplied to the carrier transfer area Sa via a filter (not shown), so that the carrier transfer area Sa is maintained in an atmosphere of atmospheric air. The loading area Sb is separated as an airtight region in which an atmosphere of nitrogen gas (an atmosphere of an inert gas or non-oxygen) is formed.

The carrier 3014 is a so-called closed type carrier, which houses therein a plurality of wafers W and which is closed by an FIMS (Front-opening Interface Mechanical Standard) door 3015. Specifically, the carrier 3014 is a portable plastic vessel capable of housing therein a plurality of, e.g., about 13 to 25, semiconductor wafers W having a predetermined diameter, e.g., a diameter of 300 mm, in a horizontal state on multiple stages at regular intervals in vertical directions. Moreover, the carrier 3014 is formed with an outlet for the wafers W in the front face portion thereof, and is detachably provided with the FIMS door 3015 for airtightly closing the outlet.

The front face portion of the casing 3010 is provided with a carrier carrying-in/out opening 3020 for carrying the carrier 3014 in and out by means of an operator or a transfer robot. The carrier carrying-in/out opening 3020 is provided with a load port 3022 for carrying the carrier 3014 in or out of the carrier transfer area Sa. By means of a transfer mechanism 3024 provided on the load port 3022, the carrier 3014 is moved on the load port 3022 to be transferred to the interior of the carrier transfer area Sa.

In the carrier transfer area Sa, shelf-like storage portions 3026 for storing a plurality of carriers 3014 are provided above the load port 3022 and above the side of the partition wall 3012. On the side of the partition wall 3012 in the carrier transfer area Sa, a carrier mounting portion (FIMS port) 3027 is provided for supporting thereon the carrier 3014 to transfer the wafers. In the carrier transfer area Sa, a carrier transfer mechanism 3028 is provided for transferring the carrier 3014 between the load port 3022, the storage portion 3026 and the carrier mounting portion 3027.

The carrier transfer mechanism 3028 comprises: a lifting mechanism 3028a which is provided on one side portion of the carrier transfer area Sa; a lifting arm 3028b which is vertically moved by the lifting mechanism 3028a; an arm 3028c which is provided on the lifting arm 3028b; and a transfer arm 3028d which is provided on the arm 3028c for supporting thereon the bottom of the carrier 3014 to transfer the carrier 3014. The partition wall 3012 is provided with a door 3030 which is formed so as to have a shape corresponding to the wafer outlet of the carrier 3014 and which is capable of being open and closed. By opening the door 3030 while the carrier 3014 contacts the door 3030, the wafers W in the carrier 3014 can be taken in and out of the loading area Sb.

In the heat treatment area Sc, there is provided the heat treatment furnace 3018 for housing therein the wafer boat 3016, which holds the wafers W, to carry out a predetermined heat treatment.

Above the inside of the loading area Sb, a lid 3032 is provided so as to be capable of being vertically moved by a boat elevator 3034 which is a lifting mechanism. The lid 3032 can support thereon the holder 3016 of, e.g., quartz, which holds a plurality of, e.g., about 100 to 150, wafers W on multiple stages at regular intervals in vertical directions. By vertically moving the lid 2032 by means of the lifting mechanism 3024, the wafer boat 3016 holding the wafers W can be carried in and out of the heat treatment chamber of the heat treatment furnace 3018. In the vicinity of the throat of the heat treatment furnace 3018, there is provided a shutter 3026 which is capable of being open and closed in horizontal directions for closing the throat when the lid 3032 is moved downwards and when the boat 3016 is carried out after the heat treatment.

In one side portion of the loading area Sb, a boat stage 3038 which is a boat mounting portion is provided for supporting thereon the wafer boat 3016 in order to the wafers W. Behind the boat stage 3038, a standby stage 3040 is provided for supporting thereon the wafer boat 3016 which holds the wafers W.

In the lower portion of the loading area Sb, a boat transfer mechanism 3042 is provided between the carrier mounting portion 3027 and the boat elevator 3034 for transferring the wafer boat 3016 between the boat stage 3038, the standby stage 3040 and the lid 3032.

The boat transfer mechanism 3042 comprises a first arm 3042a capable of being rotated in horizontal directions and moved in vertical directions, and a supporting arm 3042b which is supported on the tip portion of the first arm 3014a so as to be rotatable in horizontal directions and which is capable of supporting the boat 3016 in vertical directions, the supporting arm 3042b having a substantially C-shaped opening. Above the boat transfer mechanism 3042, a transfer mechanism 3044 is provided for transferring the wafers W between the carrier 3014 on the carrier transfer portion 3027 and the wafer boat 3016 on the boat stage 3038.

The transfer mechanism 3044 comprises a lifting mechanism 3044a, a first arm 3044b which is connected to the lifting mechanism 3044a and which is rotatable in horizontal directions, a second arm 3044c which is connected to the first arm 3044b and which is rotatable in horizontal directions, and a supporting arm 3044d which is provided on the second arm 3044c and which is retractable. The supporting arm 3044d comprises a plurality of, e.g., two to five, fork-shaped thin plates, and is movable while supporting thereon the wafers W.

The loading area Sb will be described below in detail.

The casing 3010 constituting the loading area Sb is provided with an air intake valve 3051, which is provided for introducing air, and an exhaust value 3052 which is connected to a nitrogen gas exhaust pipe (not shown), in order to replace the atmosphere of nitrogen gas at a positive pressure with an atmosphere of atmospheric air in the loading area Sb, which is separated as the airtight region by the partition walls 3012 and 3013 in the casing 3010, during the maintenance of the system or the like.

In this preferred embodiment, an atmosphere of nitrogen gas containing oxygen having a concentration of, e.g., 30 ppm or less, is formed by closing the valves 3051 and 3051 and introducing nitrogen gas. As shown in FIG. 31, this concentration of oxygen is sampled and detected by an oxygen analyzer (not shown) from an oxygen concentration sampling port 3054a.

The vertical heat treatment system 3001 in this preferred embodiment is provided with a safety mechanism utilizing an $O_2$ sensor 3054 which is provided in the loading area Sb, in order to prevent the operator from erroneously entering the loading area Sb in the state that the atmosphere of nitrogen gas is formed in the loading area Sb, i.e., in the state that the concentration of oxygen in the area Sb is low, during the maintenance of the system or the like.

Figure 32:
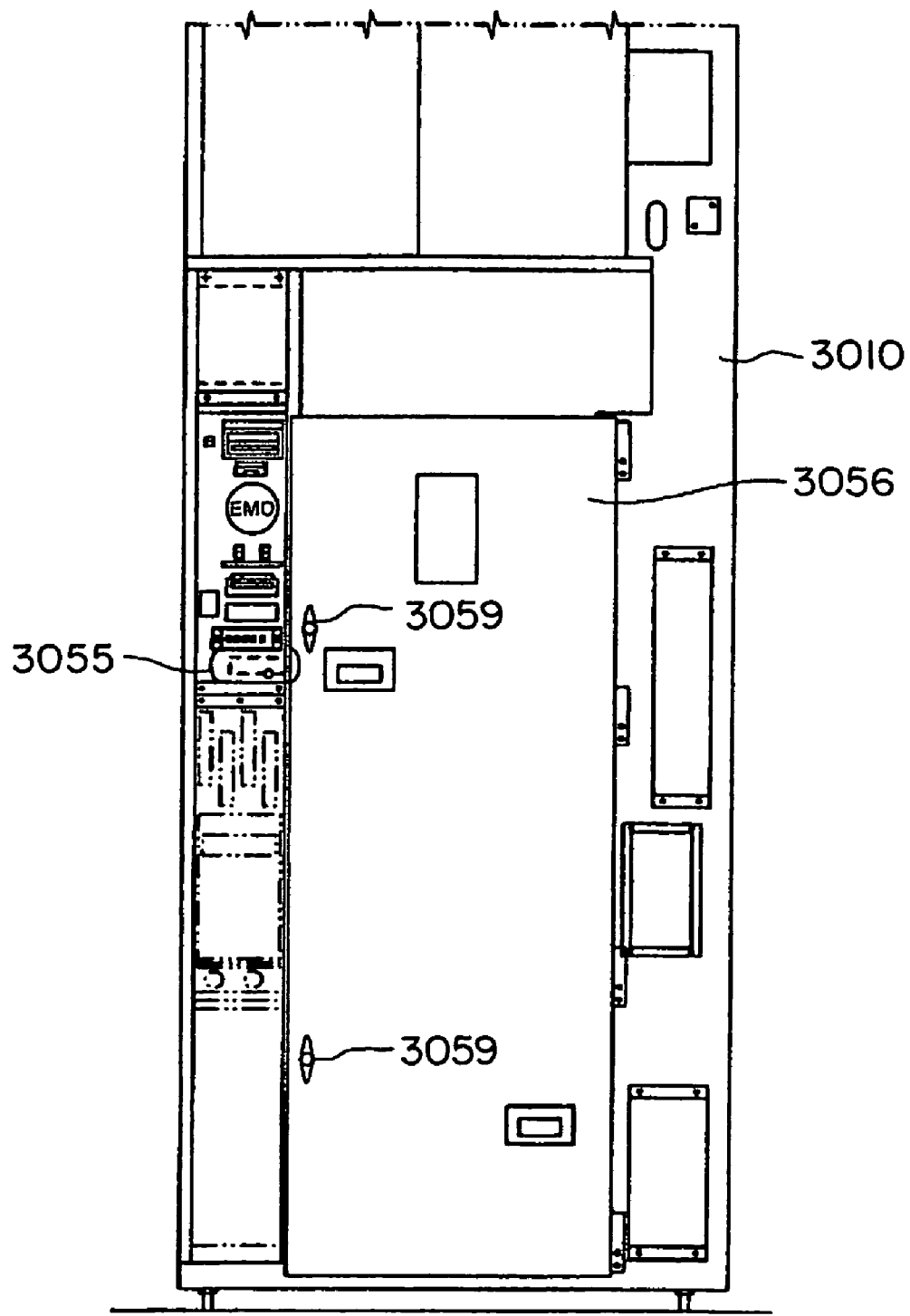
FIG. 32 is a view of the vertical heat treatment system of FIG. 29, viewed from the back face.
Figure 33:
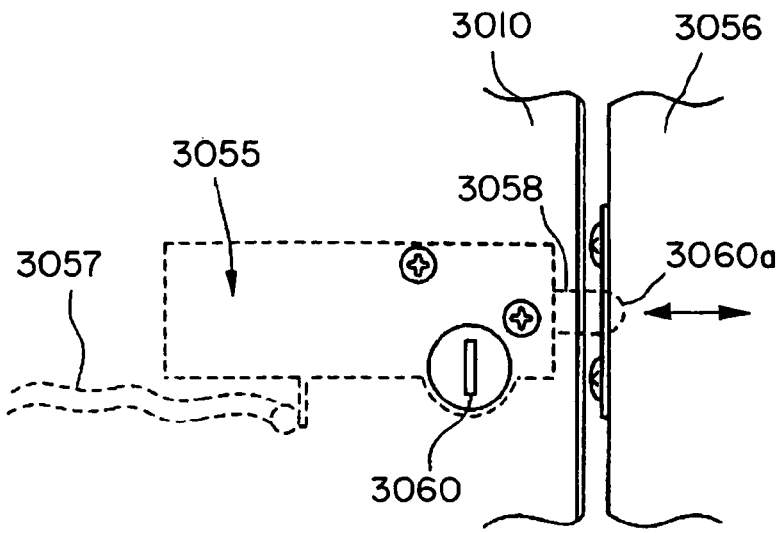
FIG. 33 is a view showing a safety mechanism of the vertical heat treatment system of FIG. 29.

That is, as shown in FIGS. 32 and 33, the safety mechanism 3055 is designed to control the opening and closing (locking/unlocking) of a maintenance door 3056 (see FIG. 30) which is provided on the back face of the heat treatment system 3001. The safety mechanism 3055 is incorporated into the casing 3010 of the system body, and is an electromagnetic locking mechanism to which a control signal based on the concentration of oxygen detected by the $O_2$ sensor 3054 is inputted via a signal line 3057. By this control signal, the protruding/non-protruding of a lock pin 3058, which is engageable with a recessed portion 3060a formed in the maintenance door 3056, is controlled.

For example, when it is detected by the $O_2$ sensor that the concentration of oxygen in the loading area Sb is 19.5% or less, the lock pin 3058 protrudes toward the maintenance door 3056 (engages the recessed portion 3060a), so that the locking state of the maintenance door 3056 is maintained. In this case, of course, even if a knob 3059 is rotated, the door 3056 is not open On the other hand, when it is detected by the $O_2$ sensor that the concentration of oxygen in the loading area Sb is 19.5% or more, the lock pin 3058 is retracted from the maintenance door 3056 to be in a non-protruding state (in which the lock pin 3058 does not engage the recessed portion 3060a), so that the maintenance door 3056 is in an unlocked state in which the maintenance door 3056 can be open.

The safety mechanism 3055 has a fail safe function, and is connected to a main control part (not shown) for generally controlling the of the system. That is, if the main control part detects that the system itself does not normally operate for some reason, the lock pin 3058 is maintained in the locking state even if it is detected that the concentration of oxygen in the area Sa is 19.5% or more.

The safety mechanism 3055 is also provided with a key portion 3060 for forcing to release the locking state on the assumption that an emergency situation may occur, regardless of the kind of the control signal based on the concentration of oxygen, which is inputted via the signal line 3057. Furthermore, of course, if a maintenance door is provided on the side face of the casing of the heat treatment system, such a safety mechanism may be applied to this door.

Figure 34:
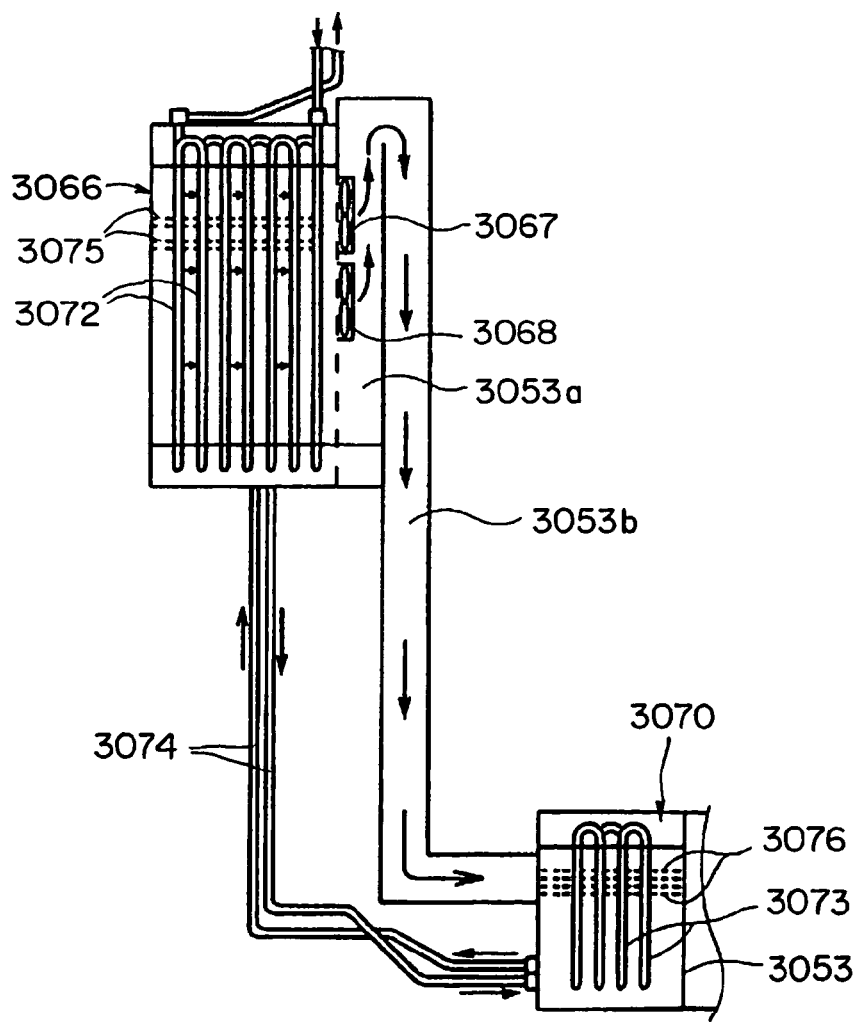
FIG. 34 is a sectional view of top and bottom radiators constituting the gas circulating cooling mechanism of FIG. 31, viewed from the side of a surface facing FFU.
Figure 35:
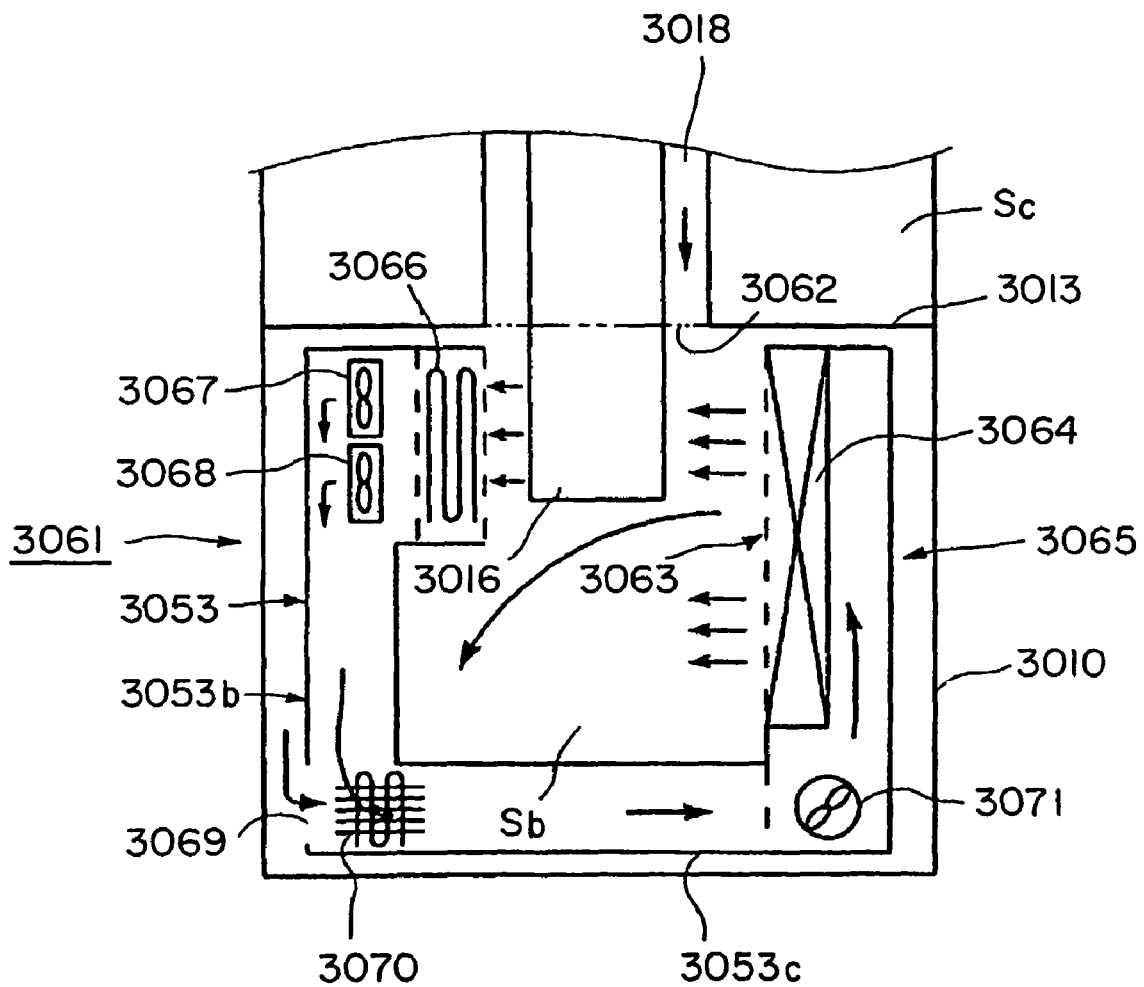
FIG. 35 is a view schematically showing the flow of nitrogen gas by the gas circulating cooling mechanism of FIG. 31.

Referring to FIGS. 31, 34 and 35, a gas circulating cooling mechanism provided in the loading area Sb of the vertical heat treatment system 3001 in this preferred embodiment will be described below. Furthermore, FIG. 31 is a perspective view showing the structure of the gas circulating cooling mechanism 3061 viewed from the back face side of the system 1. In addition, FIG. 34 is a sectional view showing a top radiator 3066 and a bottom radiator 3070, which constitute the gas circulating cooling mechanism 3061, viewed from the side of a surface facing an FFU (Filter Fan Unit) 3065, and FIG. 35 is a view schematically showing the flow of nitrogen gas by the gas circulating cooling mechanism 3061.

As shown in these figures, the gas circulating cooling mechanism 3061 is provided in the loading area Sb which has a closed structure ($N_2$ purge box structure) in which an airtight region is formed by an atmosphere of nitrogen gas. That is, the gas circulating cooling mechanism 3061 comprises: the FFU 3065 which has a ventilating port 3063 in the vicinity of a throat of the bottom of the heat treatment 3018 arranged above the loading area Sb and which has a filter 3064 for purifying and sending nitrogen gas to the vicinity of the throat 3062 from the side via the ventilating port 3063; the top radiator 3066 which is arranged so as to face the ventilating port 3063 in the vicinity of the throat 3062; intake fans 3067 and 3068 for sucking nitrogen gas in the vicinity of the throat 3062 via the top radiator 3066; a circulating duct 3053 which forms a nitrogen gas circulating path between the intake funs 3067, 3068 and the FFU 3065 so that nitrogen gas sucked by the intake funs 3067 and 3068 is returned to the FFU 3065 and which is partially arranged below the loading area Sb; an intake port 3069 which is formed in a region of the circulating duct 3053 arranged below the area Sb so that a part of nitrogen gas sent by the FFU 3065 is sucked below the loading area Sb; and the bottom radiator 3070 which is arranged in the circulating duct 3053 between the intake port 3069 and the filter 3064 so as to cool nitrogen gas drawn into the circulating duct 3053 from the intake funs 3057, 3068 and the intake port 3069 to join.

The filter 3064 of the FFU 3065 comprises a filter for particle, which filters and collects particulate impurities in nitrogen gas. Moreover, the FFU 3065 is provided with a blower fan 3071 upstream of the filter 3064 in the flow of nitrogen gas, i.e., below the loading area Sb, in order to substantially send nitrogen gas from the ventilating port 3063 via the filter 3064.

As shown in FIG. 34, the top radiator 3066 and the bottom radiator 3070 are made of stainless to inhibit impurities from adhering to the wafers W to cause a chemical reaction (chemical contamination) or the like. In the top radiator 3066, only a principal part of a pipe 3072 substantially having a cooling effect is exposed from the inner wall (side wall) of the casing 3010 in the loading area Sb so that water droplets do not adhere to the wafers W.

The pipe 3072 of the top radiator 3066 and a pipe 3073 provided in the bottom radiator 3070 are connected to each other by means of a connecting pipe 3074. A refrigerant for removing heat from temperature raised nitrogen gas passes through the pipes 3072, 3073 and the connecting pipe 3074. In order to increase the quantity of heat exchange, the refrigerant preferably flows in the top radiator 3066 and the bottom radiator 3070 in parallel. Moreover, on the surface of the pipes 3072 and 3073, a plurality of plate-shaped fins 3075 and 3076 are connected so as to be perpendicular to the axes of the pipes.

As shown in FIGS. 33 and 34, the circulating duct 3053 mainly comprises: a pipe portion 3053a for transferring nitrogen gas, which is introduced into the top radiator 3066 via its front face, from the side portion of the radiator 3066 to the top; a pipe portion 3053b for guiding nitrogen gas from the pipe portion 3053a toward the intake port 30, i.e., below the loading area Sb; and a pipe portion 3053c, arranged below the area Sb, for supplying nitrogen gas, which is transferred from the pipe portion 3053b, and nitrogen gas, which joins by the intake port 3069, to the FFU 3065.

That is, as shown in FIGS. 31 and 35, in the gas circulating cooling mechanism 3062 with this construction, nitrogen gas, which is sent in the direction of arrow A from the ventilating port 3063 of the FFU 3065, i.e., to the vicinity of the throat 3062, passes over the top radiator 3066 to be sucked in the direction of arrow C from the downstream of the top radiator 3066 by means of the intake fans 3067 and 3068. Moreover, this nitrogen gas passes through the pipe portions 3053a and 3053b to be transferred in order of arrows C, D, E and F.

On the other hand, a part of nitrogen gas, which is sent in the direction of arrow A by means of the FFU 3065, travels directly toward the lower portion of the loading area Sb to be transferred in directions of arrows B1 and C1 to be sucked via the intake port 3069. Moreover, nitrogen gas downstream of the intake port 3069, i.e., nitrogen gas joining in the pipe portion 3053c, flows in the direction of arrow G to pass through the bottom radiator 3070 to flow in the direction of arrow H to return to the FFU 3065.

As described above, the gas circulating cooling mechanism 3061 of the vertical heat treatment system 3011 in this preferred embodiment mainly comprises: the FFU 3065 for sending nitrogen gas to the vicinity of the throat 3062 through which the heat-treated wafers W are carried out; the top radiator 3066 for removing heat of temperature-raised nitrogen gas in the vicinity of the throat 3062; and the intake funs 3067 and 3068 for sucking nitrogen gas in the vicinity of the throat 3062 over the heat exchanger. Therefore, for example, when the wafers W heated to a high temperature in the heat treatment furnace 3018 are carried out, temperature-raised nitrogen gas in the vicinity of the throat 3062 can be positively drawn toward the top radiator 3062 by means of the intake funs 3067 and 3068 to remove the heat to cool the vicinity of the throat 3062 of the heat treatment furnace 3018. Therefore, heat emitted from the throat 3062 of the heat treatment furnace 3016 can be effectively removed, and the heated wafers W can be cooled. Thus, it is not feared that the temperature of the loading area Sb suddenly rises, so that it is possible to inhibit control parts, which are provided in the loading area Sb, e.g., which constitute a loading mechanism, from being damaged by heat.

In the gas circulating cooling mechanism 3061, the intake funs 3067 and 3068 are arranged downstream of the top radiator 3066 in the flow of nitrogen gas, so that nitrogen gas passing through the top radiator 3066 to be cooled is sucked by the intake funs 3067 and 3068. Thus, it is possible to inhibit the intake funs 3067 and 3068 from being damaged by heat. Moreover, in the gas circulating cooling mechanism 3062, the flow of nitrogen gas is regulated above the loading area Sb by the intake funs 3067, 3068 and the duct 3053, and the intake port 3069, which is another intake portion, is provided below the loading area Sb to similarly regulate the flow of nitrogen gas, so that it is possible to provide excellent cooling effects while inhibiting particles from flying in the area Sb.

While the present invention has been specifically described in terms of the preferred embodiments, the present invention should not be limited to the above described preferred embodiments, but the invention can be modified in various ways without departing from the gist of the invention. For example, a glass substrate or an LCD substrate, other than the wafer, may be used as the object to be treated.

As described above, the heat treatment system according to the fourth invention mainly comprises a ventilating unit for sending an inert gas to the vicinity of the throat, through which the heat-treated objects are carried out, a heat exchanger for removing heat of a temperature-raised cooling fluid after the heat treatment, and an intake fun for sucking the cooling fluid in the vicinity of the throat over the heat exchanger. Thus, for example, when the objects heated to a high temperature in the heat treatment furnace are carried out, the cooling fluid is blown onto the objects, and the temperature-raised cooling fluid in the vicinity of the throat is positively drawn toward the heat exchanger by the intake fun, so that the heat can be removed to cool the cooling fluid, the objects and the vicinity of the throat of the heat treatment furnace.

Therefore, according to the heat treatment system according to the fourth invention, it is possible to effectively remove heat emitted from the throat of the heat treatment furnace, and it is possible to cool the heated objects. Therefore, it is not feared that the temperature in a carrying-in/out region, in which the objects are carried in and out of the heat treatment furnace, suddenly rises, so that it is possible to inhibit control parts, which is provided in the carrying-in/out region, from being damaged by head, and it is possible to shorten the transfer time of the objects and improve throughput.

The invention claimed is:

1. A vertical heat treatment system comprising:
a lifting mechanism which is vertically moved for carrying a holder, in which an object to be treated is held, in and out of a heat treatment furnace;
a holder mounting portion for mounting thereon the holder to transfer the object; a holder transfer mechanism for transferring the holder between the lifting mechanism and the holder mounting portion;
a treating-object transfer mechanism for transferring the object to the holder which is supported on the holder transferring portion, the treating-object transfer mechanism having a motion space region which overlaps with a motion space region of the holder transfer mechanism; and
a housing having a side face portion proximate to said treating object transfer mechanism
wherein said treating-object transfer mechanism comprises
a swivel arm supported so as to be rotatable about a vertically extending shaft, and
a transfer head having a rotation center shaft provided for rotation about the tip portion of the swivel arm so as to be rotatable on a horizontal plane, and
further comprises driving means having a sheltering function, the driving means rotating the transfer head of the treating-object transfer mechanism on its central axis on the horizontal plane along the outer peripheral edge of the lifting mechanism, which is positioned at a lower position, to cause the transfer head to take shelter on a side face portion of a housing.

2. A vertical heat treatment system as set forth in claim 1, wherein the sheltering function of the driving means of the treating-object transfer mechanism causes the transfer head of the treating-object transfer mechanism to revolve around the vertically extending shaft of the swivel arm while causing the transfer head itself to rotate on its central axis in the opposite direction to the direction of rotation of the transfer head, to cause the transfer head to take shelter on the side face portion in the housing.

3. A vertical heat treatment system as set forth in claim 1, wherein the sheltering function of the driving means of the treating-object transfer mechanism operates the transfer head of the treating-object transfer mechanism from a state that the transfer head is positioned at a reference position in its motion space region.

4. A vertical heat treatment system as set forth in claim 1, wherein the driving means of the treating-object transfer mechanism comprises a stretching mechanism for rotating the swivel arm, and a belt transmission mechanism for transmitting the rotational motion of the swivel arm to the transfer head.

5. A vertical heat treatment system as set forth in claim 1, wherein the reference position in the motion space region is set by a pulley ratio in the belt transmission mechanism.

6. A method for controlling a vertical heat treatment system comprising: a lifting mechanism which is vertically moved for carrying a holder, in which an object to be treated is held, in and out of a heat treatment furnace; a holder mounting portion for mounting thereon the holder to transfer the object; a holder transfer mechanism for transferring the holder between the lifting mechanism and the holder mounting portion; and a treating-object transfer mechanism for transferring the object to the holder which is supported on the holder transferring portion, the treating-object transfer mechanism having a motion space region which overlaps with a motion space region of the holder transfer mechanism, the treating-object transfer mechanism comprising a swivel arm supported so as to be rotatable about a vertically extending shaft, and a transfer head having a rotation center shaft, the transfer head provided for rotation about the tip portion of the swivel arm so as to be rotatable on its central axis on a horizontal plane,
wherein the transfer head of the treating-object transfer mechanism rotates about its central axis and is moved on the horizontal plane along the outer peripheral edge of the lifting mechanism, which is positioned at a lower position, to take shelter on a side face portion of a housing, when the holder transfer mechanism is operated.

7. A method for controlling a vertical heat treatment system as set forth in claim 6, wherein the transfer head of the treating-object transfer mechanism is caused to revolve around the vertically extending shaft of the swivel arm while the transfer head itself is caused to rotate on its central axis in the opposite direction to the direction of rotation of the transfer head, to take shelter on the side face portion of the housing.

* * * * *